United States Patent [19]

Black et al.

[11] Patent Number: 5,352,994
[45] Date of Patent: Oct. 4, 1994

[54] GALLIUM ARSENIDE MONOLITHICALLY INTEGRATED NONLINEAR TRANSMISSION LINE IMPEDANCE TRANSFORMER

[75] Inventors: Alistair D. Black, Los Gatos; David M. Bloom, Portola Valley; Robert A. Marsland, Cupertino; Mohammad S. Shakouri, Santa Clara; Allen F. Podell, Palo Alto, all of Calif.

[73] Assignee: The Board of Trustees of the Leland Stanford Junior University, Stanford, Calif.

[21] Appl. No.: 695,038

[22] Filed: May 1, 1991

Related U.S. Application Data

[63] Continuation-in-part of Ser. No. 686,916, Apr. 16, 1991, which is a continuation-in-part of Ser. No. 558,356, Jul. 26, 1990, which is a continuation-in-part of Ser. No. 259,027, Oct. 17, 1988, which is a continuation-in-part of Ser. No. 106,554, Oct. 6, 1987, Pat. No. 5,014,018.

[51] Int. Cl.$^5$ .......................... H03H 7/38; H01P 5/00
[52] U.S. Cl. ....................................... 333/33; 333/164
[58] Field of Search ................... 333/20, 23, 32, 33, 333/164

[56] References Cited

U.S. PATENT DOCUMENTS

| | | |
|---|---|---|
| 3,909,751 | 9/1975 | Tang et al. . |
| 4,075,650 | 6/1978 | Calviello ............................ 357/15 |
| 4,097,890 | 6/1978 | Morris et al. ...................... 357/55 |
| 4,460,880 | 7/1984 | Turner ................................ 333/238 |
| 4,594,557 | 6/1986 | Shillady ............................. 333/23 X |
| 4,654,600 | 3/1987 | Lockwood ......................... 328/151 |
| 4,672,341 | 6/1987 | Axell .................................. 333/247 |
| 4,745,445 | 5/1988 | Mun et al. ......................... 357/15 |
| 4,837,532 | 6/1989 | Lang .................................. 333/164 |
| 4,855,696 | 8/1989 | Tan et al. .......................... 333/20 |
| 4,956,568 | 9/1990 | Su et al. . |
| 5,014,023 | 5/1991 | Mantele ............................. 333/164 |
| 5,023,574 | 6/1991 | Anklam et al. ................... 333/20 |

FOREIGN PATENT DOCUMENTS

| | | |
|---|---|---|
| 2837283 | 12/1979 | Fed. Rep. of Germany . |
| 2950644 | 6/1981 | Fed. Rep. of Germany . |
| 081414 | 6/1983 | France . |

OTHER PUBLICATIONS

"Delay Lines With Non-Linear Capacitances"; by E. Luder.
Mier Birk and Q. A. Kerns, Engineering note number EE-922, May 22, 1963, Lawrence Radiation Laboratory, University of California, Berkeley.
R. B. Riley; "An Analysis of a Nonlinear Transmission Line", Technical Report No. 1701-1, Jan. 20, 1961.
R. H. Freeman and A. E. Karobwiak, "An Investigation of Nonlinear Transmission Lines and Shock Waves" Journal of Physics, D: Applied Physics, vol. 10, 1977.
R. Hirota and K. Suzuki, "Theoretical and Experimental Studies of Lattice Solitons in Nonlinear Lumped (List continued on next page.)

Primary Examiner—Paul Gensler
Attorney, Agent, or Firm—Rosenblum Parish Isaacs

[57] ABSTRACT

A nonlinear impedance transformer comprising a plurality of scaled L-C sections. The first section has its inductance and capacitance values selected to establish a characteristic impedance approximately equal to the output impedance of the local oscillator. The last section has its inductance and capacitance values selected to establish an output impedance which substantially matches the input impedance of whatever device to which the nonlinear impedance transformer is coupled. The impedance of each section is scaled logarithmically between the values of the input and output impedances. An FET driver can be integrated on the same substrate as integrated versions of the nonlinear impedance transformer. In such a case, the input impedance of the first section is set to the output impedance of the FET, i.e., about 10 ohms.

32 Claims, 23 Drawing Sheets

OTHER PUBLICATIONS

Networks", IEEE Proc., vol. 61, No. 10, Oct., 1973, pp. 1483-1491.

A. C. Scott, F. Y. F. Chu, D. W. McLaughlin, "The Soliton, a New Concept in Applied Science", Proc. IEEE, 61 (10), 1443 (1973).

K. J. Weingarten, et al., "Picosecond Optical Sampling of GaAs Integrated Circuits", IEEE Journal of Quantum Electronics on Ultrafast Optics and Electronics, Feb., 1988.

Bastida, E. M. et al., "Periodic Slow-Wave Low-Loss Structures for Monolith GaAs Microwave Integrated Circuits" Electronic Letters, 13th Sep. 1979, vol. 15, No. 19, pp. 581-582.

Merkelo, et al. "Broadband Thin-Film Signal Sampler"; IEEE Journal of Solid State Circuits, vol. SC-7, No. 1, Feb. 1972, pp. 50-54.

D. Jager and F. J. Tegude, "Nonlinear Wave Propagation Along Periodic-Loaded Transmission Line", Applied Physics 15, pp. 393-397 (1978).

R. Landauer, "Parametric Amplification Along Nonlinear Transmission Lines", Journal of Applied Physics, vol. 31, No. 3, Mar. 1960, pp. 479-484.

R. Landauer, "Shock Waves in Nonlinear Transmission Lines and Their Effect on Parametric Amplification", IBM Journal 1960, pp. 391-401.

Ayasli, et al., "A Monolithic GaAs 1-13 GHz Travelling-Wave Amplifier" IEEE Transactions on Microwave Theory & Techniques, vol. MTT-30, No. 7, Jul. 1982, pp. 976-981.

D. Jager, "Experiments on KdV Solitons", Journal of the Physical Society of Japan, vol. 51, No. 5, May 1982, pp. 1686-1693.

D. Jager, W. Rabus, W. Eickhoff, "Bias-Dependent Small-Signal Parameters of Schottky Contact Microstrip Lines", Solid-State Electronics, vol. 17, 1974, pp. 777-783.

D. Jager, "Soliton Propagation Along Periodic-Loaded Transmission Line", Appl. Phys., vol. 16, 1978, pp. 35-38.

D. Jager, J. P. Becker, "Distributed Variable-Capacitance Microstrip Lines for Microwave Applications", Appl. Phys., vol. 12, 1977, pp. 203-107.

G. W. Hughes, R. M. White, "Microwave Properties of Nonlinear MIS and Schottky-Barrier Microstrip", IEEE Transactions on Electron Devices, vol. ED-22, No. 10, Oct. 1975, pp. 945-956.

D. Jager, et al., "Bias-Dependent Phase Delay of Schottky Contact Microstrip Line" Electronics Letters, 17th May 1973, vol. 9, No. 10, pp. 201-203.

Y. Fukuoka, Y. -C. Shih, T. Itoh, "Analysis of Slow-Wave Coplanar Waveguide for Monolithic Integrated Circuits" IEEE Transactions on Microwave Theory and Techniques, vol. MTT-31, No. 7, Jul. 1983, pp. 567-573.

J. M. Jaffe, "A High-Frequency Variable Delay Line", IEEE Transactions on Electron Devices, Dec. 1972, pp. 1292-1294.

D. Jager, "Slow-Wave Propagation Along Variable Schottky-Contact Microstrip Line", IEEE Transactions on Microwave Theory and Techiques, vol. MTT-24, No. 9, Sep. 1976, pp. 566-573.

Y. Fukuoka, T. Itoh, "Design Consideration of Uniform and Periodic Coplanar Schottky Variable Phase Shifter", pp. 278-282.

Y. Fukuoka, T. Itoh, "Slow-Wave Coplanar Waveguide on Periodically Doped Semiconductor Substrate", IEEE Transactions on Microwave Theory and Techniques, vol. MTT-31, No. 12, Dec. 1983, pp. 1013-1017.

J. Perini, "Periodically Loaded Transmission Lines", IEEE Transactions on Microwave Theory and Techniques, vol. MTT-28, No. 9, Sep. 1980, pp. 1029-1031.

R. A. Pucel, "Design Considerations for Monolithic Microwave Circuits", IEEE Transactions on Microwave Theory and Techniques, vol. MTT-29, No. 6, Jun. 1981, pp. 513-514.

M. B. Ketchen et al., "Generation of Subpicosecond Electrical Pulses on Coplanar Transmission Lines", Appl. Phys. Lett., vol. 48, No. 12, Mar. 24, 1986, pp. 751-753.

R. L. Wigington, N. S. Nahman, "Transient Analysis of Coaxial Cables Considering Skin Effect", Proceedings of the IRE, Feb., 1957, pp. 166-174.

G. Hasnain, A. Dienes, J. R. Whinnery, "Dispersion of Picosecond Pulses in Coplanar Transmission LInes", IEEE Transactions on Microwave Theory and Techniques, vol. MTT-34, No. 6, Jun. 1986, pp. 738-741.

Sadler, et al., "A Buried p-Layer Self-Aligned Process for High-Yield LSI Circuits".

Archer, J. W. & Faber, M. T., "High Output, Single- and Dual-Diode, Millimeter Wave Frequency Dou- (List continued on next page.)

OTHER PUBLICATIONS bler", IEEE Transactions, 1985, MTT-33, pp. 533-538.

Strid, et al., "A DC-12 GHz Monolithic GaAs FET Distributed Amplifier, IEEE Transactions on Microwave Theory and Techniques, vol. MTT-30, No. 7, Jul. 1982, pp. 969-975.

D. Jager, "Characteristics of Travelling Waves Along the Nonlinear Transmission Lines for Monolithic Integrated Circuits: A Review:, Int. J. Electronics, 1985, vol. 58, No. 4, pp. 649-669.

Geissberg, et al., "A New Refractory Self-Aligned Gate Technology for GaAs Microwave Power FET's and MMIC's.

Bahl, et al., "GaAs IC's Fabricated with the High-Performance, High-Yield Multifunction Self-Aligned Gate Process for Radar and EW Applications.

Bahl, et al., "Multifunction SAG Process for High--Yield Low-Cost GaAs Microwave Integrated Circuits".

Gunther, Uwe, et al., "Variable Capacitance MIS Microstrip Lines" A.E.U. Band 27 [1973], Heft 3, Report from the Institut fur Hochfrequenztechnik der Technischen Universitat Braunschweig.

Hasegawa, H., et al., "MIS and Schottky Slow-Wave Coplanar Striplines on GaAs Substrates" Electronics Letters, 27th Oct. 1977, vol. 13, No. 22, pp. 663-664.

R. V. Khokhlov, "On The Theory Of Shock Radio Waves In Nonlinear Lines", Radiotekhnika I Elektronika 6, No. 6, 917-925, 1961.

C. J. Madden, et al., "Generation of 3.5-ps Fall-Time Shock Waves on a Monolithic GaAs Nonlinear Transmission Line", IEEE Electron Device Letters, vol. 9, No. 6, Jun. 1988, pp. 303-305.

C. J. Madden, et al., "Hyperabrupt-doped GaAs Nonlinear Transmission Line for Picosecond Shock-Wave Generation", Appl. Phys. Lett. 54(11), 13 Mar. 1989, pp. 1019-1021.

Majidi-Ahy, R. & Bloom, D. "Millimetre-Wave Active Probe Frequency-Multiplier for On-Wafer Characterisation of GaAs Devices and ICs", Electronics Letters, 5th Jan. 1989, vol. 25, No. 1, pp. 6-8.

R. A. Marsland, et al., "Picosecond Electronics and Optoelectronics" Summaries of papers presented at the Picosecond Electronics and Optoelectronics Topical Meeting, Mar. 8-10, 1989, Salt Lake City, Utah.

R. A. Marsland, et al., Summary of "100 GHz GaAs MMIC Sampling Head", Continental Ballroom 12/14 at 1:30 p.m.

J. Merkelo, "A dc-to-20 GHz Thin-Film Signal Sampler for Microwave Instrumentation"; also "Waveform Sampling with Schottky Diodes", Hewlett Packard Applications Bulletin 16.

S. Moore, et al., "Microwave Sampling Effective for Ultrabroadband Frequency Conversion", MSN&CT, Feb. 1986, pp. 113-126.

R. S. Pengelly, "Microwave Field-Effect Transistors-Theory, Design, and Applications", Research Studies Press, p. 420.

W. Rabus, "Uber Die Frequenzvervielfachung Langs Schottky-Kontakt-Leitungen", AEU, Bank 28, Heft 1, Jan. 1974, pp. 1-11.

M. J. Rodwell, et al., "Nonlinear Transmission Line for Picosecond Pulse Compression and Broadband Phase Modulation", Electronic Letters, Jan. 29, 1987, vol. 23, No. 3, pp. 109-110.

S. Seki, et al., "Cross-Tie Slow-Wave Coplanar Waveguide On Semi-insulating GaAs Substrates", Electronics Letters, vol. 17, No. 25, Dec. 10, 1981, pp. 940-941.

Y. Shih, et al., "Analysis of Printed Transmission Lines for Monolithic Integrated Circuits", Electronics Letters, vol. 18, No. 14, Jul. 8, 1982, p. 585-586.

D. Howard, et al., "The Wideband Sampling Gate an Analysis, Characterization and Application Discussion,", pp. 1-11.

G. E. Brehm, et al., "High Capacitance Ratio Monolithic Varactor Diode", Proc. Eighth Biennial Cornell Elec. Eng. Conf. 811-13/81, pp. 53-63.

S. Gibson, "Gallium Arsenide Lowers Cost and Improves Performance of Microwave Counters", Hewlett-Packard Journal, Feb. 1986, pp. 4-6.

W. M. Grove, "A DC-to-12.4-GHz Feedthrough Sampler for Oscilloscopes and Other RF Systems", pp. 12-15.

M. J. Rodwell, "Gate Propagation Delay and Logic Timing of GaAs Integrate Circuits Measured by Electro-Optic Sampling" Standford University.

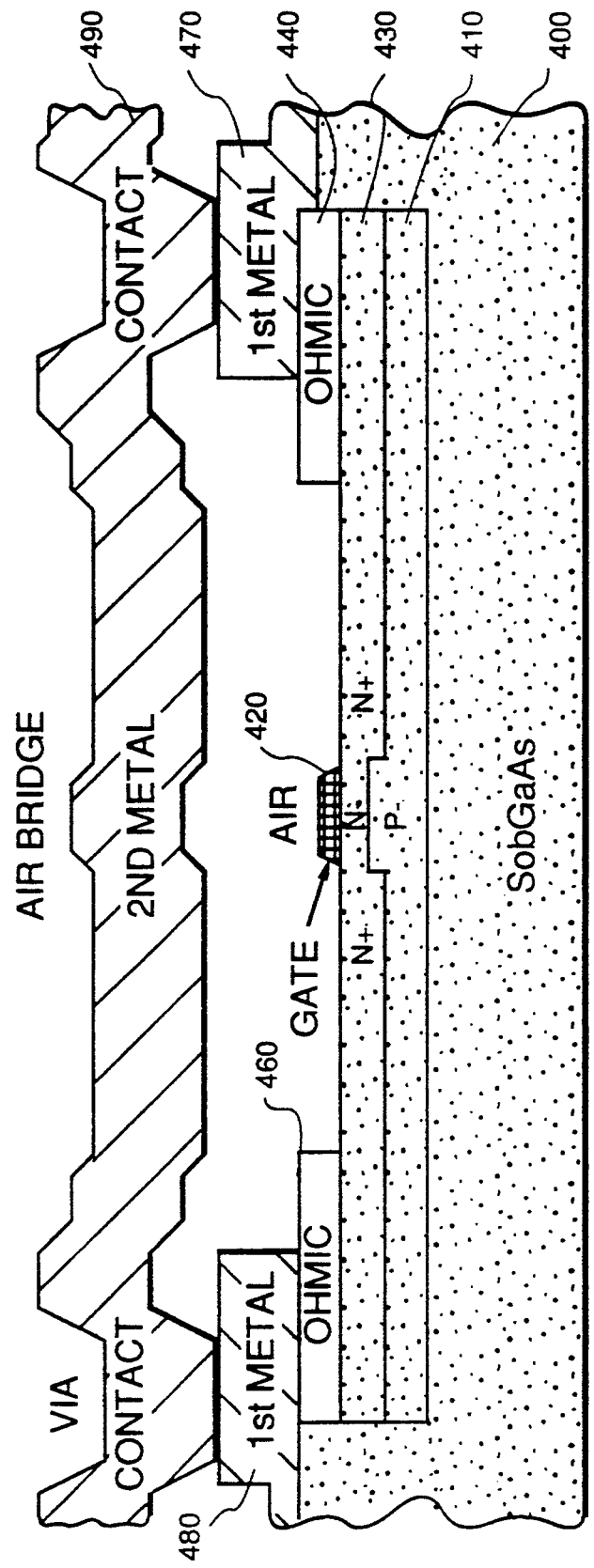
Fig. 32
Fig. 31

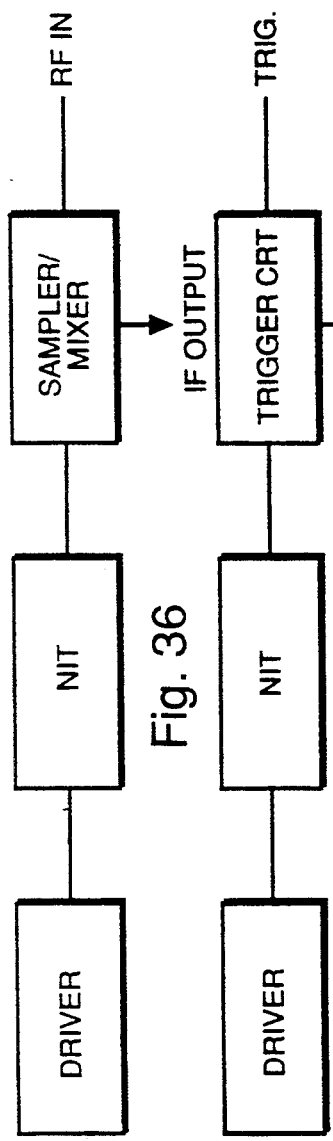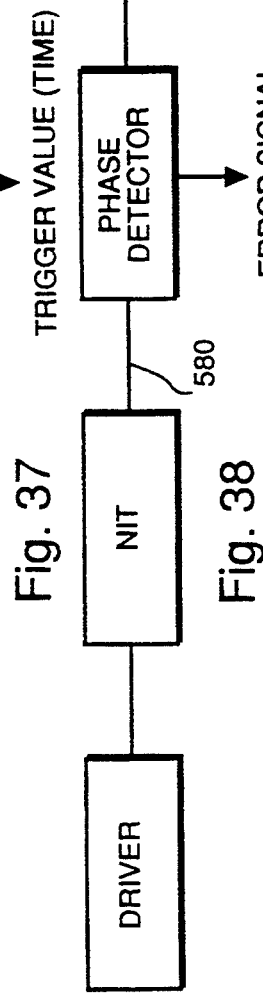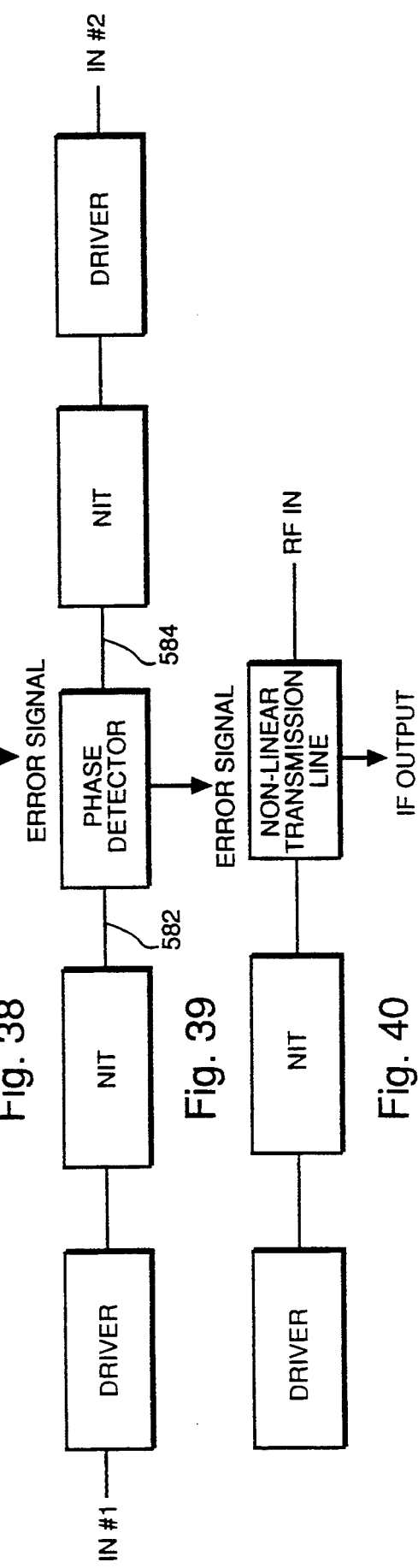
Fig. 36
Fig. 37
Fig. 38
Fig. 39
Fig. 40

GALLIUM ARSENIDE MONOLITHICALLY INTEGRATED NONLINEAR TRANSMISSION LINE IMPEDANCE TRANSFORMER

This work was funded by the United States Government's Office of Naval Research under Contract No. N99914-85-K-0381. The United States Government has a paid up license to practice this technology.

This is a continuation-in-part of a U.S. patent application entitled, "GALLIUM ARSENIDE MONOLITHICALLY INTEGRATED SAMPLING TIME SAMPLE HEAD USING EQUIVALENT TIME SAMPLING HAVING A BANDWIDTH GREATER THAN 100 GHZ", filed Apr. 16, 1991, Ser. No. 07/686,916 by Marsland, Bloom and Rodwell (attorney docket M-1040-4P) which was a continuation-in-part of a U.S. patent application entitled, "INTEGRATED COPLANAR STRIP NONLINEAR TRANSMISSION LINE SAMPLING HEAD USING EQUIVALENT TIME SAMPLING HAVING A BANDWIDTH GREATER THAN 100 GHZ", by Marsland, Rodwell and Bloom, filed Jul. 26, 1990, Ser. No. 07/558,356, which was a continuation-in-part of a U.S. patent application entitled, "GALLIUM ARSENIDE MONOLITHICALLY INTEGRATED SAMPLING HEAD USING EQUIVALENT TIME SAMPLING HAVING A BANDWIDTH GREATER THAN 100 GHZ", filed Oct. 17, 1988, Ser. No. 07/259,027, by Marsland, Bloom and Rodwell, which was a continuation-in-part of a U.S. patent application entitled, "NONLINEAR TRANSMISSION LINE FOR GENERATION OF PICOSECOND ELECTRICAL TRANSIENTS", Ser. No. 106,554, filed Oct. 6, 1987 by Bloom and Rodwell, (now U.S. Pat. No. 5,014,018) all of which are currently copending and which are incorporated herein by reference.

BACKGROUND OF THE INVENTION

The invention pertains to the field of nonlinear impedance transformers NIT which can be used to accept, with good impedance match, driving pulses from gallium arsenide FET's at any frequency from near D.C. to over 3 GHz and generate compressed fall time output pulses at any selected output impedance (preferably a value matched to the load circuit being driven by the NIT). These output pulses can be used to drive samplers for sampling very high frequency RF signals. The output pulses can also be used to drive trigger circuits or another nonlinear transmission line if further fall time compression is desired.

A difficulty with the integrated nonlinear transmission line defined in the parent cases for which the present invention is an improvement is that there were minimum driving frequency and minimum driving amplitude requirements which were difficult to meet. Basically, the minimum driving frequency for pulses from the local oscillator was 3 GHz. Further, a large amplitude was needed such that the slew rate of the local oscillator input signal was sufficient to be within an input window of slew rates or fall times which could be further compressed by the nonlinear transmission line. Such driving signals generally required travelling wave amplifiers or step recovery diodes to generate. Neither was convenient.

Further, there was generally an impedance mismatch between the output impedance of the local oscillator and the input impedance of the nonlinear transmission line. This is because the nonlinear transmission line was designed to have a characteristic impedance of preferably around 50 ohms to maximize the efficiency of injection of power into the sampling head. This characteristic impedance for the nonlinear transmission line generally did not well match the output impedance of the local oscillator. The result was inefficiency of power injection into the nonlinear transmission line. The output impedance of a more convenient FET type local oscillator driver is generally around 10 ohms.

Therefore, a need has arisen for a nonlinear transmission line type impedance transformer that can compress local oscillator pulse fall times as well as have an input impedance which matches the output impedance of an FET local oscillator and which has an output impedance which matches the input impedance of the sampler to maximize efficiency of power transfer and minimize reflections and ringing problems.

Also a need has arisen for a more compact integrated nonlinear transmission line structure. This structure must have a characteristic impedance which is high enough to yield an overall characteristic impedance of approximately 50 ohms output impedance when periodically loaded by a plurality of Schottky barrier varactor diodes.

SUMMARY OF THE INVENTION

According to the teachings of the invention, there is taught a synthetic nonlinear transmission line/impedance transformer which is comprised of a plurality of series connected scaled L-C sections. Each L-C section is comprised of a series inductance and a shunt voltage dependent variable capacitor. The shunt capacitor of each section usually takes the form of a reverse biased hyperabrupt Schottky varactor diode, but could take many other forms such as a diode connected field effect transistor, a nonhyperabrupt Schottky varactor diode, reverse biased Schottky diodes or any other structure which makes the group velocity voltage dependent.

In the preferred embodiment, the nonlinear impedance transformer is a fully integrated, planar, monolithic structure formed on a gallium arsenide substrate. The scaling factors are logarithmic for both the characteristic impedance per section and the delay factor per section. That is, the characteristic impedance of each section is:

$$Z_{sec} = \sqrt{\frac{L}{C}} \qquad (1)$$

Likewise, the delay per section is:

$$\text{Delay}_{sec} = \sqrt{L * C} \qquad (2)$$

The characteristic impedance per section is chosen so that the synthetic transmission line impedance is scaled from a low impedance at the input end to a higher impedance at the output end. Typically, the impedance of the first section is selected to be equal to the output impedance of the local oscillator while the impedance of the last section is selected to be equal to the input impedance of the device to which the nonlinear impedance transformer is connected (if any). Typically, the nonlinear impedance transformer will have its output coupled to a sample head, a conventional trigger circuit or another nonlinear transmission line, but this list does not exhaust all the possible applications.

The relationship for the logarithmic scaling is given by Equation (3) below:

$$\sqrt{\frac{L_i}{C_{Di}}} = Z_{input} * \left[\sqrt[n]{\frac{Z_{output}}{Z_{input}}}\right]^{i-1} \quad (3)$$

where
- $L_i$ = the inductance of the ith section, and,
- $C_{Di}$ = the depletion zone voltage dependent transition capacitance of the diode in the ith section and,
- $Z_{input}$ = the input impedance of the first L-C section and,
- $Z_{output}$ = the output impedance of the last section, and wherein the synthetic transmission line is comprised of n sections and the $i^{th}$ power is a power equal to the number of the section having inductance $L_i$.

Each L-C section in the synthetic transmission line has a delay factor determined by the inductance and large signal capacitance of the section. The delay factors of the sections are scaled according to Equation (4) below:

$$\sqrt{L_i * C_i} = \frac{\sqrt{L_{i-1} * C_{i-1}}}{CF_i} \quad (4)$$

where $CF_i$ is determined empirically to achieve maximum compression per section, and where
- $L_i$ = the inductance of the ith section inductor, and
- $C_i$ = the large signal transition capacitance of the ith section, and
- $L_{i-1}$ = the inductance of the section previous to the ith section, and
- $C_{i-1}$ = the large signal transition capacitance of the section previous to the ith section. All voltage dependent transition capacitances for diodes, varactors and diode connected FET's are given by the Equation:

$$C_{ls} = \frac{[Q(V_h) - Q(V_l)]}{(V_h - V_l)} \quad (A)$$

where in the preferred embodiment, $C_{ls} >> C_1$.

In the preferred embodiment, the local oscillator that supplies sampling pulses to be compressed is an FET driver which is integrated on the same substrate as the nonlinear impedance transformer. In such an embodiment, the impedance of the first section is selected to be equal to the output impedance of the FET driver, typically about 10 ohms. Typically, the output impedance, i.e., the impedance of the last section, is set equal to about 50 ohms, an industry standard, although any other impedance may also be selected. The impedances of the intermediate sections is selected to bridge the gap between the impedances of the input and output sections in logarithmic fashion.

The delay factor per section given by Equation (2) above is also scaled in a logarithmic fashion to provide optimum compression for a given driver, load and diode type.

The particular configurations selected for the inductors and capacitors of each transmission line L-C section are not critical to the invention so long as the aforementioned scaling of the characteristic impedance and delay factors of each section is achieved. The synthetic nonlinear transmission line can be built in discrete or hybrid form as well as in integrated form. The integrated form is preferred for ultra high frequency applications because of the smaller sizes and the tighter control over device alignment and geometry which can be achieved. The process for fabricating an integrated version of the integrated nonlinear impedance transformer with FET's fabricated on the same substrate is known and is described below. This process is modified by the addition of a deep N implant at each diode connected FET to decrease the series resistance of the diodes. The MMIC processes used by Stanford University to fabricate the nonlinear transmission line and sample head of the parent cases can also be used to fabricate the nonlinear impedance transformer and are given in the other appendices.

The nonlinearity of the voltage dependent depletion capacitances which periodically load the transmission line causes the group velocity of signal propagation to be voltage dependent. In an application where the nonlinear impedance transformer is coupled to a sample head, the sample pulses from the local oscillator propagate along the nonlinear transmission line toward the locations of a pair of gallium arsenide, integrated sample diodes in the sample head. As the sample pulses propagate down the nonlinear transmission line, the fall time of the sample pulses is substantially shortened. The fall time is less than 5 picoseconds for the sample pulses emerging from the nonlinear impedance transformer compared to 150 picoseconds for the input pulses.

In the preferred monolithic embodiment, an abrupt doping profile is used for the Schottky varactor diodes. Current diodes are implant doped. The doping profile is determined by implant limitation. The resulting diodes when optimized for high frequency response look more like an abrupt Schottky barrier diode rather than a hyperabrupt although hyperabrupt might be preferred if a process existed which could make such diodes on the same substrate as high quality FET's.

In some integrated versions of the nonlinear impedance transformer, the cathodes of the diodes are ohmic contacts formed in holes etched through a lightly doped epitaxial layer to make direct contact with a heavily doped implant region. The anode contact is Schottky metal in direct contact with the lightly doped epitaxial semiconductor layer. The spacing between the anode and diode contacts is kept to the minimum spacing allowed by the design rules to minimize series resistance. All the diode anodes are coupled to one conductor of coplanar waveguide or coplanar strip transmission line although other configurations of integrated millimeter wave transmission line may also be used in some embodiments. All the cathode contacts of the diodes are coupled to another conductor of the transmission line such as the ground plane conductor.

The nonlinear transmission line described in the parent cases suffers from four basic problems. First, it is too big and lossy, and, second, it is difficult to use because input conditions for slew are too difficult to meet. Thirdly, the nonlinear transmission line of previous designs typically suffers from poor power transfer efficiency in transfer of energy from the source to the load. Finally, the previous nonlinear transmission lines were difficult to design into circuits since trial and error methods were necessary.

The nonlinear impedance transformer solves all of these problems. Specifically, the NIT solves the power transfer efficiency problem by scaling the impedances of each L-C section in a fashion such that the input impedance of the NIT matches the output impedance of the source and the output impedance matches the input impedance of the load. Further, the delay factors of the L-C sections may also be scaled so as to minimize the number of sections required to obtain a selected value of compression thereby minimizing size and loss. As a consequence of the improved efficiency and size, much slower input transition times may be used resulting in simple interfacing to integrated FET driver amplifiers which was previously not possible. As a final improvement, design equations have been produced for the NIT which allow easy design into many systems.

BRIEF DESCRIPTION OF THE DRAWINGS

FIG. 31 is a cross-sectional view of the structure of a diode connected field effect transistor as used in the preferred embodiment of the nonlinear impedance transformer.

FIG. 32 is a schematic diagram of the electrical connections of the diode connected FET.

FIG. 36 is a block diagram of the application of a nonlinear impedance transformer (NIT) to a sampler/mixer.

FIG. 37 is a-block diagram of the application of a NIT to a trigger circuit.

FIG. 38 is a block diagram of the application of a NIT to a phase detector.

FIG. 39 is a block diagram of the application of a NIT to a colliding pulse phase detector.

FIG. 40 is a block diagram of the application of a NIT to another nonlinear transmission line.

BACKGROUND DESCRIPTION OF PREVIOUS WORK UNDER THIS PATENT

Figure 1:
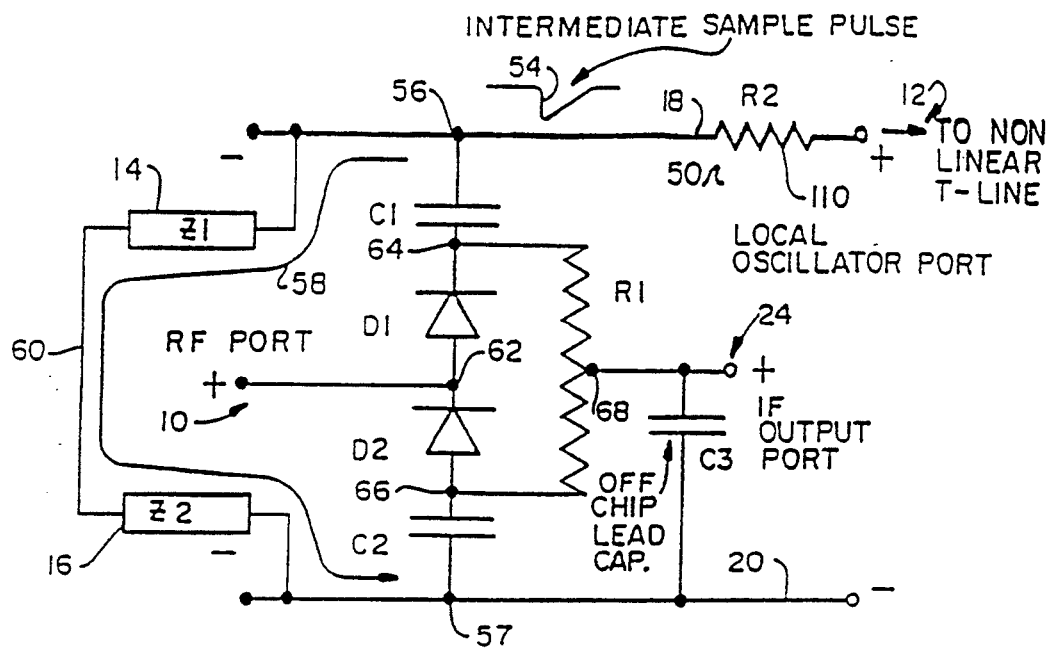
FIG. 1 is a schematic diagram of a sample head using a coplanar waveguide transmission line for compression of the sample pulses according to the teachings of the parent cases.

Referring to FIG. 1, there is shown a schematic diagram of the signal sampler which is implemented in integrated form according to the teachings of the parent cases. The circuit of FIG. 1 receives a high frequency RF signal to be sampled at an RF port 10. A local oscillator port 12 receives local oscillator sample pulses, usually sawtooth in shape, at a frequency such that the $n_{th}$ harmonic of the local oscillator frequency is offset from the fundamental frequency of the periodic RF signal to be sampled by a frequency Delta. The local oscillator pulses are differentiated by a shunt inductance symbolized by the impedances Z1 and Z2, 14 and 16, respectively in FIG. 1. These shunt inductances are implemented by a short-circuited section of a slot line portion of the coplanar waveguide serving to guide the RF signal to be sampled and will be described in more detail below. Element 60 represents a short circuit termination of the slot line which is embodied by the air bridge 86 in FIG. 5 and air bridges 88 in FIG. 7. The slot line guides the sample pulses to the location of an air bridge short circuit termination where they are reflected back toward nodes 56 and 57. The resultant voltage between nodes 56 and 57 is the derivative of the sample pulse. The sample pulse propagates along the slot line in the even mode whereas the RF propagates along the coplanar waveguide in the odd mode thereby minimizing coupling between the two signals.

The sample pulses appearing across nodes 56 and 57 turn on diodes D1 and D2 each time a sample pulse occurs. Because the RF signal is offset from the $n_{th}$ harmonic of the local oscillator frequency by the frequency Delta, the sample pulses will sample the RF wave form once every n cycles. There results an output signal at an intermediate frequency at an intermediate frequency (IF) output port 24. This sampling process is illustrated in FIG. 2.

Figure 2:
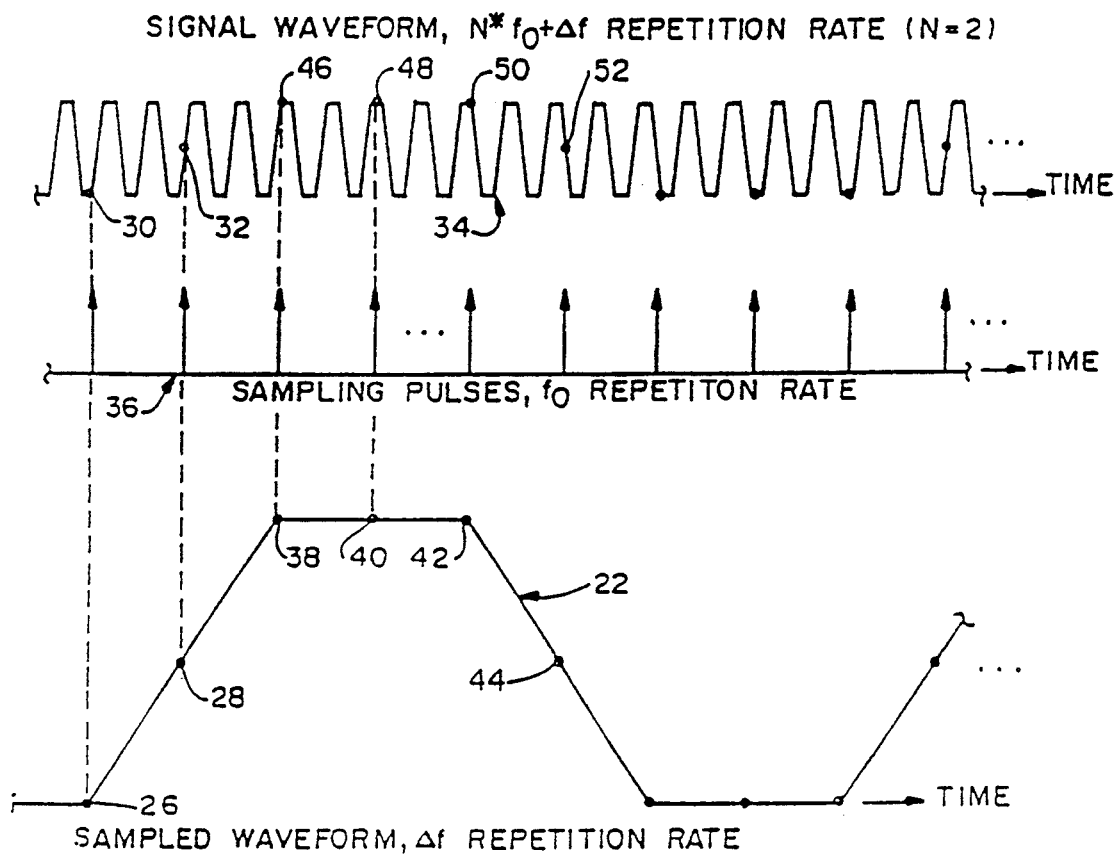
FIG. 2 is a diagram illustrating equivalent time sampling.

In FIG. 2, the wave form 22 represents the output signal at the intermediate output port 24 in FIG. 1. The points marked 26, 28, 38, 40, 42 and 44 are typical sample points, and correspond, respectively, to the points 30, 32, 46, 48, 50 and 52 on the RF wave form 34. The wave form 34 is the signal to be sampled and must be periodic.

The impulses shown at 36 represent the differentiated sample pulses, and are termed Delta functions. The sample pulses occur at a repetition rate of $f_0$ which is the local oscillator (LO) frequency. Delta functions are the most desirable form of sample pulse to use because the harmonic amplitude of a Delta function pulse is level throughout the harmonic spectrum. This allows a broader range of RF frequencies to be sampled without voltage conversion loss. The integrated nonlinear transmission line allows the rise time of the incoming sample pulses to be substantially shortened. When this fast edge is differentiated, a sampling pulse results which has a pulse width which is substantially equal to the rise time of the fast edge. Since this pulse width can be anywhere from 7.8 picoseconds to 1.5 picoseconds, an approximation of a true Delta function having a pulse width substantially near 0 can be achieved with the integrated, monolithic structure according to the teachings of the parent cases.

Inspection of FIG. 2 shows how the occurrence of the sampling pulses corresponds to the sample points on the RF wave form 34 and the corresponding points on the wave form shown at 22. The sampled output wave form occurs at a frequency of Delta. Note also that the voltage at the sample point 26 corresponds to the voltage of the RF wave form at sample point 30 while the voltage at the sample point 28 corresponds to the voltage of the RF sample waveform 34 at point 32. Likewise, the sample voltage at points 38, 40, 42, and 44 correspond, respectively, to the voltage at the points 46, 48, 50, and 52 on the RF waveform 34.

The manner in which this sampling is accomplished is as follows. Referring to FIG. 1, consider the case where the RF is off such that no RF signal 34 appears at the port 10. Assume that the local oscillator is turned on at time T=0 and that intermediate sample pulses such as the pulse shown at 54 begin arriving at the node 56. The current resulting from each intermediate sample pulse travels along the path 58 through the inductance segments Z1 and Z2 representing the inductance of the slot line portion of the RF coplanar waveguide. It can be shown from network theory that the voltage at node 56 is equal to the derivative of the input voltage at the local oscillator port 12 times a constant equal to the round trip inductance of the short circuited slot line path divided by the resistance in series with the path.

Note that the intermediate sample pulse 54 has a one edge which is much shorter than the other edge. It is the differentiation of this sharp rise time which causes the Delta function sample pulses shown at 36 in FIG. 2. The first sample pulse is at least two volts and therefore turns both diodes D1 and D2 on hard for the duration of the sample pulse. When the pulse is over, a large amount of current has passed in the forward direction through capacitors C1 and C2, but very little current has passed through them in the reverse direction. This leaves a charge Q on capacitors C1 and C2, which gives rise to a voltage Q/C1 reverse biasing diode D1 and Q/C2 reverse biasing the diode D2. Because the diodes are now slightly reverse biased, the next sample pulse does not turn the diodes on quite as hard as they were turned on by the first sample pulse. However, the diodes are still forward biased by the second sample pulse which causes more charge to be left on each of the capacitors by the end of conduction of the second sample pulse. This process continues until the reverse charge leaks through and around the diodes D1 and D2 through the resistor R1 just equals the forward charge stored during a sample pulse interval. This equilibrium condition will always occur at a fixed voltage $V_r$ across the diodes for a given pulse amplitude and resistance R1.

Now consider the case where the RF signal is on, but the frequency of the RF is an exact harmonic frequency of the local oscillator fundamental frequency. This means that the sample pulse will always occur at the same place in each RF signal cycle. Therefore, whenever the diodes are on, the RF signal will have the same voltage at node 62 in FIG. 1. The diode pair D1 and D2 will now self bias in the manner described in the previous paragraph until each diode has regained its reverse bias voltage $V_r$. Thus, if the voltage at node 62 is $V_{RF}$ when the sampled pulse arrives, then the voltage at node 64 is $V_r + V_{RF}$, and the voltage at node 66 is $-V_r + V_{RF}$ in the steady state. This means that the voltage at the center tap node 68 of the resistor R1 is simply the DC value, $V_{RF}$.

If the fundamental frequency of the RF signal at the RF port 10 is offset from some harmonic of the local oscillator by the frequency Delta, then the sample pulses will cause sample voltages at the output node 68 that will trace out one complete RF waveform cycle in the interval 1/Delta seconds. This means that the time axis of the RF signal has been scaled by a factor of $f_{RF/Delta}$ with no voltage conversion loss in the ideal case. Thus it is seen that the final output signal at node 68 is the same as the RF input signal except it is on a scaled time axis.

In time domain instruments, it is important that the amplitudes of the RF signal harmonics be preserved as well as preserving the shape of the RF fundamental signal. Of course, if the RF signal is a sign wave, there are no harmonics. However, the signal sampler according to the teachings of the parent cases works with any periodic RF signal, and it is well known that periodic signals of a nonsine wave nature have harmonic components defined by the Fourier expansion of the time domain function representing the signal. In accordance with the teachings of the parent cases, sample pulses having pulse widths substantially approximating the pulse width of a Delta function are used. The result is an absence of voltage conversion loss because of the unity strength of the harmonics of the local oscillator frequency at every harmonic of interest.

There is power conversion loss in the system according to the teachings of the parent cases since the RF is being sampled for a small fraction of each cycle.

The time scale factor relating the time access of the RF signal 34 in FIG. 2 and the time scale of the sampled waveform 22 in FIG. 2 is $f_{RF}/f_{IF}$ where $f_{IF}$ is the intermediate frequency of the output signal at node 68. This is the difference frequency between the frequency of the RF signal, $f_{RF}$, and the nearest harmonic of the local oscillator frequency, i.e., Delta. Real time on the time axis of the signal 34 in FIG. 2 is multiplied by this scale factor to yield the equivalent time on the time axis for the signal 22 in FIG. 2. If the intermediate frequency waveform is displayed on an oscilloscope, the horizontal axis of the display will be in equivalent time. Actual time is obtained by dividing by the scale factor. The process symbolized by FIG. 2 is referred to as "equivalent time sampling".

Figure 3:
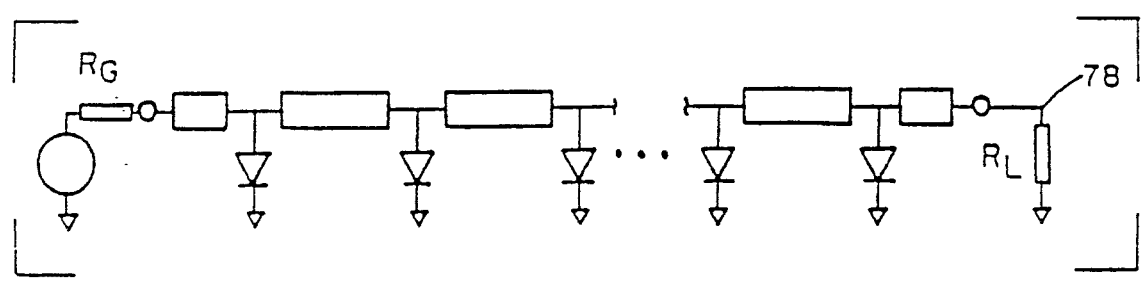
FIG. 3 is a block diagram of a nonlinear transmission line according the teachings of the parent cases.
Figure 4A:
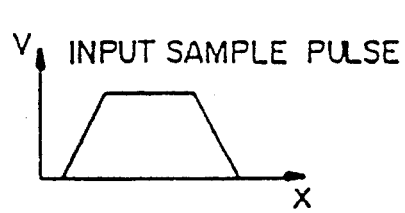
FIGS. 4(A) and 4(B) are illustrations of the input sample pulse to the nonlinear transmission line and the output intermediate pulse therefrom according to the teachings of the parent cases.
Figure 4B:
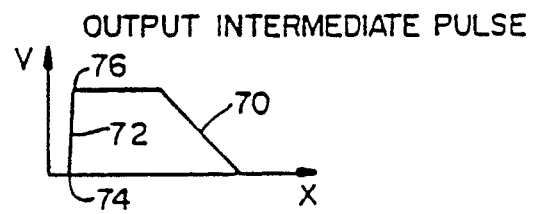

Referring to FIG. 3, a short summary of the operation of nonlinear transmission lines will be helpful in understanding the operation of the equivalent time sampling circuit according to the teachings of the parent cases. A nonlinear transmission line is a relatively high impedance transmission line which is periodically loaded with Schottky diodes serving as voltage-dependent shunt capacitances. FIG. 3 is an equivalent circuit diagram for a nonlinear transmission line such as is used according to the teachings of the parent cases and FIG. 4(A) shows the input pulse entering the nonlinear transmission line while FIG. 4(B) shows the shape of the output pulse which emerges as a result of propagation of the input pulse down the nonlinear transmission line. The propagation delay time per section of the line is equal to the square root of the transmission line inductance times the line capacitance per section. The nonlinear capacitors make the propagation delay time a function of voltage. For the diode polarity shown in FIG. 3, the diode capacitance increases with voltage so a more positive voltage on the line will have a longer delay time. This allows the more negative portions of the trailing edge of a pulse to catch up with the more positive portions of the trailing edge and the peak which shortens the rise time (or fall time depending upon perspective) of the trailing edge. Further, the voltage dependent capacitance causes the more positive peak to lag behind the more negative portions of the leading edge as is illustrated in FIG. 4(B).

While the voltage dependent delay time causes one edge of an input pulse to get steeper and stretches out the other edge, dispersion on the line causes both edges to stretch out. The rise time of the pulse will therefore be reduced as the pulse propagates along such a nonlinear transmission line until, finally, the tendency of the nonlinear delay to reduce the rise time just balances the tendency of the dispersion to increase the rise time. If diode series resistance can be neglected and the diode capacitance is much larger than the capacitance per section of the line, the final limited fall time of the pulse at the output of the nonlinear transmission line is on the order of but longer than the square root of the inductance of the line section times the capacitance per section. If the nonlinear transmission line is implemented in the form of a monolithic integrated circuit, this limiting rise time can be less than a picosecond.

Rise times of 7.8 picoseconds to 1.5 picoseconds are obtainable with today's process technology. Since the slope of the edge 70 in FIG. 4(B) is negligible compared to the slope of the edge 72, the derivative of the waveform of FIG. 4(B) is a narrow impulse function having a pulse width equal to the rise time of the edge 72. Hereafter, the time between the points 74 and 76 on the waveform of FIG. 4(B) will be referred to as the rise time, although it can also be called the fall time.

The diode arrangement of FIG. 1 is used because it allows both diodes to have the same polarity to the local oscillator. However, to the RF signal to be sampled, the diodes still appear to be anti-parallel, thus imposing only odd harmonic distortion on the RF signal. This arrangement provides natural isolation between the RF signal and the local oscillator signal since the local oscillator output is a balanced signal while the RF signal is unbalanced. Since the short circuited transmission line represented by the inductances 14 and 16 differentiate the oscillator waveform, that waveform can be a square wave or sawtooth wave rather than a series of impulses. Generation of a series of impulses by a local oscillator is possible but difficult.

Assuming that the local oscillator pulse is narrow enough, diode capacitance and series resistance directly determine the bandwidth of the sampler in two ways. First, the capacitor loading of the shunt diodes on the RF line causes the RF voltage at the diodes to have a pole in its frequency response at a frequency $1/2SC$. Thus for an RF bandwidth of 300 GHz, the capacitance of the diode loading has to be less than 10 femtofarads per diode. Second, diode capacitance and series resistance determine the turn-on time of the sampling diode. In the circuit of FIG. 1, it can be shown that the turn-on time of the sampling diodes is 1.8 picoseconds (10% to 90% rise time). This rise time exists for a local oscillator source resistance of 100 ohms, a characteristic impedance of 75 ohms for the shorted slot line, a series diode resistance of 60 ohms and for the series capacitance of the two diodes equal to 5 femptofarads. This means that if the diode is biased so that it turns on at the 85% point of the applied sample pulse, and if the shorted transmission line round trip line is 4 picoseconds, that the sampling diodes will be on for 1 picosecond yielding a bandwidth of roughly 300 GHz.

In order to achieve the high bandwidth and low values for the parasitic elements given in the previous example, it is necessary to have the local oscillator drive the sampling circuit with sufficient edge speed to develop the needed voltage across the short circuited slot line before the reflected wave returns from the short circuit termination and shuts the sampling diodes off. This means, for the design of the previous example, that the transition time or edge speed of the intermediate pulses emerging from the nonlinear transmission line must be preferably less than 4 picoseconds. By using a nonlinear transmission line to reshape the input pulse, usually a sinewave, from the local oscillator, this transition time requirement can be met. However, to couple pulses having such a fast edge speed to the local oscillator port of the sample circuit without distortion, the nonlinear transmission line must be integrated on the same chip with the sampling diodes and differentiation circuit. This means that hybrid technology and any construction technology other than full integration on the same surface of a substrate is not acceptable since the dimensional tolerances and spatial separation of these other construction options lead to losses, dispersion and parasitic loading, i.e., parasitic inductance, which would distort or destroy the fast edge speed achieved by the nonlinear transmission line.

According to the teachings of the parent cases, the sampling head is integrated on the same side of a substrate as a nonlinear transmission line with a single level of metallization plus air bridges. The requirement for monolithic implementation according to the teachings of the parent cases is quite demanding since it prohibits all prior art structures for sampling head designs which use microstrip or coax-to-slot-line local oscillator drive.

Figure 5:
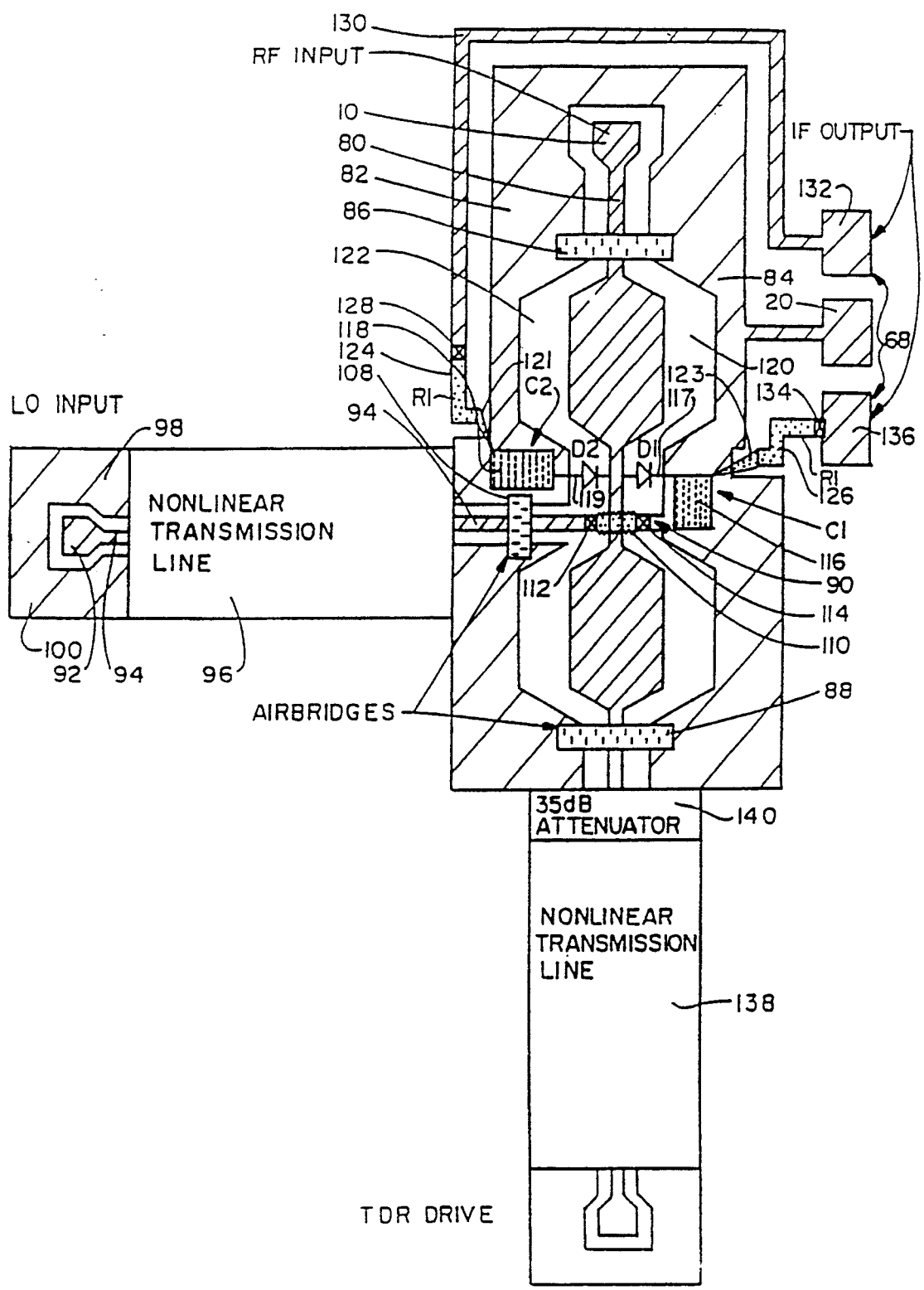
FIG. 5 is a plan view of the layout of a integrated sampling circuit according to one embodiment of the teachings of the invention in the parent cases.

The integrated structure for the sample head according to the teachings of the parent cases is shown in plan view at overview scale in FIG. 5. In FIG. 5, the RF input port 10 consists of a conductive pad connected to a center conductor 80 of an integrated coplanar waveguide. This integrated coplanar waveguide serves to carry the RF signal to be sampled toward the sample diodes D1 and D2 shown in the middle of FIG. 5. FIG. 5 is intended only to show the layout of the sample head schematically and not the exact integrated structure. More detail of the exact integrated structure will be given in FIG. 7.

The integrated coplanar waveguide for the RF signal is comprised of the center conductor 80 and two ground plane conductors 82 and 84 on either side of the center conductor 80 but which are electrically shorted together at several locations. The substrate is comprised of gallium arsenide, which has an N+ buried layer lying beneath an N− layer both layers being formed by molecular beam epitaxy. The doping of the N+ layer is $3 \times 10^{18}$ per cubic centimeter, while the doping of the $N^{31}$ layer is $3 \times 10^{16}$ per cubic centimeter. Areas underlying the RF signal integrated coplanar waveguide which need to be insulating such as most of the area between the center conductor 80 and the ground planes 82 and 84 are damaged by proton implants so as to convert the substrate in such areas into a semi-insulating material. This prevents shorting between the center conductor 80 and the ground plane conductors 82 and 84.

An air bridge 86 is formed to connect the ground planes 82 and 84 at a reflection point located away from the sampling diodes. Likewise, an air bridge 88 connects the two ground planes 82 and 84 at a reflection location below the sampling diodes. These two air bridges, 86 and 88, serve as short circuit terminations for the slot line comprised of the ground plane conductors 82 and 84. These short circuit terminations cause reflection of the incoming sample pulses propagating down the ground plane conductors 82 and 84 back toward the point of injection adjacent to the sample diodes.

The point of injection of the sample pulses is labelled LO INPUT. Input sample pulses are coupled to a contact pad 92 formed from the metal of the center electrode 94 of a nonlinear transmission line 96. The nonlinear transmission line also has two ground plane conductors 98 and 100. The structure of the nonlinear transmission line will be described in more detail below. The sample pulses are coupled into the nonlinear transmission line by coupling to the center electrode 94 via pad 92. This causes the sample pulses to propagate down the nonlinear transmission line 96 in coplanar waveguide mode. The sample pulses are compressed in terms of their fall time during propagation down nonlinear transmission line 96. The intermediate pulses which emerge from the nonlinear transmission line are coupled into the RF signal coplanar waveguide at 90 in a manner to excite slot line propagation along ground plane conductors 82 and 84 in both directions up and down the RF CPW. That is, the center conductor 94 of the nonlinear transmission line 96 is coupled only to the ground plane segment 84 at point 90 and the ground plane conductors 98 and 100 of the nonlinear transmission line are coupled to the ground plane conductor 82 the GP conductor 82. This applies the intermediate pulse across the slot in the RF coplanar waveguide so as to excite slot line mode propagation of the intermediate pulses toward the air bridges 86 and 88. An air bridge 108 shorts the two sections of ground plane 82 together (where the GP conductor 82 is separated to provide a gap through which the center conductor 94 of the NLT 96 passes) to suppress even modes of propagation on the nonlinear transmission line and to provide continuity in the RF coplanar waveguide ground plane conductor 82.

A buried 50 ohm resistor 110 formed in the N+ layer of the substrate is used to terminate the NLT 96 carrying the intermediate sample pulses in its characteristic impedance. The center conductor 94 of the nonlinear transmission line 96 makes an ohmic contact to the buried N+ layer via holes etched through the N− layer and shown symbolically at 112 and 114. The center conductor 80 of the RF signal coplanar waveguide is coupled to an airbridge which passes over the buried 50 ohm resistor 110 to make contact with a continuation of the center conductor 80.

The entire substrate is proton implant damaged to render it semi-insulating prior to forming the waveguides thereon. Certain areas are excepted from this proton implant damage, however. Those areas include the buried path of the resistor 110 and the resistors 124 and 126, and the junction areas of the diodes D1 and D2 and all diodes (not shown) of the nonlinear transmission line 96.

The center conductor 94 of the nonlinear transmission line 96 is coupled through the resistor 110 to the ground plane conductor 84. The ground plane conductors 98 and 100 of the nonlinear transmission line are electrically coupled to ground plane 82 of the RF signal coplanar waveguide. As a result, the intermediate sample pulses emerging from the nonlinear transmission line 96 are coupled into the slot line mode of propagation on the RF signal coplanar waveguide at the point of injection 90. Each sample pulse propagates toward the air bridges 86 and 88 and reflected back toward the sampling diodes. When each intermediate sample pulse arrives back at the point of injection, the sample diodes D1 and D2 are turned off thereby stopping the process of charging two integrated capacitors C1 and C2. Each of the capacitors C1 and C2 is comprised of a top plate of plated gold formed over a nitride layer which in turn is formed over a layer of evaporated Schottky metal which forms the bottom plate of the capacitor and is coincident with the ground plane conductors 82 and 84. The top plates of the capacitors C1 and C2 are shown at 116 and 118, respectively.

The resistor 110 implements the resistor labeled R2 in FIG. 1. The capacitors C1 and C2 correspond to the capacitors C1 and C2 in FIG. 1 and the diodes D1 and D2 correspond to the diodes D1 and D2 in FIG. 1. The cathode of the diode D1 is coupled to the top plate of the capacitor C1 by an air bridge 117. The anode of the diode D1 is an extension of the Schottky metal for the center conductor 80 of the RF signal coplanar waveguide and extends out over a junction area of unimplanted N− substrate thereby forming a Schottky diode. Likewise, the anode of the diode D2 is coupled via an air bridge 119 to the top plate 118 of the capacitor C2, while the cathode of the diode D2 is an extension of the center conductor 80 of the RF signal line and makes contact to an unimplanted portion of the N− layer via ohmic contacts to form the Schottky diode.

The resistor R1 in FIG. 1 is implemented by a segment of the N+ buried layer which is masked off during the proton implant. This area is shown as two segments at 124 and 126. The area 124 is coupled to the top plate 118 of the capacitor C2 via an air bridge 121. The air bridge 121 is coupled to the buried resistor segment 124 via an ohmic contact (not shown). The resistor segment 126 is coupled to the top plate 116 of capacitor C1 via an air bridge 123. An ohmic contact couples the air bridge to the buried resistor segment 126. The cross-sectional area and path length of the resistor segments 124 and 126 are equal such that each resistor segment has an equal resistance. The resistor segment 124 is coupled via an ohmic contact at 128 to a conductive path 130 formed on the surface of the substrate which couples the resistor segment 124 to a contact pad 132 serving as output node 68 for the IF signal. The resistor segment 126 terminates in an ohmic contact at 134 to make electrical contact to a contact pad 136 which is also, by off chip connections, the output node 68. Separate contact pads 132 and 136 allows the diodes to be separately biased slightly differently if necessary to balance the circuit.

A second nonlinear transmission line 138 is used to inject test signals into the RF coplanar waveguide for purposes of testing the bandwidth of the sampler. This nonlinear transmission line 138 is not critical according to the teachings of the parent cases and may be omitted.

A 35 DB attenuator 140 terminates the RF signal. coplanar waveguide, thereby rendering the nonlinear transmission line 138 invisible to sources of RF signals coupled to the RF input port 10.

Figure 6A:
FIG. 6(A) is a circuit diagram of the sampling diodes laid out to correspond to the cross-section of the sampling diode structure shown in FIG. 6(b) according to the teachings of the parent cases.
Figure 6B:
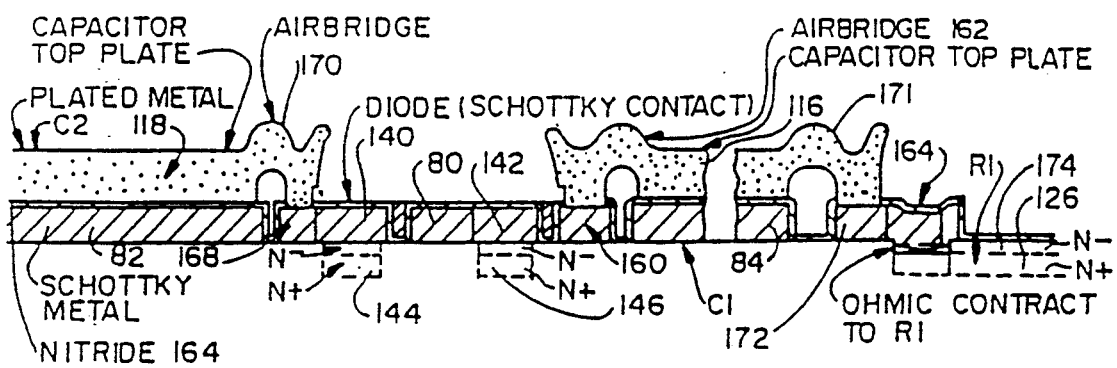
FIG. 6(B) is a cross-section of the diode and RF waveguide structure shown in plan view in FIG. 6(c) according to the teachings of the parent cases.
Figure 6C:
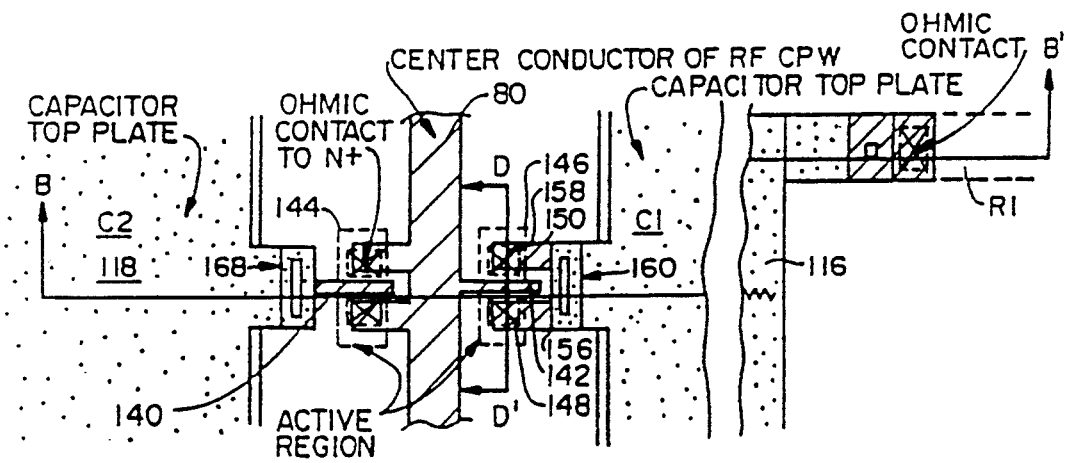
FIG. 6(C) is a plan view of the sampling diode and RF waveguide structure according to the teachings of the parent cases.
Figure 6D:
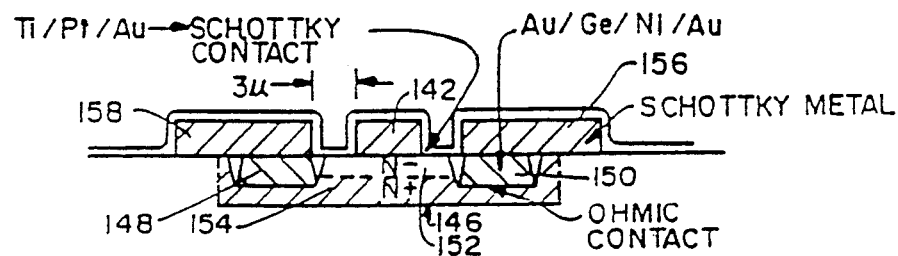
FIG. 6(D) is a cross-sectional view of a sampling diode according to the teachings of the parent cases.

Referring to FIGS. 6(A) through 6(D), there are shown further structural details of the sampling diode section of the preferred embodiment according to the teachings of the parent cases. FIG. 6(A) represents the schematic diagram implemented by the structure of FIG. 6(B) which is a cross-section through the sampling diode portion of the structure but not passing through the anode portions of the diode structures. FIG. 6(C) is a plan view of the sampling diode and capacitor region of a structure according to the preferred embodiment according to the teachings of the parent cases. FIG. 6(D) is a cross-sectional diagram showing the structure of each sampling, Schottky diode. The position of the section line BB' in FIG. 6(C) shows the position of the cross-section of FIG. 6(B). The position of the section line DD' in FIG. 6(C) shows the position of the section illustrated in FIG. 6(D). FIG. 6(A) is the schematic diagram of FIG. 1 laid out in a manner to spatially correlate to the structures shown below in FIG. 6(B). Corresponding structures in FIGS. 6(B) and 6(D) have corresponding reference numerals.

Referring jointly to FIGS. 6(B), 6(C) and 6(D), further details of the sampling diode portion of the structure are given. In FIG. 6(C), the diode anodes are shown as projecting fingers of Schottky metal at 140 and 142. An active region of N+ gallium arsenide is shown outlined in phantom for each diode at 144 and 146, respectively.

The center conductor of the RF signal coplanar waveguide is shown at 80. In FIG. 6(B) this is seen as a portion of the Schottky metal layer which is deposited on the surface of the proton implant damaged substrate.

The diode D1 to the right of the center conductor 80 in FIG. 6(C) is illustrated in cross-section in FIG. 6(D). In FIG. 6(D), the diode anode 142 is seen as a strip of Schottky metal placed over the active region 146 between two ohmic contacts 148 and 150 which form connections to the cathode. These ohmic contacts are formed by etching holes down through the N− layer 152 shown in FIG. 6(D) to the level of the N+ buried layer 154 of the active region 146. These holes through the N− layer are aligned under two projecting fingers of Schottky metal 156 and 158 which form the cathode terminals. The outlines of these holes 148 and 150 are shown in dashed lines in FIG. 6(C) under the projecting fingers 156 and 158. The ohmic contact is comprised of a structure consisting of 108 angstroms of germanium, 102 angstroms of gold, 63 angstroms of germanium, 236 angstroms of gold, 100 angstroms of nickel and 6000 angstroms of gold followed by a high temperature 450° C. annealing step to form an alloy. The Schottky diode anode contacts are comprised of a three layer structure including titanium, platinum and gold formed in direct contact with the substrate. The projecting fingers 156 and 158 form the legs of a U-shaped island of Schottky metal best seen in FIG. 6(C) at 160. This U-shaped island of Schottky metal is connected to the top plate 116 of the capacitor C1 by an air bridge 162 best seen in FIG. 6(B). This air bridge 161 is a bridge of conductive metal which joins the U-shaped island of Schottky metal shown at 160 in FIG. 6(C) to the plated metal 116 of the top plate of capacitor C1. Capacitor C1, as best seen in FIG. 6(B), is comprised of a top plate 116 of plated gold separated by a layer of nitride 164 from the bottom plate of the capacitor. The bottom plate of the capacitor is the same layer of Schottky metal used to form the various components of the diodes and the ground plane 84.

The structure of the diode D2 on the left side of the center conductor 80 of the RF signal coplanar waveguide is similar to the structure of D1 except that a T-shaped island of Schottky metal shown at 168 is used to form the anode Schottky contact 140. This T-shaped section 168 is connected by an air bridge 170 to the top plate 118 of capacitor C2. This top plate is separated by the nitride layer 164 from the bottom plate of the capacitor comprising the Schottky metal layer 82. All areas of the substrate shown in FIG. 6(B) except the diode junction areas and the buried resistor R1 at 126 in FIG. 6B are proton implanted and semiinsulating.

The resistor R1 shown in FIG. 1 is best seen in cross-section in FIG. 6(B). An air bridge 171 couples the top layer 116 of the capacitor C1 to an island 172 of Schottky metal. This island 172 is formed over a ohmic contact hole which has been etched through the N− layer 174 to the N+ layer below. In FIG. 6(B) only the resistor segment 126 is visible. The Schottky metal 172 contacts a gold-germanium alloy in contact with the N+ layer 126 to form an ohmic contact. A similar structure exists on the other side of the RF signal coplanar waveguide making contact between the top plate of the capacitor C2 and the resistor segment 124 (not shown).

The method for forming air bridges is well known in the art of gallium arsenide processing but will be summarized here for completeness. The first step in forming an air bridge between two metal patterns to be connected is to deposit the metal and pattern it to form the two nodes to be connected. Following this, a first layer of photoresist is deposited to coat the entire wafer. Thereafter the photoresist is developed in the area where the bridge is to be formed so as to leave contact holes to the metal surfaces to be electrically connected. Metal evaporation follows with an evaporation of 100 angstroms of titanium, 2000 angstroms of gold and another 300 angstroms of titanium being typical. This evaporated metal covers not only the exposed surface of the metal nodes to be connected but also the exposed surfaces of the photoresist. Next, a second layer of photoresist is deposited and developed to open a hole in the second layer of photoresist in the area where the air bridge is to be formed. The developing step for the second layer of photoresist includes formation of a contact hole to the evaporated metal layer for use in making contact for electroplating of a later defined gold layer. In the locations where the air bridge is to be formed, the top titanium is etched away to expose the underlying 2000 angstrom layer of gold. Then two microns of gold are electroplated onto the wafer by making electrical contact to the evaporated metal layer.

After electroplating the gold, the top layer of photoresist is dissolved by spraying the wafer with acetone. This leaves the evaporated layers of titanium, gold and titanium in the areas outside the area of the bridge exposed. These three layers of evaporated metal outside the bridge are then etched away in a conventional manner. Finally, the wafer is dipped in acetone to dissolve the remaining layer of photoresist to leave the air bridge standing between the two nodes to be connected.

Figure 7:
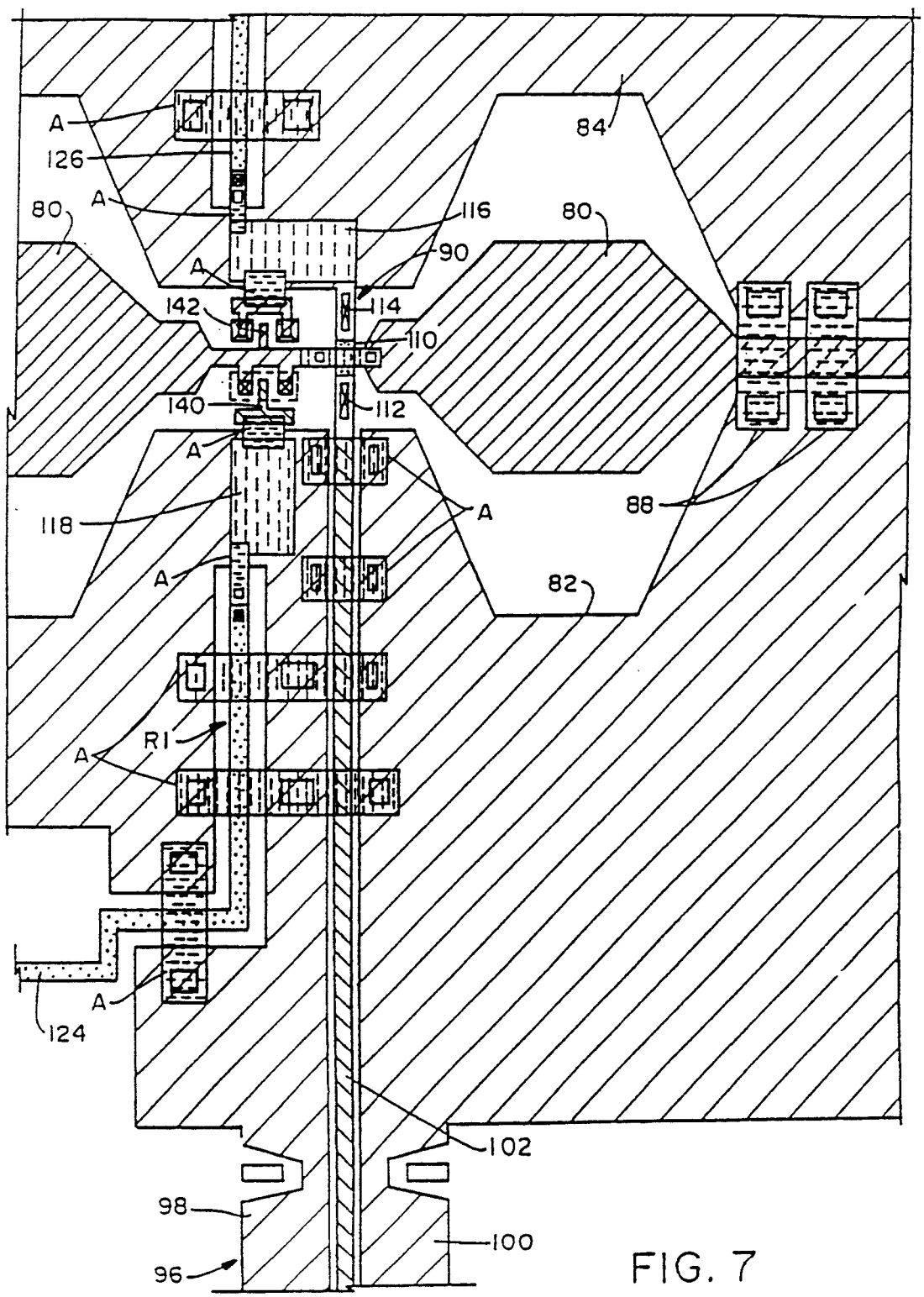
FIG. 7 is a partial plan view of the integrated sample head showing the interconnections of the diodes, capacitors, resistors and coplanar waveguides which are combined to implement the circuit of FIG. 1 according to the teachings of the parent cases according to the teachings of the parent cases.

Referring to FIG. 7, there is shown in plan view a layout of the sampling diode portion of the preferred embodiment according to the teachings of the parent cases to show more detail regarding the interconnection of the various structural components. In FIG. 7, structures which coincide with structures detailed on FIGS. 5 and 6, share the same reference numerals. The rectangular boxes inside the air bridge structures represent the metallic posts which support the air bridge. Rectangular boxes with Xs inside represent ohmic contacts to the underlying N+ layer. The multiplicity of air bridges across the gaps between ground plane conductors are used to maintain the separate segments of ground plane conductor at equal potentials so as to suppress even or slot line mode propagation. Because the mode of propagation for the sample pulses along the coplanar waveguide including center conductor 102 is even whereas the mode of propagation along the slot line portion of the RF signal coplanar waveguide is odd, there is little coupling between the RF signal coplanar waveguide and the coplanar waveguide carrying the sample pulses. Each coplanar waveguide has two propagation modes, CPW and slot-line. The odd mode, here called the CPW or coplanar waveguide mode, has electric field lines which point away from the center conductor across the gaps and toward the ground plane conductors. The even mode, here referred to as the slot line mode, has electric field lines which point in the same direction across the gaps between each ground plane and the center conductor. As long as the loading on the RF signal coplanar waveguide is symmetric about the center conductor, the slot line mode will not couple to the coplanar waveguide mode carrying the RF. It will be noted from FIG. 7 that the sampling diodes; and series capacitors connected across the slot are arranged to load the RF signal line symmetrically.

The intermediate pulses arriving in CPW mode from the nonlinear transmission line are coupled in slot line mode into the RF signal coplanar waveguide at point 90. After traveling for two picoseconds along the slot line in both directions, the intermediate pulses encounter an air bridge shorting together the two ground planes which form the slot line. Only one such air bridge is shown at 88 in FIG. 7 with the air bridge to the left of the injection point 90 being out of view but shown at 86 in FIG. 5. The air bridges short out the intermediate pulse waveform and brings the voltage back to 0 at the diodes after the four picosecond round trip time thereby shutting off the diodes. The resulting voltage waveform across the diodes appears as a differentiated version of the intermediate pulse.

Figure 8:
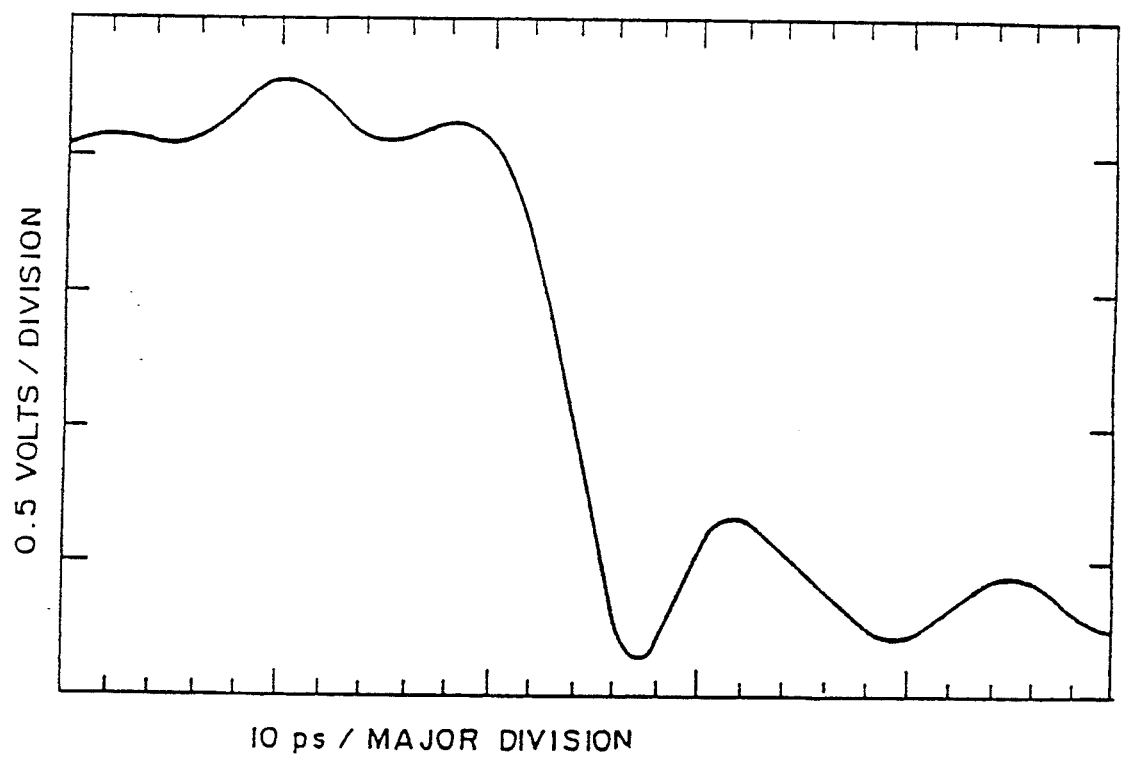
FIG. 8 is an illustration of a fast edge which was sampled using a sample head having the construction of FIG. 7.

The bandwidth of the sampler circuit is so large, it can only be measured indirectly through a built-in TDR pulse generator shown at 138 in FIG. 5. This built-in TDR pulse generator is identical to that used to generate the local oscillator intermediate pulses. The transition time at the output of the nonlinear transmission line 138 should be on the order of 2.8 picoseconds. The transition time measured by the sampling head is 4 picoseconds as shown in FIG. 8. With a nonlinear transmission line having an 8.5 picosecond per millimeter reduction in fall time of a length sufficient to provide a falling edge of less than 2.5 picoseconds fall time with larger amplitude, it is possible with the sampler head design of FIG. 7 to achieve sampling head bandwidth of 200–300 GHz. A larger intermediate pulse output amplitude will allow the differentiating slot line to be made narrower thereby eliminating the need for the hour glass shape of the RF sample coplanar waveguide. The hour glass shape is used in the embodiment shown in FIG. 7 to emphasize the inductance by increasing path length so as to increase the amplitude of the sample pulses that turn on the diodes. Because the amplitude of the sample pulse is the derivative of the input voltage of the intermediate sample pulse times a constant equal to the inductance of the round trip path from the injection point to the air bridge and back again divided by the resistance of this path, increased inductance increases the voltage of the sample pulses across the diodes.

Improvement in the sampling bridge performance can also be made by using lower resistance diodes. In the embodiment shown in FIG. 7, the junction area is $2 \times 5$ microns which results in a 12 femtofarad 0 bias capacitance. With suitable adjustments in geometry and doping, lower diode series resistance and possibly lower junction capacitance can be achieved.

The conversion efficiency of the sampling head design of FIGS. 5 through 7 when measured at 5 GHz and the intermediate frequency output port externally loaded by a 330 picofarad capacitance (cable capacitance of connections to chip) represented by capacitor C3 in FIG. 1, and a 1 megohm parallel resistance, resulted in no voltage Ficonversion loss within the accuracy of the measurement (0.5 dB). The power conversion loss was 43 dB which was also the approximate noise figure. This yields a minimum detectable signal of 90 nanovolts per square root Hertz. For an intermediate frequency bandwidth of 10 kHz, the minimum detectable voltage is 9 microvolts. The sampler was observed to be within 0.6 percent of linearity from −60 dBm to +3 dBm. The RF to IF isolation ("blow-by") was 55 dB, while local oscillator to IF isolation was 63 dB, and local oscillator to RF isolation ("kick-out") was 68 dB.

An ideal sampler would have perfect isolation between all ports except at the intermediate frequency where a time scaled representation of the RF signal would appear with no voltage conversion loss in amplitude to any RF frequency. Further, the local oscillator and RF ports of an ideal sampler would be perfectly matched at all frequencies. When parasitics are accounted for in the sampler model, however, it is possible for the RF to couple directly or "blow-by" to the intermediate frequency port through diode capacitance and reverse leakage. Loss of isolation between the local oscillator and RF ports can occur if the bridge is not perfectly balanced or if the intermediate frequency drive is not balanced. Such imbalance can result in "kick-out" of the local oscillator pulse onto the RF line. Imbalance also causes a DC offset in the intermediate frequency voltage proportional to the local oscillator amplitude. These considerations must be taken into account when designing a layout for a structure according to the teaching of the parent cases.

Other layouts are possible besides the structure illustrated in FIGS. 5 through 7. For example, a series capacitor arrangement could be used to differentiate the intermediate pulses, however, the layout shown in FIG. 7 is more convenient since the parasitic inductance of the slot line differentiator is used to form the differentiating circuit.

Although the fabrication process for the device is well known, a short summary of the fabrication is given here for completeness. Schottky diodes are formed on gallium arsenide molecular beam epitaxy material with a 0.6 micrometer N− active layer with $3 \times 10^{16}$ per cubic centimeter doping. A buried 0.8 micrometer N+ layer with $3 \times 10^{18}$ per cubic centimeter doping provides both the diode cathode connection and, on the nonlinear line, a resistive connection between the two coplanar waveguide ground planes, suppressing propagation of the slot line mode. Ohmic contacts having 0.02 ohms-millimeter resistivity are formed by a 0.75 micrometer recess edge, self-aligned gold/germanium/nickel/gold lift-off, and a 450° C. alloy. Proton implantation using both 110 keV implant at a dose of $7 \times 10^{14}$ per square centimeter and a 190 keV implant at a dose of $1 \times 10^{15}$ per square centimeter is performed. This proton implant damages the substrates sufficiently to provide greater than 40 megohm per square isolation. During implantation, a 1.6 micrometer gold mask on top of a 1.4 micrometer polyimide layer protects the ohmic contacts on the diode active region. The interconnections are formed with 0.1 micrometer titanium/0.75 micrometer platinum/1.4 micrometer gold lift-off. Schottky diodes are formed in regions where the center conductor overlaps unimplanted N-material.

In addition to millimeter wave Schottky diodes, fabrication of this high speed circuit requires high capacitance per unit area capacitors and low capacitance air bridge crossovers. High capacitance per unit area is needed for capacitor C1 and C2 to allow reasonably high coupling capacitance diodes while maintaining a high capacitor self-resonance frequency. The capacitor resonates when it is one quarter wave length long. To set the self-resonant frequency to ten times the highest frequency of interest ($10 \times 100$ GHz), for a 20 micrometer wide, 500 femtofarad capacitor with a silicon nitride dielectric, the dielectric thickness must be 700 angstroms. A value of 1,000 angstroms was chosen for the dielectric thickness since nitride thinner than this can have an unacceptably high density of pin hole defects. Capacitor insulation of 1,000 angstroms of nitride puts the resonant frequency at approximately 700 GHz for this structure.

Silicon nitride was chosen as the capacitor dielectric not only because of its high relative permitivity of 7.3 necessitated by the resonant frequency requirement discussed above, but also because of its excellent properties as a diffusion barrier and scratch protector. These are the same reasons that silicon nitride is the most widely used dielectric by microwave monolithic integrated circuit foundries. Choosing this dielectric in conformance with the existing industry standards also makes the sampling head circuit more practicable from the standpoint of manufacturability.

The capacitors are fabricated by depositing 1000 angstroms of 250° C. PECVD silicon nitride over the entire wafer and reactive ion etching holes, in a $C_2F_6$ plasma, where contact is to be made to underlying metal. The bottom plate of the capacitor is the Schottky metal while the top plate is 2 micrometers of plated gold. An air bridge, which is plated at the same time as the capacitor, is used to make connection to the top plate.

The last element required for millimeter wave circuits of reasonable complexity is the air bridge. The air bridge, which is a cross-over with no supporting dielectric, can be made to clear the metal that is crossing over by 1.5 micrometers. This large gap, in addition to the unity dielectric constant of air, gives the air bridge cross-over extremely low capacitive coupling to the metallization below.

The air bridges are fabricated by the process summarized earlier herein.

Important features of the sampler design layout are: (1) monolithic integration with processing on one side of the wafer only; (2) fifty ohm input match at the RF port; (3) no degradation in RF signal as it propagates through the sampling structure; (4) sufficient bandwidth in the local oscillator connection for the ultra short sampling pulse; (5) a reasonable match on the local oscillator port; (6) a balanced drive on the local oscillator port; and (7) an unbalanced drive on the RF port. The first requirement is the most demanding since it prohibits all previous sampling head designs. The structure detailed in FIGS. 5 through 7 to fulfill this requirement essentially consists of two intersecting coplanar transmission lines, one of which carries the local oscillator sawtooth waveform and the other of which carries the RF signal to be sampled.

The slot line differentiator also provides a naturally balanced local oscillator drive. That is, the current in the center conductor of the local oscillator coplanar waveguide is equal and opposite to the current in the outer conductor. When this current is applied to the slot line mode of the RF signal coplanar waveguide, no current is induced on the center conductor of the RF signal line. Since no current is induced on the center conductor of the RF signal line, the potential of this conductor is determined by the RF circuit and not by the local oscillator.

When the intermediate pulses from the nonlinear transmission line are applied to the RF slot line, the initial impedance is that of the RF slot line in parallel with the sampling diodes, all in series with the 50 ohm local oscillator coplanar waveguide terminating resistance 110 in FIG. 5. To get the majority of the RF voltage to develop across the diodes instead of the terminating resistor 110, the RF slot line impedance must be as large as possible. To achieve the high impedance slot line segments, the RF ground planes must be separated by a significant fraction of the substrate thickness. To maintain the RF coplanar waveguide impedance at 50 ohms, the RF center conductor must also be made larger to keep the same center conductor to slot width ratio. This is another reason for the hour glass configuration of the center conductors 80 and the ground planes 82 and 84 shown in FIG. 5. Scale modeling according to the teachings of the parent cases showed that a slot width on the RF slot line which is ⅜ of the substrate thickness yields a slot line impedance of 78 ohms. Microwave simulations on SPICE indicate that this would be large enough to permit sufficient voltage to develop across the diodes. The requirement of the high impedance slot line mode in addition to the necessity of keeping the diode sampling loop short, results in the hour glass shape of the RF coplanar waveguide and keeps the RF coplanar waveguide at a characteristic impedance of 50 ohms.

A fundamental difficulty in making a sampling head with a bandwidth of 100 GHz or greater is to lay out the circuit in such a way that parasitic elements are eliminated or incorporated into the design. Any element that cannot be treated as a distributed structure must be kept much less than a wave length long at 100 GHz. In gallium arsenide, this means all lumped elements must be less than 100 micrometers in their longest dimension. This requirement is easily met by the 2×5 micrometer sampling diode junction areas. However, it is desirable that the entire local oscillator circuit loop meet the 100 micrometer design rule to minimize inductance in this critical path. To accomplish this, minimum design rules were used to pack the elements as close together as possible. The thick Schottky metal lift-off process described earlier allows two micrometer lines and three micrometer spaces. When packed together, the local oscillator loop including the local oscillator terminating resistor 110, the two sample capacitors and the two sampling diodes measured 104 micrometers in perimeter.

NONLINEAR TRANSMISSION LINE DETAILED DESCRIPTION

Figure 9:
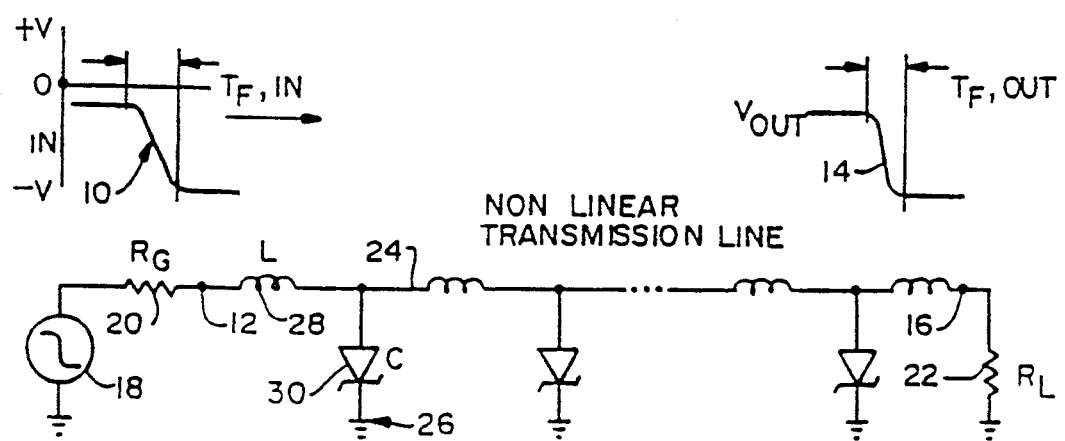
FIG. 9 is schematic diagram of a nonlinear transmission line according to the teachings of the parent cases.

Referring to FIG. 9 there is shown a schematic diagram of a nonlinear transmission line. This transmission line will change the shape of an input signal shown generally at 10 and applied to an input terminal 12 to the output signal shown at 14 appearing at an output terminal 16. In the process of propagating from the input terminal 12 to the output terminal 16, the fall time of the signal 10 is reduced from the time $T_{f,in}$ to the fall time of the output signal equal to $T_{f,out}$. The input signal 10 is supplied by a signal generator 18 through a source resistance 20. The output signal 14 is applied to a load resistance 22.

The nonlinear transmission line between input terminal 12 and output terminal 16 is comprised of a plurality of segments. Each segment is comprised of an inductor L and a capacitor C. In the preferred embodiment, the inductance is implemented through short sections of transmission line marked XX in FIG. 12. These short sections of transmission line have a characteristic impedance $Z_1$ and have a length in units of time which is designated in the Equations A above and B to J below, as the Greek letter tau. Each capacitor takes the form of a varactor diode junction in the preferred embodiment. The capacitor in each section couples the center conductor 24 of the transmission line to a ground plane shown generally at 26. Thus, the first section of the nonlinear transmission line of FIG. 9 is comprised of the inductor 28 and the varactor diode 30 having its anode coupled to the conductor 24 and having its cathode coupled to the ground plane 26. The conductor 24 serves as the center conductor. The varactor diode 30 has a PN junction therein which has a transition capacitance. The transition capacitance results when the junction is reverse biased and a depletion region is formed as will be explained in more detail below. The transition capacitance is actually the change in uncovered charges of the depletion region as the voltage changes, but for discussion purposes the reader can visualize the capacitor as having two movable, conductive plates. These two conductive "plates" are separated by the depletion region when the diode junction is reversed biased. For completeness here, the transition capacitance and depletion region will be explained briefly so that the nonlinearity of the transmission line can be understood by the reader. To do this requires reference to a cross-section of the diode region.

Figure 10:
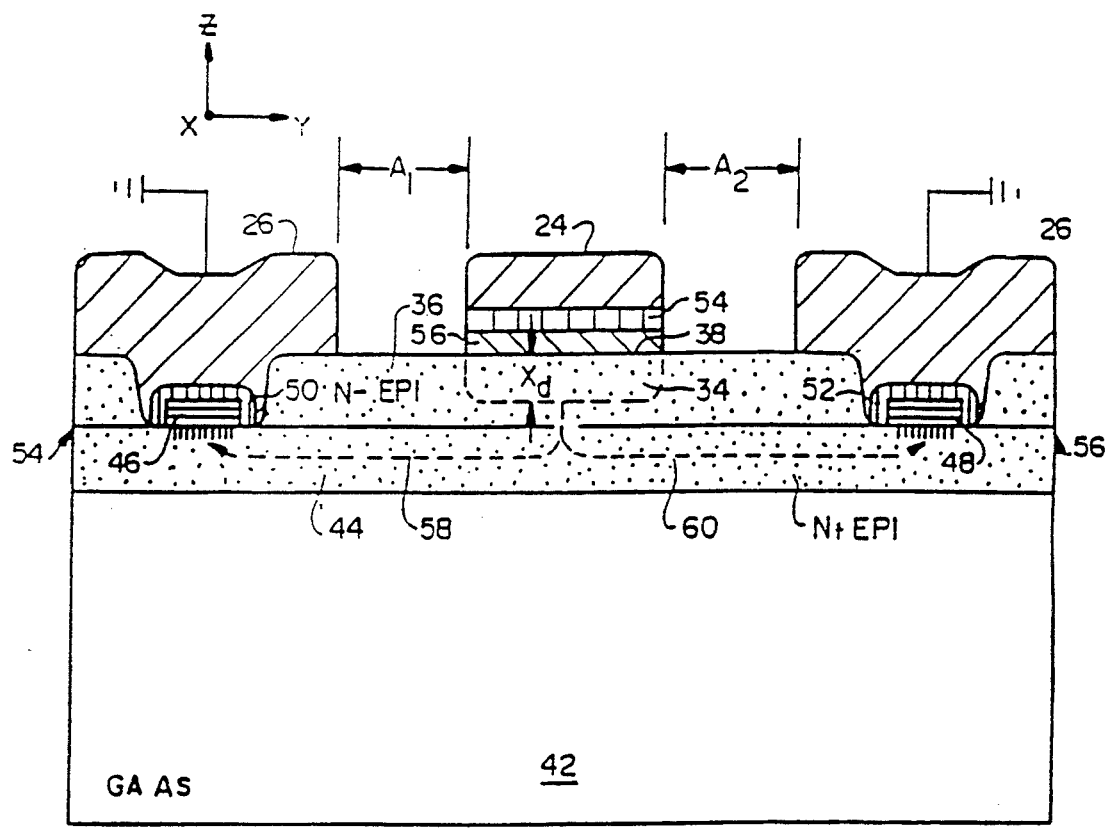
FIG. 10 is a cross-sectional view of the structure of a coplanar waveguide (CPW) nonlinear transmission line taken through a diode isolation island according to the teachings of the parent cases.

Referring to FIG. 10 there is shown a cross-section of the transmission line at a location which shows the construction of one of the varactor diodes according to one embodiment. FIG. 10 will be explained in much greater detail below during the discussion of the features of the transmission line. For now, the reader's attention is directed to a Schottky contact (diode junction) 38, a depletion region 34 and a $N^{31}$ doped epitaxial layer 36 and an N+ doped epitaxial layer 44. These three components along with ohmic contacts 46 and 48 form a Schottky diode. The dotted line defining the bounds of the depletion region 34 represents the extent of the depletion region into the N− epitaxial layer 36 at a particular voltage level of reverse-bias on the Schottky diode junction. This depletion region 34 represents a volume of uncovered, immobile charges bonded in the N+ epitaxial gallium arsenide crystal lattice caused by the reverse-bias voltage. That is, the reverse-bias voltage causes mobile majority carriers donated by the dopants in the N− epitaxial layer 36 to move away from the junction 38. In N− material, these majority carriers are free electrons that are loosely bound to the nuclei of the N-type impurity atoms which have been added to the crystal lattice. When these mobile carriers move away from their nuclei under the influence of the negative potential applied to the anode of the diode, they leave uncovered the nuclei of the dopant atoms. These dopant atoms have one more proton than electron because of the movement of the electrons away from the junction, and thus represent immobile positive charges making up the depletion region 34. The dimension $x_d$ represents the depletion region width. This dimension increases with increased reverse-bias voltage. Schottky contact 38 is the anode of the diode, and the N− epitaxial layer 36 is the cathode of the diode. When a negative voltage is applied to the anode relative to the cathode, the diode is reverse-biased and the depletion region 34 is formed. If the level of reverse-bias voltage is increased, the dimension $x_d$ increases as more electrons are pushed away from the junction and more positive charges are uncovered. This process of uncovering charges represents the process of changing charge storage as voltage changes, which is the essence of a capacitor. This increase in uncovered charge with increases in applied voltage may be considered to be a capacitive effect. This capacitance is the transition capacitance which will hereafter be denoted $C_j(v)$. The magnitude of the transition capacitance is equal to the change in charge within the depletion region divided by the change in voltage which caused that change in charge. This capacitance is variously referred to in the literature as the transition region, space charge region, barrier region or depletion region capacitance. Because the depth of the depletion region 34 increases as V becomes more negative, the transition capacitance decreases with more negative voltages V.

The amount of change in the dimension $x_d$ with the change in reverse-bias voltage depends upon the doping of the N− epitaxial layer 36. Lighter doping leads to greater changes in the width of the depletion region for a given change in the reverse-bias voltage.

Referring again to FIG. 9, what this change in the transition capacitance means in terms of the operation of the nonlinear transmission line is as follows. As the input signal 10 propagates along the transmission line, the instantaneous voltage at the anode of each diode changes over time. The input signal is applied with such a polarity relative to ground, that all diodes are reverse-biased. As the reverse-bias voltage on each anode changes, so does the transition capacitance magnitude. There is a total capacitance per section of line which is the combination of a fixed capacitance from the interconnecting line sections XX in FIG. 12 which is not voltage dependent and the transition capacitance which is voltage dependent. Thus, the total capacitance per section of line is voltage dependent.

Many characteristics of the transmission line depend upon the transmission line capacitance per section. Where the capacitance per section is voltage dependent, so are these parameters. For example, the characteristic impedance of the line, the group delay and the group velocity of the line are all voltage dependent.

Precisely speaking, the mathematical relationship between the characteristic impedance and the voltage-dependent total capacitance per section of the line (denoted $C_T(v)$) is given in the Equation:

$$Z_0(V) = \sqrt{L/C_T(V)} \qquad (B)$$

where,
$Z_0(V)$ = the small-signal characteristic impedance of the transmission line as a function of voltage, V,
$L = Z_1\tau$ = inductance of the interconnecting transmission lines, per section,
$C_T(V)$ = the total capacitance per section as a function of voltage,
V = the instantaneous voltage at any particular point on the line,
$\tau = (P/C_0)\sqrt{(1+\epsilon_r)/2}$ = the electrical spacing of the Schottky varactor diodes in time units,
P = the electrical spacing of the Schottky varactor diodes in distance units,
$\epsilon_r$ = dielectric constant of gallium arsenide ≈ 12.5,
$C_0$ = speed of light in vacuum,
$Z_\iota$ = characteristic impedance of the interconnecting transmission line. The relationship between the group delay and the voltage dependent total capacitance per section of line is given in $$T(V) = \sqrt{LC_T(V)} \qquad (C)$$

where,
T(V) = the group delay of the transmission line.
Furthermore the Equation:

$$C_j(V) = C_{j0}/\sqrt{1 - V/\phi} = \qquad (D)$$

is the transition capacitance of a step junction diode with a junction potential $\phi$, where in the preferred embodiment, $C_{j0}$ = 50 fF at 160 μm spacings along a 90 Ω coplanar waveguide transmission line, and $\phi \approx 0.8$ volts, defines the precise mathematical relationship between the capacitance of a step junction diode and the voltage applied to that junction to reverse bias it. Also the equations:

$$\approx 2/\sqrt{L(C_{ls} + C_L)} = 2/w_{per} \qquad (E)$$

wherein $C_{ls}$ is defined by equation (A) and $Z_{ls}$ is defined by equation (J) below.
and $$W_{rc} = 1/r_s C_j(V) \approx 1/r_s C_{ls} \qquad (F)$$

$r_s$ = the varactor series resistance ≈ 10 Ω, give the relationships between the periodic structure cutoff frequency $w_{per}$ and the diode cutoff frequency $w_{rc}$ and the voltage dependent capacitance per section, the line inductance per section and the series resistance of the diodes. Generally, the higher these cutoff frequencies are, the shorter the falltime which can be achieved at the output of the line.

Figure 11A:
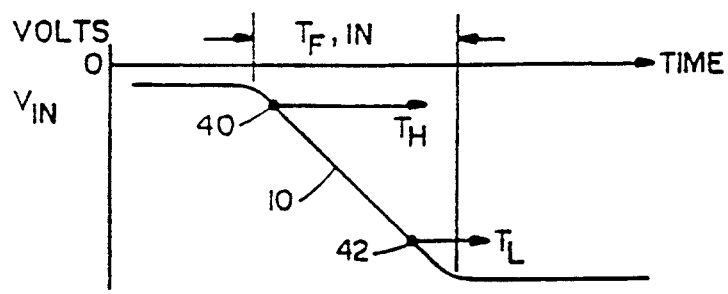
FIG. 11A and 11B are a diagram of the input signal and the output signal from the nonlinear transmission line showing the results of the compression according to the teachings of the parent cases.
Figure 11B:
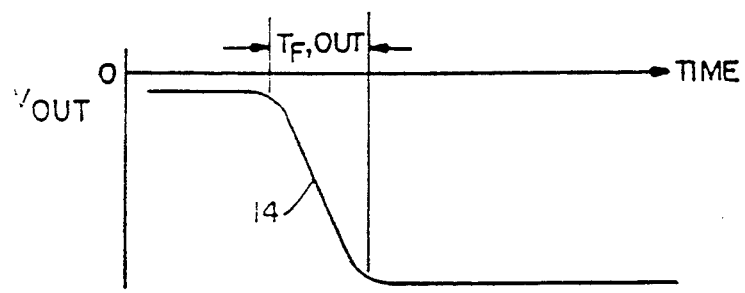

It is the voltage dependence of the group velocity which results in compression of the fall time of electrical wave fronts as they propagate along such a nonlinear transmission line. This compression can be understood by reference to FIG. 11. FIG. 11 shows the input signal 40 labeled $V_{IN}$ in part A and the output voltage labeled $V_{OUT}$ in part B. The fall time of the input signal is labeled $T_{f,in}$. The fall time of the output signal is labeled $T_{f,out}$. Note that the fall time of the output signal is substantially shorter than the fall time of the input signal because of the compression which occurred during propagation down the line. The reason for this compression is that the points on the input voltage waveform having more negative voltages travel at higher speeds and experience less delay in a nonlinear transmission line than points on the voltage waveform having more positive voltages. This is because of the voltage dependence of the line capacitance and the relationship between the line capacitance and the group delay. This phenomenon is symbolized in FIG. 11A by the delay vector labeled $T_H$ for the point 40 on the input voltage wave form being longer than the delay vector labeled $T_L$ for the point 42 which is lower on the voltage waveform. Every point on the voltage waveform has a different speed of propagation, and hence a different delay through the line. Because the higher voltage points are traveling faster and have less delay than the lower voltage points, the "tops catch up with the bottoms" and the waveform changes shape and assumes the shape of the output waveform known at FIG. 11B. The result is that the fall time is compressed as seen by the substantially shorter duration of $T_{f,out}$ in FIG. 11B, compared to $T_{f,in}$, in FIG. 11A. The reasons why higher voltage points have faster speeds of propagation are well understood by those skilled in the art and no further details will be given here.

Figure 12:
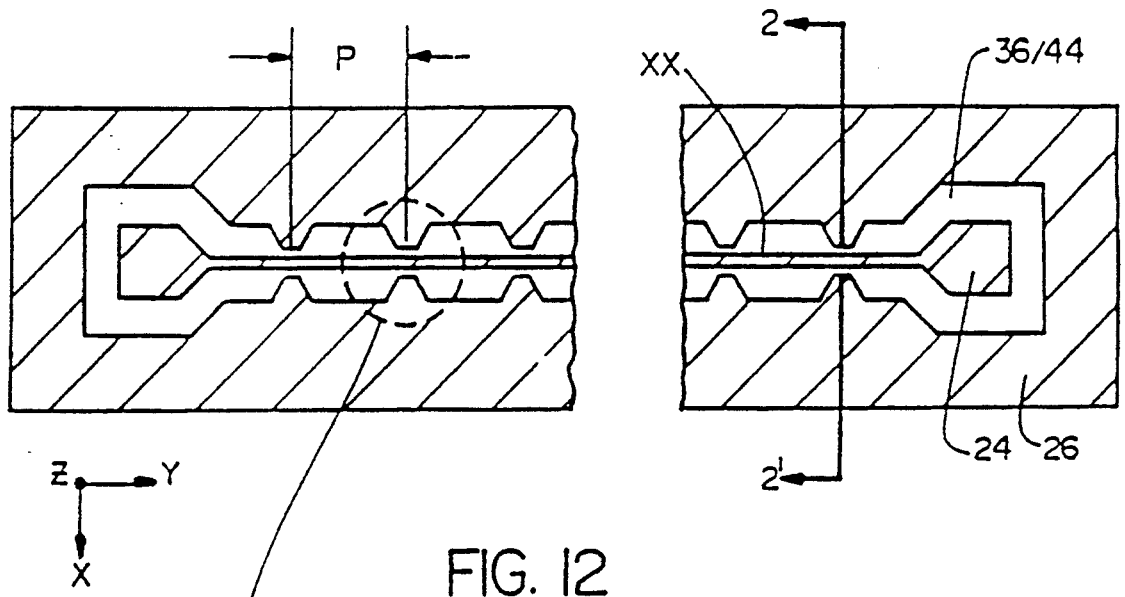
FIG. 12 is a plan view of the structure of an embodiment of a nonlinear transmission line according to the teachings of the parent cases.

Referring to FIG. 12 there is shown a plan view of the nonlinear transmission line according to the preferred embodiment of the nonlinear transmission line. The structural details of the transmission line can best be understood by joint reference to FIGS. 10, 12, 13 and 14. FIG. 10 shows a cross-section of one of the diodes in the transmission line taken at section line 10-10' in FIG. 12 according to one process of fabricating the line. The transmission line is fabricated on a monolithic gallium arsenide substrate 42. This substrate has formed thereon an N+ epitaxial layer 44 and an N− epitaxial layer 36 formed on top of the epitaxial layer 44. In FIG. 12, only a portion of these epitaxial layers is visible between the ground plane metal contacts 26 and the center metal contact 24. This epitaxial layer portion is labeled 36/44. The two parallel metal conductors 24 and 26 form the inductive portions of the transmission line. The center conductor 24 also forms the anode contact of the Schottky diodes. The ground plane contact 26 is also the cathode contact of the Schottky diodes. These cathode contacts are implemented with ohmic contacts to the N+ epitaxial layer 44 as best shown in FIG. 10.

The ohmic contacts 46 and 48 are formed by alloying a gold germanium mixture at high temperatures as is well known in the art. Any ohmic contact alloy will work to form the contacts 46 and 48, but it is preferred to use an alloy and a technique which will create the lowest possible contact resistance for reasons which will be explained more fully below. In the preferred embodiment, the ohmic contacts 46 and 48 are formed by heating a mixture of 8% gold and 12% germanium so as to cause the germanium to diffuse into the N+ epitaxial layer 44 to form a low resistance contact. The ground plane metal contact 26 and the center anode contact 24 are each comprised of gold. Two diffusion barrier layers 50 and 52 in the ohmic contact structure prevent the gold from the ground plane conductor 26 from diffusing into the ohmic contact regions 46 and 48 or the N+ epitaxial layer below it. This prevents spiking of gold through the N+ epitaxial layer 44 to the substrate 42. Preferably, the metal/dopant alloy chosen for the ohmic contacts will have as low a melting point as possible. Other nonalloyed contact structures may also be used if spiking of the gold through to the substrate 42 can be prevented. It is important, however, for the contact structure chosen to have a low series resistance so as to maintain the diode cutoff frequency as high as possible.

The diode-anode contacts are formed by the gold layer 24 on top of a platinum diffusion barrier 54. The platinum diffusion barrier separates the gold layer 24 from the Schottky contact metal 56 and prevents the gold layer 24 from spiking through the Schottky junction to the buried layer 44 and shorting the diode. The Schottky contact metal layer 56 is titanium in the preferred embodiment. However, many other metals may be used for the Schottky contact metal layer 56. Basically, any metal that will form a Schottky diode may be used. Such metals include aluminum, molybdenum, chromium and alloys such as molybdenum/aluminum and titanium/tungsten. The desired qualities for the metal layer 56 are that it exhibit good adhesion to the gallium arsenide substrate and that the diffusion of the metal into the gallium arsenide be low during high temperatures of operation or during subsequent processing steps. It is also desirable that the material chosen for metal 56 be stable in the sense that it should not change the leakage current through the diode with aging, changing temperature and so on. For further information, see page 271 of the text on gallium arsenide processing incorporated by reference herein.

The liftoff process for forming the diode anode contact 56/54/24 is well known in the art of semiconductor processing and is described in more detail at page 145 in "Gallium Arsenide Processing Techniques" by Ralph Williams, ISBN 0-89006-152-1 (Artech House, Inc. 1984) For completeness here, a short summary of the process will be given. In the area where metal is to be placed on the substrate, a layer of photoresist which has been spun onto the wafer is exposed to light through a mask. All other areas are shaded by the mask. The layer of photoresist is then hardened at the surface by a chlorobenzene soak before being developed. This renders the surface farthest away from the gallium arsenide harder than the regions closer to the substrate. The layer of photoresist is then developed. Because the developer carries away material closer to the substrate faster than the harder material farther away from the substrate, the area of photoresist exposed to the light is carried away and forms a hole with inwardly tapered edges. Then the desired metal is evaporated onto the surface of the substrate in the hole in the photoresist and onto the surface of the photoresist itself. Thereafter, the photoresist is dissolved thereby carrying away the metal on top of the photoresist and leaving the metal in the hole in the photoresist layer attached to the substrate there. This process is used to form the diode anode contact, the final interconnect metallization, and the ohmic contacts. It is also used to form the implant mask except that a layer of polyimide is placed under the layer of photoresist such that the metal in the hole in the photoresist is formed on top of a layer of polyimide. After the metal liftoff, the metal in the hole lies on top of a layer of polyimide covering the whole wafer. The wafer is then immersed in commercially available polyimide solvent to dissolve all the polyimide except that portion of the layer under the metal. The resulting metal/polyimide sandwich acts as an implant mask during the proton isolation implant.

Other gate technologies could also be used to form the Schottky diode anode contact. Some of these other gate technologies may have reduced reliability over time when subjected to high temperatures.

The doping of the N$^-$ epitaxial layer 36 is $3\times10^{16}$ N$_D$ atoms/cm$^3$. The doping of the N$^+$ epitaxial layer in the preferred embodiment is $3\times10^{18}$ N$_D$ atoms/cm$^3$.

Figure 13:
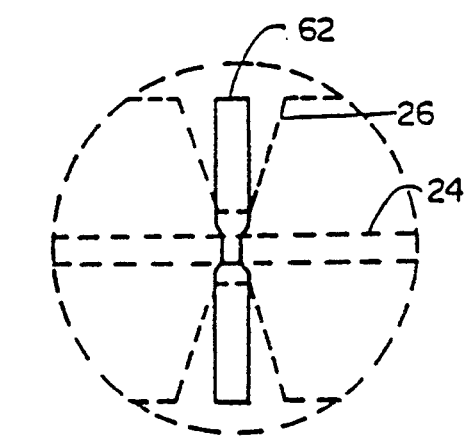
FIG. 13 is a plan view of the outline of the isolation implant mask according to the teachings of the parent cases.

The Schottky diodes are formed by isolating the epitaxial layers so that there are periodically spaced, isolated islands of epitaxial layers 36 and 44 which have mobile charge carriers therein. An implant is used at all other areas to cause crystal damage in the epitaxial layers 36 and 44 to immobilize the charge carriers, thereby converting the epitaxial layers in these implanted regions back to what is essentially intrinsic, high resistivity gallium arsenide. This crystal damage region is shown as the speckled pattern in the epitaxial layers 36 and 44 at 54 and 56 in FIG. 10. In FIG. 13 viewing above the plane of the nonlinear transmission line, the crystal damage region includes the entire area of the devices except for the masked regions 62 in which the diodes are formed. Outside the masked (unimplanted) regions 62, the implantation converts the N$^-$ and N$^+$ layers into semi-insulating material, thus restricting the Schottky contact area 38 to within the unimplanted region 62. These isolation regions restrict the current path to the dotted lines shown passing through the N$^-$ epitaxial layer 36 and the N$^+$ epitaxial layer 44 from the depletion region to the ohmic contacts. These current paths are designated 58 and 60 in FIG. 10.

A plan view of the boundary of the isolation island for each Schottky diode is illustrated in FIG. 13. In FIG. 13, the dashed lines represent the outline of the metal contacts 24 and 26, while the solid line 62 represents the boundary of the isolation implant. All area within the solid line 62 is not implanted. Thus, the charge carriers in the epitaxial layers 36 and 44 within this perimeter will be free to move.

Figure 14:
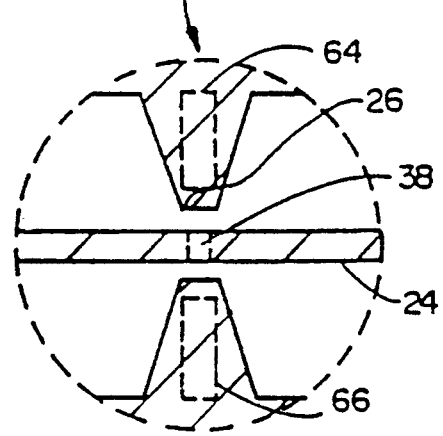
FIG. 14 is a plan view of the diode, including diode contact region and ohmic contact regions according to the teachings of the parent cases.

Referring to FIG. 14 there is shown a plan view of the area of a typical diode. The dashed lines 64 and 66 define the perimeters of the ohmic contacts 46 and 48. The region 38 defined by the intersection of the areas of the central metal contact 24 and the isolation island 62 defines the junction area of the Schottky diode.

The dimension P in FIG. 12 defines the pitch or periodicity of the diodes. In the preferred embodiment, the pitch is 160 microns. Ten micron design rules are used in the preferred embodiment, which means that the junction area 38 in FIG. 14 of the diode is 10 microns x 10 microns. This also means that the space between the center conductor 24 and the ground plane conductors 26 is also 10 microns. Smaller junction areas and closer spacing will improve the performance of the device for reasons which will be explained in more detail below.

The minimum compressed fall time T$_{f,min}$ is set predominantly by the periodic line cutoff frequency and the varactor diode RC cutoff frequency $w_{rc}$. The expressions for these two cutoff frequencies are given by Equations E and F above. With monolithic fabrication of the transmission line on gallium arsenide substrates, these two cutoff frequencies can be on the order of 0.1-1 terrahertz. This permits obtaining compressed fall times on the order of 5-10 picoseconds with 10 micron design rules. In the preferred embodiment, the integrated nonlinear transmission line incorporates 42 diodes. Each of these diodes has a junction potential phi of approximately 0.8 volts and C$_{oj}$ of approximately 50 femtofarads at 160 micron spacing (tau=1.4 picoseconds ) along a 90 ohm coplanar waveguide transmission line. This results in a 140 gigahertz periodic line cutoff frequency. By calculation, the characteristic impedance Z$_o$(v) varies from 44–55 ohms , and the group delay T(v) changes by 25 picoseconds as the line voltage varies from 0 to −2 volts.

In FIG. 10, the N$^-$ epitaxial layer 36 is 0.6 microns thick in the Z direction. The N$^+$ epitaxial layer 44 is 0.8 microns thick in the Z direction in the preferred embodiment.

The current in the diodes travels from the anodes to the cathodes along the paths 58 and 60 in FIG. 10. There is a series resistance associated with the current paths 58 and 60 which is the series resistance of the diode which limits the diode cutoff frequency w$_{rc}$. This series resistance can be divided into three components. The first component is the resistance of the current path in the portion of the N$^-$ epitaxial layer 36 from the bottom of the depletion region 34 to the junction with the N$^+$ epitaxial layer 44. This component of resistance accounts for approximately 20% of the total series resistance, and varies as the depth of the depletion region 34 varies with voltage. The second component of the resistance is the component attributed to the flow of the current through the N$^+$ epitaxial layer 44 to the positions of the ohmic contacts 46 and 48. This component accounts for approximately 60% of the total series resistance. The remaining 20% of the total series resistance is attributed to the resistance of the ohmic contacts 46 and 48. Obviously, closer spacing of the ground plane contacts 26 to the center contacts 24 will decrease the total path length and the total series resistance. Also, improvement of the ohmic contacts series resistance will raise the diode cutoff frequency.

Figure 18:
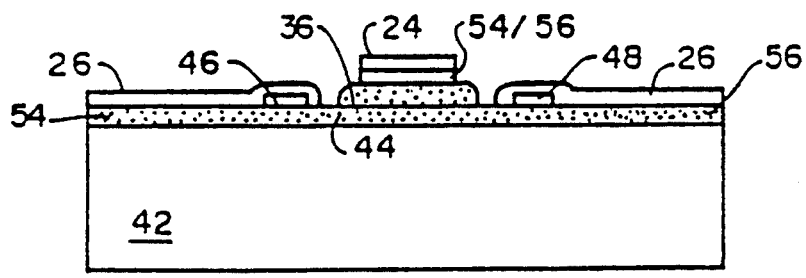
FIG. 18 is a cross-sectional view of another embodiment of the CPW nonlinear transmission line through the diode area according to the teachings of the parent cases.

The N$^+$ epitaxial layer 44 also provides a resistive connection between the two coplanar waveguide ground planes labeled as metallic contacts 26 in FIG. 18. This resistive connection suppresses propagation of an undesired unbalanced "slot-line" mode on the transmission line.

Fabrication of the device of FIG. 10 is performed in the following manner. Fabrication starts with an undoped gallium arsenide substrate which has a sufficient length to get a sufficient number of sections of the transmission line to achieve the desired degree of compression. In the preferred embodiment, 42 diodes are used at 160 micron center to center spacing. The minimum number of diodes required in the line is approximately 20% larger than the quantity equal to the falltime of the input signal ($T_{f,in}$) divided by the difference in delay between the highest voltage point and the lowest voltage point of the waveform. This delay is given by Equation C above The factor of 20% is necessary because compression to the final, shortest falltime is approached asymptotically.

The first actual process step is to grow the two epitaxial layers 36 and 44. In the preferred embodiment, these layers are grown by molecular beam epitaxy to the thicknesses cited above. Any other epitaxial method will also work to grow these layers. For example, liquid or vapor phase epitaxy will work as well as MOCVD which stands for metal organic chemical vapor deposition. Methods of performing this process and other process steps described herein are described in more detail in "Gallium Arsenide Processing Techniques" by Ralph Williams, ISBN 0-89006-152-1 (Artech House, Inc. 1984).

The epitaxial layers are doped as they are formed to have uniform doping profiles with the doping levels given herein. It is not believed that diffusion can be used to dope the epitaxial layers since it would not be possible to dope the epitaxial layer 44 heavily without leaving a doping level in the epitaxial layer 36 which is too high.

Next, the two ohmic contacts 46 and 48 are formed having 0.06 ohms/mm resistivity. These contacts are formed using a 0.75 um recessed etch, a self-aligned (88% gold-12% germanium)/nickel/gold liftoff technique, and a 450° C. alloy or a 12 second rapid thermal anneal. The rapid thermal anneal process is preferred since lower contact resistance can be achieved.

Figure 15:
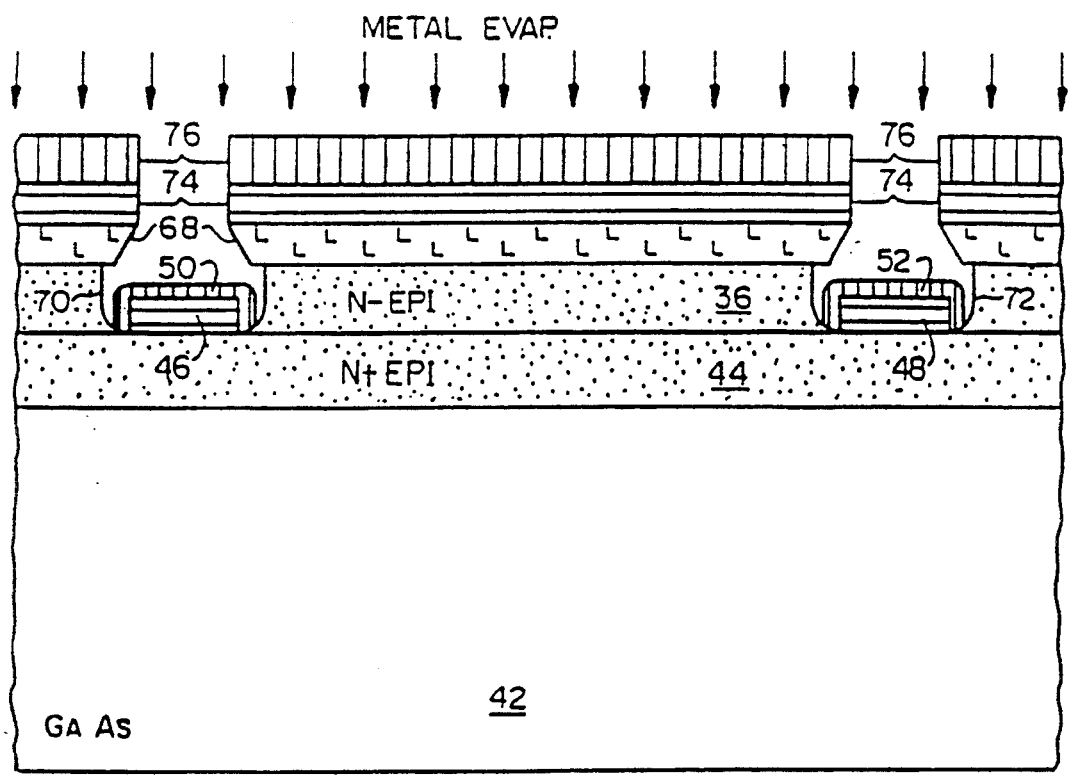
FIG. 15 is a cross-sectional view of the structure of the CPW nonlinear transmission line during an intermediate stage of device construction during formation of the ohmic contacts according to the teachings of the parent cases.

FIG. 15 shows the state of the wafer after formation of the two epitaxial layers 36 and 44 and after deposition of the ohmic contact metals and just prior to the liftoff. The layer of photoresist 68 represents the configuration of the first mask level. The contact holes 70 and 72 are etched using the photoresist layer 68 as the etch mask. This etch is performed using a wet chemical etch because of the 10 micron design rules. If 2 micron design rules are used, in alternative embodiments, the etch step to form the contact hole 70 and 72 may be performed using a plasma etch. After the contact holes are etched through the N− epitaxial layer 36, a conventional metal evaporation step is performed. This metal evaporation step uses the photoresist layer 68 to protect all layers of the N− epitaxial layer 36 except the areas where the contact holes 70 and 72 are formed. To do this, the wafer is placed in a chamber which is pumped down to a high vacuum level. Then a high energy electron beam is directed at a crucible filled with a gold-germanium mixture comprised of the desired alloy. The electron beam evaporates portions of this mixture in the center of the crucible causing gold and germanium atoms in the prescribed proportion to be deposited as the first layer of the ohmic contacts labeled 46 and 48 in FIG. 15 and as the layer 74 on top of the photoresist layer 68. After this layer has been deposited, the gold-germanium target crucible is rotated out of the path of the electron beam and a crucible containing nickel is rotated into the path of the beam. The high energy electron beam then evaporates portions of the nickel in the target crucible causing nickel atoms to be deposited on top of the previously deposited gold-germanium layer. This nickel layer is labeled 50 and 52 in the positions of the ohmic contacts and 76 on top of the layer 74.

After these two metal layers are deposited, the photoresist layer 68 is dissolved in a chemical bath thereby removing the metal layer 74 and 76. In some embodiments, a further layer of gold (not shown) is evaporated on top of the nickel layers 50 and 52 prior to removal of the photoresist layer 68. In these embodiments, the photoresist layer 68 is removed after this gold layer is deposited. The entire structure then is subjected to a 450° C. alloy process in a diffusion furnace for 30 seconds or for 12 seconds in a rapid thermal anneal device. During this high temperature step, germanium atoms in the metal layers 46 and 48 diffuse into the N+ epitaxial layer 44, thereby forming a low resistance ohmic contact. During this high temperature step, the nickel layers 50 and 52 act as diffusion barriers to prevent gold deposited on top of the nickel from diffusing into the gold germanium layers 46 and 48. This also prevents the gold from diffusing into the epitaxial layer 44 and "spiking" through to the gallium arsenide substrate 42.

Figure 16:
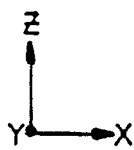
FIG. 16 is a cross-sectional view of the structure of the CPW device during the isolation implantation according to the teachings of the parent cases.
Figure 16:
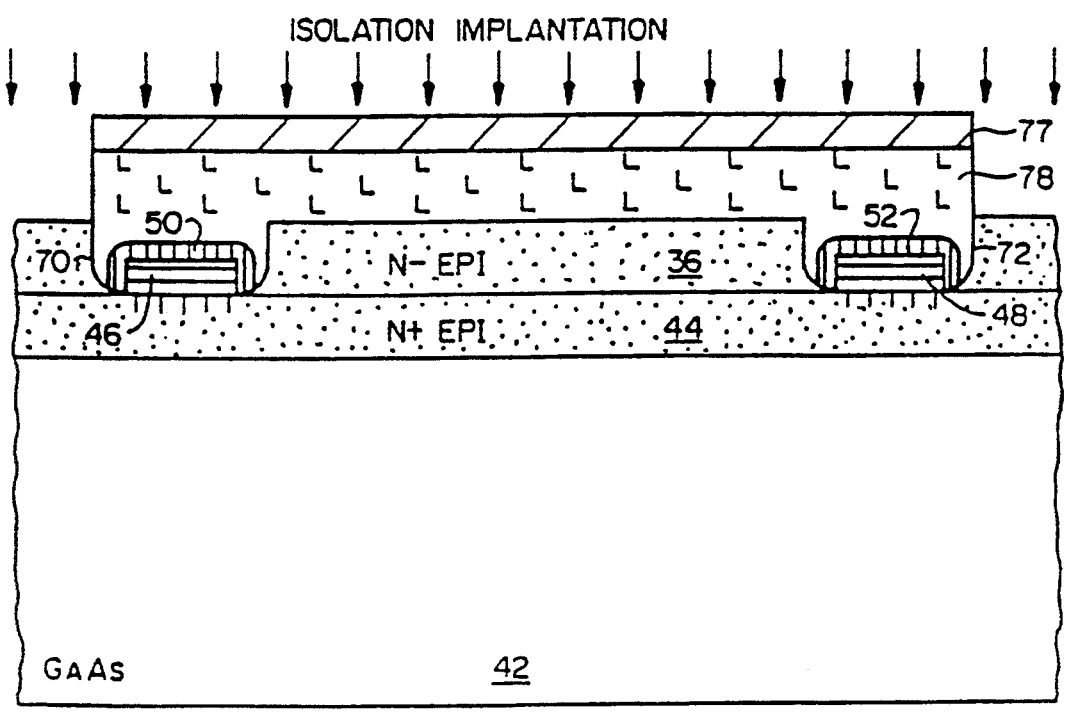

The next step is a proton implantation for the purpose of defining the isolation islands in which the Schottky diodes will be formed. FIG. 16 shows the proton implantation step and the configuration of the gold 77/polyimide 78 implantation mask which defines the boundaries of the isolation island. The implantation mask 77/78 has a configuration from the plan view, i.e., looking down the Z axis, as shown in FIG. 13. The purpose of the isolation implantation has been previously described. Only the portions of the epitaxial layers 36 and 44 lying underneath the implantation mask 77/78 will be able to conduct current freely after the implantation step has been performed. In the preferred embodiment, the implantation is done using protons since protons are relatively easy to implant to the necessary depth into gallium-arsenide at energy levels around 190 KEV. However, some equipment having greater acceleration energies is available to implant other types of ions such as oxygen or boron to the necessary depth. Any such implantation which causes the above described crystal damage result will suffice for purposes of practicing. In the preferred embodiment, the proton implantation is done in two steps. The first step is an implant at 190 KEV with a dosage level of $6 \times 10^{14}$/sq. cm. The second step is a 160 KEV implant with a dosage level of $1.5 \times 10^{14}$/sq. cm. These implants provide a greater than 40 megohm/sq. isolation characteristic. The isolation mask 77/78 is comprised of 1.6 micrometers of gold shown at 77 and 1.4 micrometers of polyimide 78 overlying the ohmic contacts and the region 62 which will become the diode-active region.

The final process step is to perform a third mask level photolithography step to define by liftoff techniques the locations of the Schottky anode contacts 24 in FIG. 10 and the configuration of the ground plane metal contacts 26. After the resulting photoresist layer is developed, metal evaporation is used to deposit 0.1 microns of titanium as shown at 56 in FIG. 10. After the titanium is deposited, the titanium crucible is rotated out of the way and a platinum crucible is rotated into the target position. The high energy electron beam then is applied to evaporate a portion of the platinum in the center of the crucible to deposit a 0.1 micron platinum diffusion barrier shown at 54 in FIG. 10. Finally, the platinum crucible is rotated out of the way and a gold target crucible is rotated into the target position. The third evaporation step is then performed to deposit a 1.4 micron thick (Z direction) gold contact 24 and to form the gold ground plane contacts 26 and transmission line conductors 24. In some embodiments, the ground plane contacts 26 and transmission line conductors 24 may be formed separately with a fourth masking level. Schottky diodes are formed in a 10 micron by 10 micron region underlying the titanium layer 56 in each isolation island by the self aligned intersection of the titanium metal deposition and the isolation island. This completes the fabrication of the device.

With a nonlinear transmission line of the structure of FIGS. 10 and 12, it is possible to configure the dimensions of the structure to obtain compressed fall times which are short enough to generate gate impulses of approximately 5 picosecond duration or better. Such a gate impulse can be obtained by differentiating the output step transition after compression in a nonlinear transmission line of the structure of FIGS. 10 and 12. The band width of diode sampling bridges used in sampling oscilloscopes and network analyzers is primarily limited by the duration of the pulse gating the diode. With gating pulses having approximately 5 picoseconds duration, the bandwidth of 2 diode sampling bridges for sampling oscilloscopes could be extended from the current 20 gigahertz level to 100 gigahertz.

One of the factors which limits the shortest falltimes which are available from a nonlinear transmission line of the structure shown in FIGS. 10 and 12 is the cutoff frequency for the Schottky varactor diodes. This cutoff frequency, is defined by Equation F above. Another factor which limits the amount of compression is the cutoff frequency of the periodic structure. This cutoff frequency is defined by Equation E above. With the configuration of the nonlinear transmission line of FIGS. 10 and 12 and with some scaling of the structural dimensions using more stringent design rules, it is possible to obtain step functions with the falltimes of approximately 4 picoseconds. This is a factor of 6 improvement over the rise times which can be currently attained by electrical means. With further improvements in the process and with tighter design rules, it is possible to obtain subpicosecond rise times.

What is the relationship between the physical dimensions of the structure shown in FIGS. 10 and 12 to the amount of compression which can be obtained? As a step input signal $V_{in}(t)$ with initial voltage $v_h$, final voltage $v_1$, and fall time $T_{f,in}$, propagates along the line, the fall time will at first decrease linearly with distance. As the pulse fall time decreases, dispersion arising from the structure's cutoff frequency, $w_c$, competes with the compression arising from the voltage-dependent propagation velocity. A final limited fall time $T_{f,min}$, on the order of, but longer than $2.2/w_c$, is reached at which the edge compression per section duet to line nonlinearity is equal to the edge broadening per section due to line dispersion. The output fall time is given by the Equation:

$$T_{f,out} = \max \begin{cases} T_{f,min}, \\ T_{f,in} - n[T(V_h) - T(V_l)]. \end{cases} \quad (G)$$

where, n = the number of sections in the transmission line, and $V_h$ and $V_l$ are the high-level voltage and low-level voltage of the input signal. $T_{f,min}$ in this Equation G varies inversely with both the diode cutoff frequency $w_{rc}$ given by Equation F and the periodic cutoff frequency $w_{per}$ given by Equation E. Exact calculation of $T_{f,min}$ requires computer simulation.

Line periodicity of the diode structure introduces a cutoff frequency $w_{per}$ which is given by the implicit relationship of the Equation:

$$Z_1 C_{ls} \omega_{per} \sin(\omega_{per}\tau)/2 = \cos(\omega_{per} \quad (H)$$

where, $C_{ls}$ is the varactor's large signal capacitance and is defined by Equation A above. This Equation H is simplified to Equation E above.

For input signals $V_{in}(t)$ such that at all points on the line the propagating wave is of sufficiently long rise time, the output of the transmission line is given by $$V_{out}(t) = V[t - nT(V)] \quad (I)$$

where T(V) is given by equation (C) above. This Equation shows that the compression occurs because of the voltage dependence of the propagation velocity signal along the line as shown by the relationship between Equations I and C above.

The performance of the line can be improved by increasing the periodic cutoff frequency $w_{per}$. This can be done by decreasing the diode spacing (in units of tau). However, decreasing tau (decreasing pitch) will also decrease the small signal characteristic impedance given by Equation B above and will also decrease the large signal characteristic impedance given by the Equation:

$$Z_{ls} = \sqrt{\frac{L}{C_{ls} + C_l}} \quad (J)$$

$Z_{ls} \approx 50$ Ω for a 0 to $-2$ volt step-function input with the structure of FIGS. 2 and 4 on a 90 Ω coplanar waveguide loaded by 45 diodes with $10 \ \mu m \times 10 \ \mu m$ junction area on an N-layer doped to $3 \times 10^{16}/cm^3$ at 160 μm spacings. This is because of the decrease in inductance per section (given by Equation B) where the characteristic impedance of the line is defined by Equation J above. This is an undesirable result for the power transfer efficiency reasons noted above. Therefore, the large signal characteristic impedance $Z_{ls}$ given by Equation J above will be constrained to approximately 50 ohms. Other embodiments may use different characteristic impedances for specific applications. However, the preferred embodiment will have a characteristic impedance of approximately 50 ohms. Accordingly, to satisfy this constraint while decreasing the diode spacing tau, the large signal varactor capacitance $C_{ls}$ must also be scaled in proportion with the scaling of L, the transmission line inductance per section. In such a case, the periodic cutoff frequency $w_{per}$ is limited by lithographic constraints on the minimum junction area for the varactor.

The varactor series resistance $r_s$ introduces a varactor cutoff frequency of $w_{rc}$. If this cutoff frequency is much less than the periodic cutoff frequency $w_{per}$, this varactor cutoff frequency limits the compressed rise time to approximately $2.2 \, r_s C_{ls}$. This time constant is the fundamental limitation to the compressed fall time, assuming elimination of the periodic line cutoff frequency $w_{per}$. Of course, neither cutoff frequency can be eliminated in reality so both effects must be taken into account.

The total circuit area of the structure shown in FIGS. 10 and 12 with 10 micron design rules and 160 micron diode spacing along a 90 ohm coplanar wave guide transmission line is approximately 8 mm by 0.3 mm. With a periodic line cutoff frequency of approximately 140 gigahertz, the minimum compressed fall time of 4 picoseconds can be obtained if the diode resistance is zero. With 10 ohm diode resistance, minimum compressed falltimes of 7.5 picoseconds can be obtained.

To generate subpicosecond pulses with a nonlinear transmission line, both the line periodicity cutoff frequency $w_{per}$ and the varactor cutoff frequency $w_{rc}$ must be increased. Because of the constraints on line impedance in the preferred embodiment of 50 ohms or thereabouts, diode spacing (L) must scale with diode junction area ($C_{j(v)}$). To decrease the diode capacitance and increase $w_{per}$, either the device-active layer doping must be decreased below $3 \times 10^{16}$ atoms/cm$^3$ or the junction area must be decreased below the 10 micron by 10 micron area described herein. Because of degraded diode cutoff frequency and because of rapid increases in the depletion layer width, $x_d$ in FIG. 10, with decreases in the doping of the N− epitaxial layer 36 requiring much thicker N− layers to avoid possible punch through, capacitance reduction through reduction in the junction area is the more desirable of the two approaches.

Increased varactor cutoff frequency $w_{rc}$ can be achieved by decreasing diode series resistance $r_s$. This can be achieved by reducing the spacing of the ohmic and Schottky contacts. In FIG. 10, decreased contact spacing would translate to smaller dimensions $A_1$ and $A_2$. This would decrease the length of the current paths 58 and 60 thereby reducing the series resistance. Further improvements in the series resistance can be made by selecting the ohmic contact material in process so as to minimize the series resistance presented by the ohmic contacts 46 and 48, by heavier doping of the N+ epitaxial layer 44, and by optimization of the thickness of the N− epitaxial layer 36 to the maximum possible depletion layer width $x_d$. That is, the thickness of the epitaxial layer 36 should be made as close as possible to the maximum penetration of the depletion layer 34 into the N$^{31}$ epitaxial layer 36. This minimizes the current path segment from the edge of the depletion layer 34 to the junction 54 between the epitaxial layer 36 and the N+ epitaxial layer 44.

Figure 17:
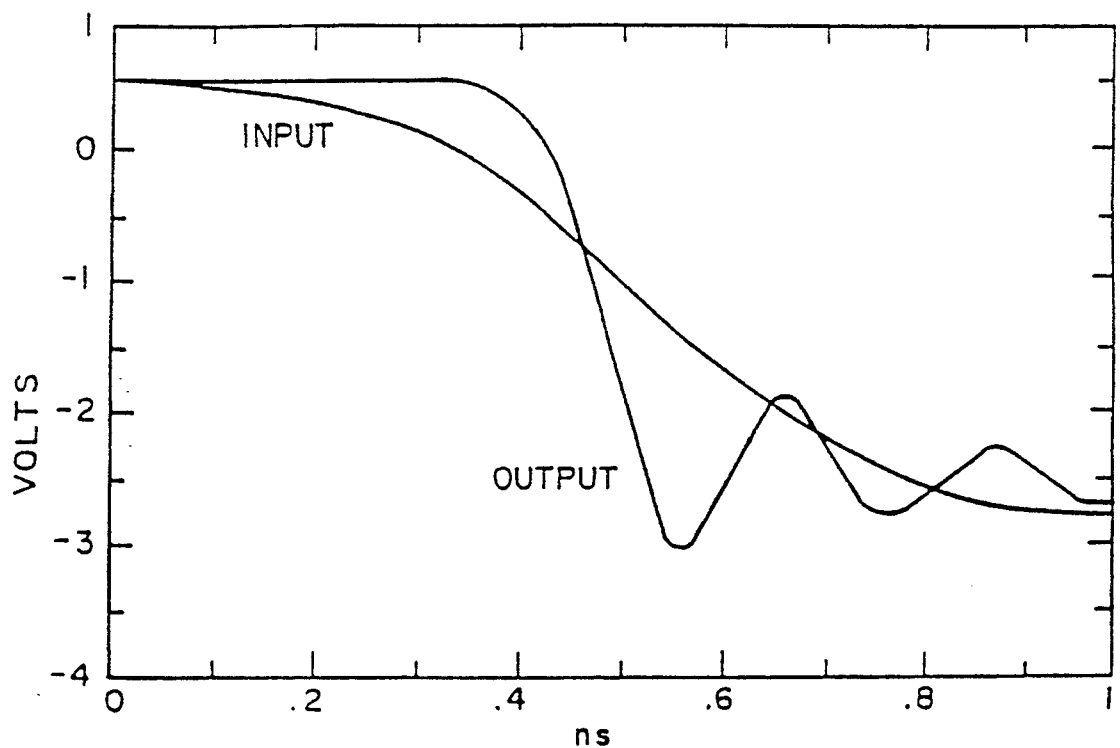
FIG. 17 is a diagram of the relative wave shapes of the input and output signals from the CPW nonlinear transmission line as implemented in a scale model thereof according to the teachings of the parent cases.

FIG. 17 is a graph of the compression of a 500 picosecond input fall time to a 100 picosecond output fall time on a scale model of the nonlinear transmission line which was constructed with very large geometries.

Figure 19:
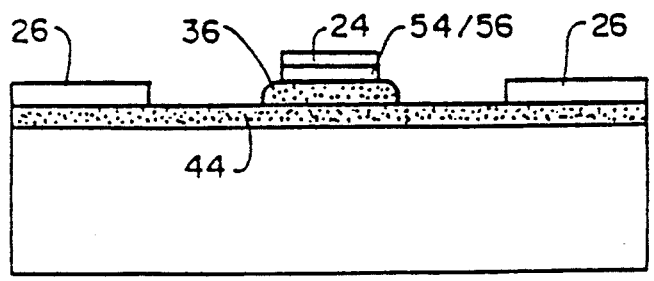
FIG. 19 is a cross-sectional view of another embodiment of the CPW nonlinear transmission line through a region outside the diode isolation island according to the teachings of the parent cases.

FIGS. 18 and 19 show an alternative embodiment. FIG. 18 is a cross-section through one of the diodes of a nonlinear transmission line where the N− epitaxial layer has been etched away at all locations except the area under the Schottky diode anode contact.

FIG. 19 shows a cross-section through the transmission line at a location other than the location of a diode active area.

Figure 20:
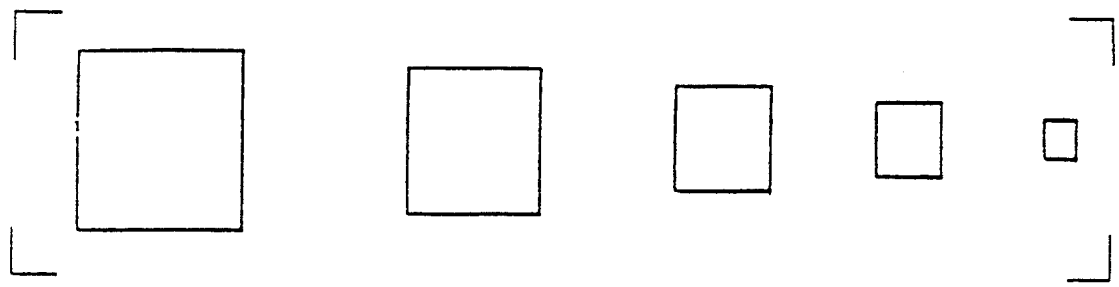
FIG. 20 is a schematic plan view of an embodiment of the CPW nonlinear transmission line wherein the diode junction areas are successively smaller and the spacing between diodes becomes progressively smaller according to the teachings of the parent cases.

FIG. 20 schematically shows another alternative structure. In this structure, the diode junction areas are decreased at each diode location from the input of the line to the output. Further, the spacing between the diodes is scaled in proportion to the decrease in the junction area such that the characteristic impedance of the line remains approximately 50 ohms . The purpose of such an embodiment is to achieve improved performance. This improved performance results from the recognition that as the signal propagates down the line, its fall time is compressed and the high frequency components in the spectrum of the signal therefore increase. These high frequency components change the impedances presented by the capacitances of the diodes and the inductance of the coplanar waveguide sections unless the size of the junction and the spacing between the junctions is altered. FIG. 20 shows the junction areas and junction spacings from plan view only. All other details of the construction are as previously described.

Another possible embodiment is to construct the transmission line in segments, each segment containing a plurality of diodes. In the first segment, the diodes will have a first junction area and a first spacing. In the second segment, the junctions will all be the same size but smaller than the size of junctions in the first section. Further, the spacing between the diodes in the second section will be closer in proportion to the decrease in the junction area so as to maintain the characteristic impedance of that section at approximately 50 ohms . This pattern of ever-decreasing junction area and spacing between the diodes in each section is repeated until the appropriate length for the transmission line is achieved. The first several sections are designed to maximize the change in delay with voltage, thus reducing the total number of diodes required for a given input falltime $T_{f,in}$. The later sections with smaller geometries have higher diode and periodic cutoff frequencies, and are optimized to obtain the shortest possible output falltimes.

Figure 21:
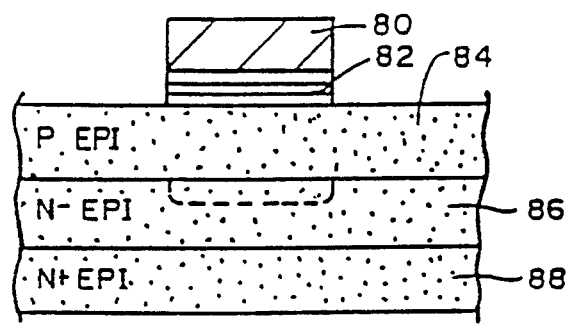
FIG. 21 is a cross-sectional view of the diode region of another embodiment of the nonlinear transmission line according to the teachings of the parent cases.

Other possible structures which can be used to achieve compression according to the teachings of the parent cases are any capacitance which is voltage dependent. Thus, for example, regular PN diode junctions could be used as opposed to Schottky diodes to create the nonlinearity and voltage-dependent propagation velocity needed to achieve the compression. A cross-section of the diode portion of the transmission line in such an embodiment is shown in FIG. 21. In the diode structure of FIG. 21, layer 80 is a gold diode contact. Layer 82 is an ohmic contact. Layer 84 is P type epitaxial gallium arsenide which is doped to give a minimum amount of series resistance in current flow through the P epitaxial layer 84, to the N− epitaxial layer 86. The N− epitaxial layer 86 is formed and doped in accordance with the description given above for the epitaxial layer 36. Finally, the N+ epitaxial buried layer 88 is formed and doped in accordance with the description of the N+ epitaxial layer 44 given above. In alternative embodiments, the P type epitaxial layer 84 could be doped P−.

Figure 22:
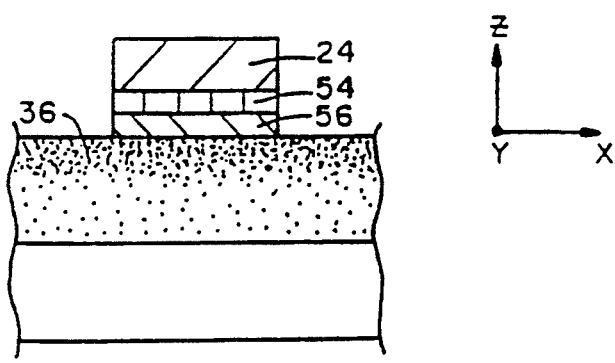
FIG. 22 is a cross-sectional view of the diode region of another embodiment of the nonlinear transmission line according to the teachings of the parent cases.

In yet another alternative embodiment, hyperabrupt Schottky contacts are used to fabricate a line which otherwise has the construction shown in either FIGS. 10 and 12 or FIGS. 18 and 19. Such a hyperabrupt junction is represented by FIG. 22 where the increased density of the dot pattern near the surface of the N− epitaxial layer represents a heavier doping there. A hyperabrupt Schottky contact requires that the N− epitaxial layer have a nonuniform doping. Such an N− layer is lightly doped at the N−/N+ epitaxial layer junction. This doping increases as one moves through the N− epitaxial layer in the positive Z direction. Such a doping profile can be manufactured using molecular beam epitaxy, liquid phase epitaxy or MOCVD. It is also possible to form such a nonuniform doping profile using ion implantation. In such an embodiment, the N−/N+ epitaxial layers would be formed with molecular beam epitaxy and doped using an ion implantation. The doping profile is adjusted to make the capacitive changes linear for linear changes in the instantaneous line voltage applied to reverse bias the junction. In the preferred embodiment, the change in capacitance for a unit change in reverse bias voltage is nonlinear in that for higher levels of voltage, the unit change in applied reverse bias voltage produces less change in the capacitance than a unit change in voltage at a lower voltage causes. By adjusting the doping profile appropriately, the changes in capacitance for a given change in voltage can be made linear throughout the range of voltages of the input signal.

The main reason for using hyperabrupt junctions is to get larger changes in capacitance per unit change in voltage. That is, with a hyperabrupt junction, the capacitance of the resulting junction varies more rapidly with voltage than the capacitance of a junction with uniform doping, producing a greater change in line delay with input voltage. For a given input signal falltime $T_{f,in}$, the required number of diodes and hence the required line length is decreased.

Another alternative embodiment is to reduce the size of the overall die using spiral inductor sections to replace the inductive transmission line sections marked XX in FIG. 12. The spiral inductor sections are publicly known and exist on various devices manufactured by Pacific Monolithics of Sunnyvale, Calif.

Figure 23:
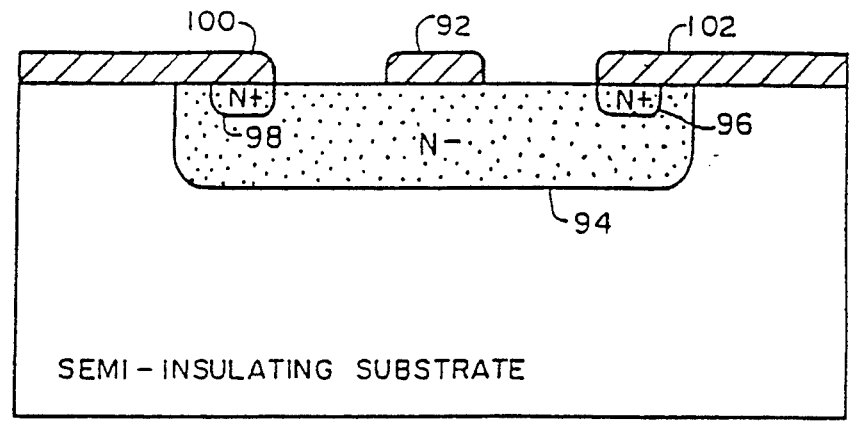
FIG. 23 is a schematic cross-sectional view of another embodiment of the nonlinear transmission line according to the teachings of the parent cases.
Figure 24:
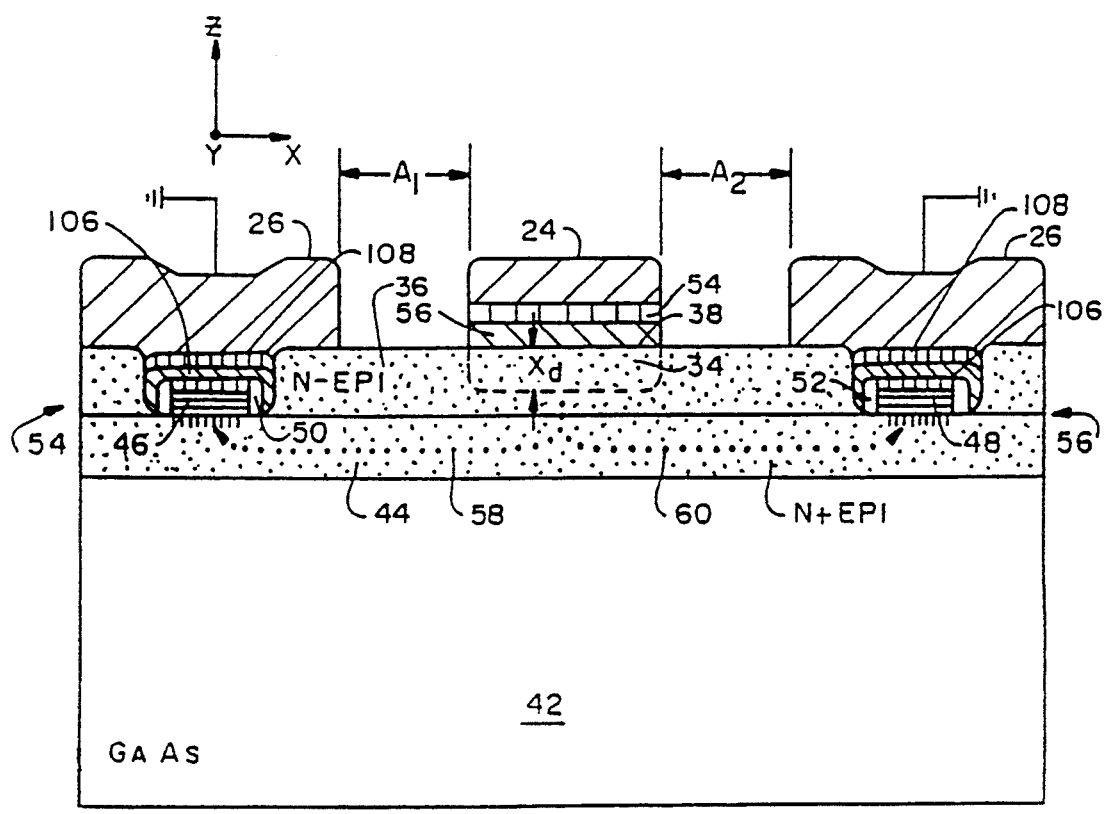
FIG. 24 a cross-sectional diagram of the preferred embodiment of the nonlinear transmission line according to the teachings of the parent cases.

Another alternative embodiment which could be used is in the form of a monolithic coplanar waveguide loaded periodically with the gate capacitances of a series of MESFET's. A cross-section through the MESFET of such a device is shown in FIG. 23. In such a device, layer 92 is the gate metal and layer 94 is $N^{31}$ epitaxial gallium arsenide lying on top of a substrate of gallium arsenide (not shown). Layers 96 and 98 are N+ epitaxial layers which make contact with source and drain metal contacts 100 and 102. Turning now to FIG. 24 it can be seen that the only difference between the structure of FIG. 24 and that shown in FIG. 10 is the existence of the additional layers of titanium 106 and platinum 108 above the ohmic contact metal. These additional layers do not affect the resistivity of the contacts substantially.

Alternative process technology can also be used to fabricate the device structures described above. Although in the preferred embodiment of the process, a standard $NH_4OH/H_2O_2/H_2O$ gallium arsenide wet etch is used to give good etch depth control needed for etching through the $N^{31}$ layer to the buried N+ layer for the ohmic contact and initial alignment marking etch, other etch processes may also be used. For example, dry etch or plasma etch processes may be used if sufficient depth control can be achieved to prevent etching through the N+ epitaxial layer. Dry etches create surface states, but it is possible that these surface states can be etched away with a mild wet etch following the dry etch.

In the preferred embodiment, ohmic metallization is a typical germanium-nickel-gold eutectic mixture deposited by electron beam evaporation and alloyed in a rapid thermal annealer. The rapid thermal anneal process is faster, easier, cheaper and more reproducible than a conventional oven anneal process and is therefore preferred. Ohmic contacts of 0.06 ohms /mm resistivity have been achieved which is much lower than the typical values quoted for oven annealed contacts (typically 0.5 to 5 ohm-mm). Although this ohmic contact metallization is achieved using liftoff metallurgy (additive), it is also possible to perform this metallization as well as the other metallizations in the process using subtractive etching processes. Either wet etch or dry etch processes may be used for the subtractive etching. The liftoff technology avoids problems of semiconductor surface etching, and is therefore preferred.

The implant isolation masking is an important step. Since high energy, high dose proton implant masking is required, the preferred embodiment uses a 1.6 micron layer of gold on top of a polyimide layer. This layer is patterned using a thick metal liftoff process. However, this implant mask could also be performed by subtractive processing using either wet or dry etches to define the implant mask. The liftoff process works quite well, and the metal thickness for the gold layer can even be increased to provide better implant masking. Better implant masking permits higher implant energies, which will result in a greater depth of penetration of the implant into the $N^-$ layer 36 and the N+ semiconductor layers. A thicker N+ layer can then be used, reducing the diode series resistance, as is described subsequently. Thicker metal on the implant mask for subtractive processing means longer etch times and possibly lateral etch problems if wet etches or isotropic dry etches are used for subtractive processing. Therefore, liftoff processing is preferred.

Although the final level interconnect metallization requires very thick layers of gold, subtractive etch processing may also be used for this metallization as opposed to the thick metal liftoff process currently used in the preferred embodiment of the process. The thick metal of this metallization is necessary to achieve low line series resistance. This resistance is currently 12 ohms in the preferred embodiment.

As geometries are scaled down to achieve higher performance levels, self-alignment techniques for the fabrication will become more important. Currently, the Schottky diode junction area and the ohmic contacts are formed using self-aligned process steps. In alternative embodiments, the spacing between the central metal conductor 24 and the ground plane conductors 26 may also be performed using self-aligned processes.

Finally, in the preferred embodiment, the N+ epitaxial layer 44 is formed at a thickness of 0.8 microns to keep the resistance of the current paths 58 and 60 in FIG. 10 to a minimum. Thicker layers for this epitaxial layer 44 may be used to further lower their resistance. However, for areas outside the diode isolation island, isolation implantation must be performed. Where thicker layers of epitaxial material 44 are used, higher energies for these isolation implants will be necessary. Alternatively, some etch step may be used to remove the epitaxial layers at regions outside the isolation islands. Preferably, this etch step should be self-aligned so as to not destroy the ohmic contacts 46 and 48.

It is also possible to use self-aligned gate techniques to align the Schottky junction area between the ohmic contacts when the dimensions of the structure are scaled to very small geometries. One possibility is to use refractory metal gates in a T shape. The bottom of the T then serves as the Schottky contact while the top of the T serves as an etch mask to define the positions of the inner edges of the contact windows for the ohmic contacts.

COPLANAR STRIP EMBODIMENT OF NONLINEAR TRANSMISSION LINE

Coplanar strip is an equivalent type of integrated transmission line useful for millimeter wavelength applications. The nonlinear transmission line depicted in FIGS. 9, 10 and 12–14 and the alternative embodiments thereof may also be fabricated using coplanar strip. Coplanar strip transmission line uses only two conductors integrated on a substrate. To fabricate a nonlinear transmission line useful for pulse fall time compression, two conductors are fabricated on top of a lightly doped epitaxially grown layer formed on top of a heavily doped epitaxially grown buried layer in a semiconductor substrate. Isolation islands for varactor diodes are then formed along the length of the coplanar strip transmission line by ion implantation. Varactor diodes are then fabricated in the isolation islands to load the transmission line at various points with junction capacitances that vary in capacitance with the voltage across the transmission line. The coplanar strip transmission line is fabricated with dimensions so as to have a characteristic impedance (without the presence of the diodes) which is greater than a desired characteristic impedance. The varactor diodes then add capacitance to the line to bring the overall characteristic impedance down to the desired level. Typically this desired level is 50 ohms, but it need not be. For example, the final characteristic impedance could be set at, say, 75 ohms for use internally in an instrument such as an oscilloscope, with 50 ohm impedance matching sections at the input and/or output to interface with industry standard 50 ohm circuits to which the instrument may be connected.

Figure 25:
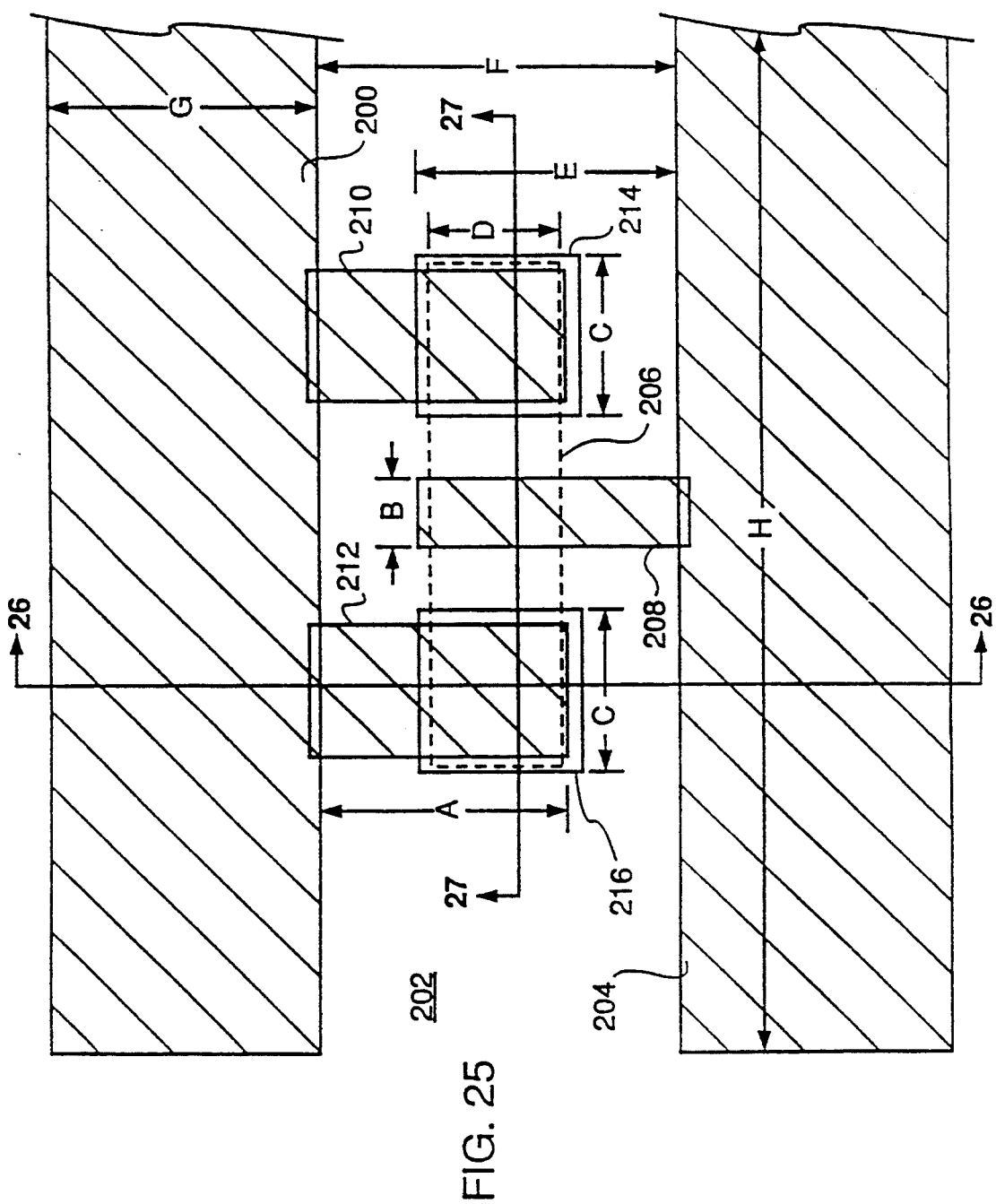
FIG. 25 is a plan view of one segment of an integrated CPS nonlinear transmission line according to the teachings of the parent cases.

Referring to FIG. 25, there is shown the preferred embodiment in plan view of one section of a coplanar strip nonlinear transmission line. Of course a coplanar nonlinear transmission line will be comprised of many such sections cascaded in series. Typically 100 sections such as are shown in FIG. 25 will be cascaded. Such an arrangement of 100 cascaded sections like that shown in FIG. 25 can provide compression of a 100 picosecond fall time to a fall time on the order of 3.5 picoseconds.

In FIG. 25, conductor 200 represents one of the two integrated conductors on the surface of the substrate 202 that forms the coplanar strip transmission line. Conductor 204 represents the other conductor of the coplanar strip transmission line. Dashed line 206 represents the outline of the active area for the varactor diode for the transmission line section shown in FIG. 25. All areas of the substrate outside the active area 206 are rendered nonconductive by ion implantation damage so as to create an isolation island for the diode.

A Schottky anode contact 208 for the varactor diode in the form of an extension of the metal of the coplanar strip conductor 204 extends out and away from the coplanar strip conductor 204 and over the diode active area 206. The Schottky diode anode contact 208 is fabricated of the same material and in the same manner as previously described herein. In the preferred embodiment, the anode contact metal 208 is comprised of gold lying over a titanium Schottky metal anode contact in contact with the substrate. A platinum diffusion barrier separates the gold of the conductor 208 from the underlying platinum Schottky metal. Any metal that will form a Schottky diode may be used in contact with the substrate.

Two cathode contacts 210 and 212 for the varactor diode are formed by extending the metal of the conductor 200 of the coplanar strip transmission line over two ohmic contacts 214 and 216 aligned over opposite ends of the diode active area. The ohmic contacts 214 and 216 are formed in the manner described above using the same ohmic contact alloy. As noted above, any ohmic contact alloy will work, but it is preferred to use an alloy that will create the lowest possible contact resistance. The metal of the cathode contacts 210 and 212 is gold as is the metal of the anode contact 208 and the coplanar strip contacts 200 and 204.

The various dimensions of the coplanar strip nonlinear transmission line element shown in FIG. 25 are marked by letters A through H. These dimensions are given below for the preferred embodiment having an overall the quantity equal to the characteristic impedance of the 50 ohms. Other dimensions may be selected for other desired impedance levels. The overall characteristic impedance of the transmission line is equal to the square root of per section transmission line induction divided by the per section capacitance. The per section capacitance is the combination of the voltage dependent diode junction capacitance and the parasitic capacitance of the transmission line itself. The overall characteristic impedance of the nonlinear transmission line can be raised by increasing the per section impedance by moving the two conductors 200 and 204 further apart. Generally, it is desirable to maintain as high a level as possible for the diode junction capacitance since it is this capacitance which causes the pulse fall time compression. Therefore, moving the conductors 200 and 204 further apart allows more diode junction capacitance to be used without increasing the characteristic impedance above the desired level. Generally, the desired level for this characteristic impedance is 50 ohms since this is an industry standard. The dimensions that follow are for a 50 ohm coplanar strip nonlinear transmission line: A=whatever dimension is needed for the cathode contact to reach from the edge of the coplanar strip conductor 200 to the far edge of the isolation island 206 where the isolation island is 19 microns in width and is centered between the conductors 200 and 204 of the coplanar strip; B=5 microns; C=10 microns; D=19 microns; E=23 microns; F=26 microns; G=20 microns; and H=166 microns. In FIG. 25, the boundaries of the cathode contacts, ohmic contacts and active areas are not shown coincident for clarity of explanation. In an actual device, the actual boundaries may be coincident, but generally the ohmic contact is made bigger than the cathode contact strip. The important thing is that good contact be made to minimize the diode series resistance. The dimensions given above result in a characteristic impedance for the coplanar strip transmission line (absent the diodes) of approximately 100 ohms. When the diodes are added to load the transmission line, the characteristic impedance is brought down to approximately 50 ohms.

Further, in the preferred embodiment, two different sizes of coplanar strip nonlinear transmission line cells or segments are used. This is because a higher bandwidth for the segments nearest the far end of the nonlinear transmission line is desirable since the signals propagating along the line at the far end have had their fall times compressed and consequently have greater bandwidth. The exact point along the line at which to switch from the larger size cells to the smaller size cells is not known exactly but can be experimentally determined as that point where maximum compression occurs. The point is thought to lie somewhere between 60 and 70 diodes from the input end of the coplanar strip nonlinear transmission line input.

The dimensions for the smaller size cells used near the output end of the coplanar strip nonlinear transmission line are: A=17.5 microns; B=5 microns; C=10 microns; D=9.5 microns; E=18 microns; F=25 microns; G=20 microns; and H=83 microns. These smaller size cells are slightly more lossy than the larger cells, but have twice as high a periodic cutoff frequency (the cutoff frequency related to the product of the series inductance of the transmission line times the total capacitance of the waveguide and the diodes) because the junction area of the diode junction is smaller thereby making the junction capacitance smaller. Thus the impedance of the junction capacitance presented to the higher frequency fourier components near the output end of the coplanar strip nonlinear transmission line is higher thereby yielding a higher cutoff frequency. Of course, in many embodiments, the maximization of performance obtained by changing cell sizes near the end of the transmission line is not necessary, and the same size cells may be used throughout the length of the line.

The dimensions given above are of course not the only dimensions which can be used. Many other combinations of dimensions exist which will still yield a device of acceptable performance characteristics for many different applications. Of course, the application itself and the frequency range of interest and the desired compression levels also play a part the dimensions selected.

Figure 26:
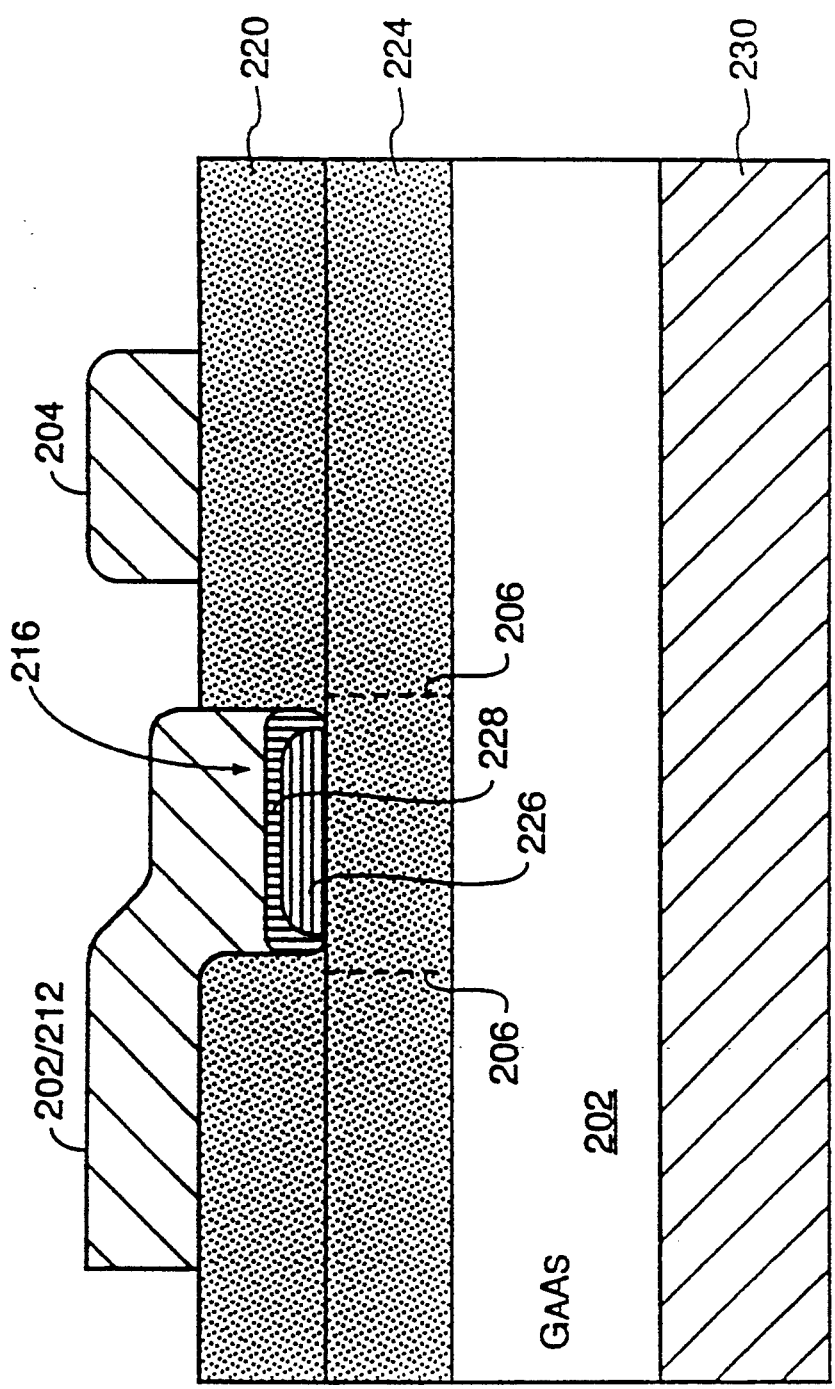
FIG. 26 is a cross-sectional view through the cathode contact and active area of a Schottky barrier varactor diode of a CPS nonlinear transmission line according to the teachings of the parent cases.

Referring to FIG. 26, there is shown a cross-sectional view of the coplanar strip nonlinear transmission line segment of FIG. 25 taken along section line 26-26' in FIG. 25. The view of FIG. 26 basically shows a section through the ohmic cathode contact. The metal of the coplanar strip conductor 200 and the extension forming the cathode contact 212 lies atop an N-doped epitaxially grown layer 220 of gallium arsenide on the gallium arsenide substrate 202. The N− epitaxial layer 220 lies atop a heavily doped N+ buried layer 224 of epitaxially grown gallium arsenide. Basically, the N− epitaxial layer 220 is etched to expose the N+ buried layer and ohmic contact alloy is evaporated and lifted off using the same photoresist used as the etch mask. Any low resistance ohmic contact can be used. The ohmic contact 216 is shown symbolically in FIG. 26 as including a layer 226 of ohmic alloy and a diffusion barrier 228. After the evaporation steps and liftoff, the ohmic alloy is alloyed a t 450 degrees centigrade to cause the ohmic alloy metals to make good electrical contact with the buried layer 224 as symbolized by the vertical lines extending into the buried layer 224 from the ohmic metal layer 226. The doping of the buried layer 224 should be as heavy as possible to keep the series resistance of the diode as low as possible. In the preferred embodiment, the N+ buried layer is doped to $3 \times 10^{18}$ atoms/cm$^3$.

The other conductor 204 of the coplanar strip lies on top of the N− doped epitaxially grown layer as shown.

Coplanar strip transmission line, having two conductors, has only two modes of propagation. The unbalanced mode is where both conductors have the same voltage and the same polarity at all points along the line. The balanced mode is where the two conductors have opposite polarity and the same voltage all along the line. Not much loss is suffered in the balanced mode because the electric field lines only go from one conductor to the other and do not extend very far into space. This is the desired mode since it is the lowest loss mode of propagation. The unbalanced mode is an undesirable mode however because the electric field lines from the two conductors are additive and extend far into the surrounding space looking for a ground plane. When this occurs, losses are experienced. To suppress this mode of propagation, a lossy material 230 may be placed beneath the substrate or surrounding the substrate 202. This lossy material may be silicone rubber with ferrite particles embedded therein. In some embodiments, the lossy material layer 230 may be comprised of two layers: a first layer of conductive foam, and a second layer of lossy material such as the silicone rubber with embedded ferrite particles. Another acceptable lossy material is called Polyiron ™ (marketed by Emerson & Cuming) which is a ceramic material loaded with ferrite. Use of this lossy material is important in any application where a ground plane is to be located near the integrated coplanar strip nonlinear transmission line. If a ground plane is to be located nearby, the lossy material should be placed between the integrated coplanar strip nonlinear transmission line and the ground plane. Any structure to do this will suffice. In practical embodiments, the presence of this lossy material is almost always necessary because the housing used to protect the device and shield the external world is usually metal and constitutes a ground plane. Because the coplanar strip nonlinear transmission line constitutes so many segments, it is generally wound into a serpentine arrangement to keep the package size small. The corners of this serpentine structure and any other changes in the transmission line act as discontinuities to couple all the higher and lower order modes of propagation. Without the presence of the lossy material, each discontinuity can feed power into the unbalanced mode and cause undesirable losses. It is common practice to place the lossy material beneath the substrate.

Figure 27:
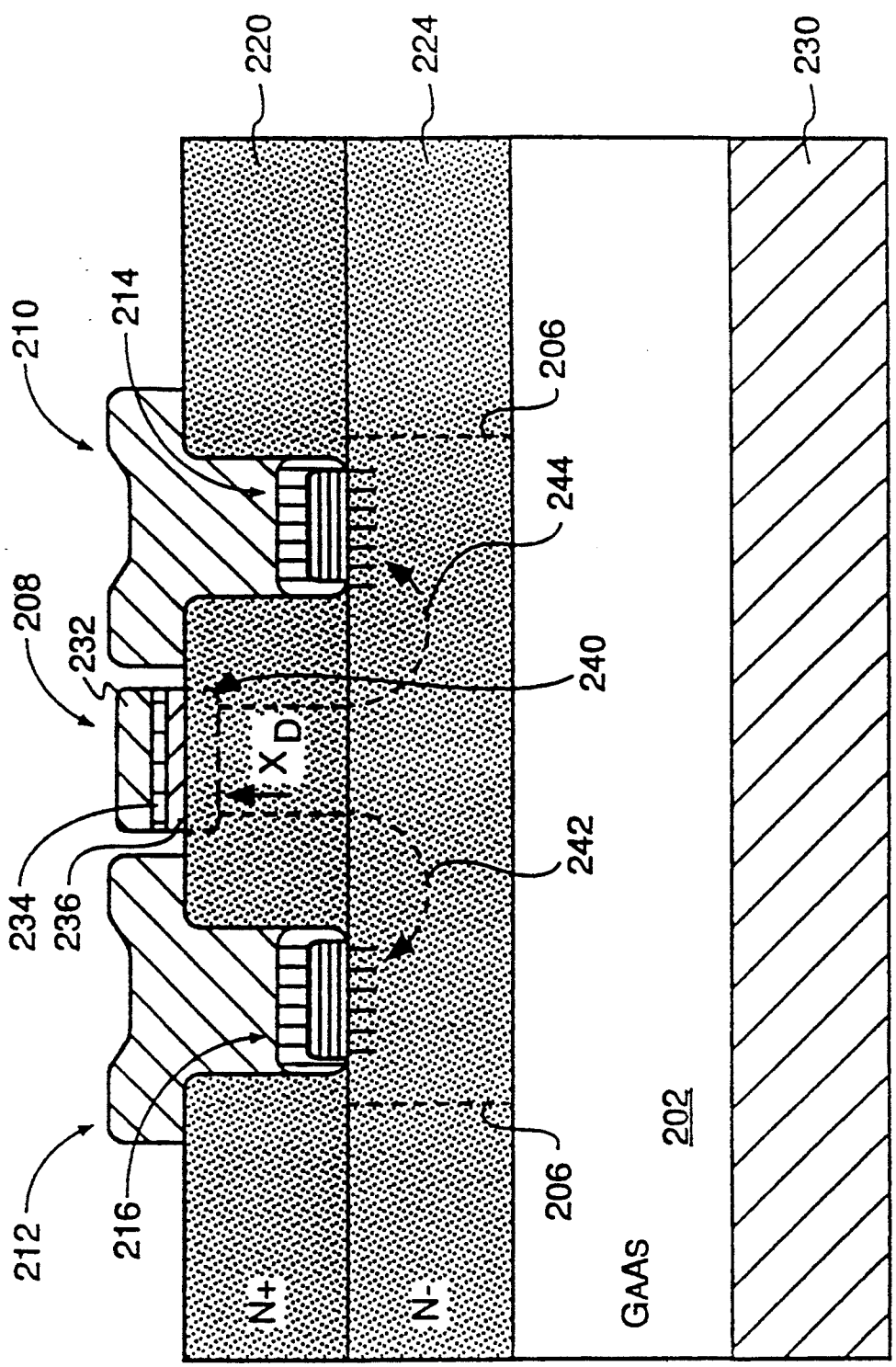
FIG. 27 is a cross-sectional view through both anode and cathode contacts of the Schottky barrier varactor diodes of the nonlinear transmission line according to the teachings of the parent cases.

Referring to FIG. 27, there is shown a cross-sectional view of the coplanar strip nonlinear transmission line taken through the active area of diode area along section line 27-27' in FIG. 25. Dashed lines 206 in FIGS. 26 and 27 outline the extent of the active area. The metal of the cathode contacts 212 and 210 overlie ohmic contacts 214 and 216. The metal of the anode contact 208 is comprised of gold layer overlying diffusion barrier 234 which overlies Schottky metal 236. The distance between the anode contact 208 and each of the cathode contacts 210 and 212 is the minimum distance allowed under the design rules used to fabricate the structure so as to minimize the series resistance of the diode. It is important to keep the diode series resistance small and the structure compact so as to keep parasitic capacitance and inductance from adversely affecting the diode cutoff frequency. If the diode cutoff frequency is not kept high, the cutoff frequency can limit the smallest pulse width or edge transition which can be faithfully propagated down the line. The presence of the heavily doped buried layer 224 coupled with the use of the smallest possible distance between the anode and cathode contacts helps keep the series resistance of the diode down. Another factor which helps to keep the series resistance down is to optimize the depth of the N− layer 220 so as to be approximately as thick as the maximum depth of penetration of the depletion layer 240 under the anode contact. This minimizes the length of the portion of the current paths 242 and 244 which lie in the lightly doped N− epitaxial layer 220. The use of Schottky contacts for the anode and ohmic contacts for the cathode also help to decrease the series resistance of the diode. Also, the use of isolated islands for the diodes as opposed to continuous junctions reduces the capacitance per unit length of the transmission line. If a continuous junction were used, the value of the capacitance per unit length would be so high as to render it impossible to achieve a characteristic impedance for the nonlinear transmission line greater than a few ohms. This would cause massive attenuation and reflection of power at the input to such a nonlinear transmission line because of the gross impedance mismatch between the outside world at 50 ohms and the continuous junction nonlinear transmission line operating at a characteristic impedance of only a few ohms.

Figure 28:
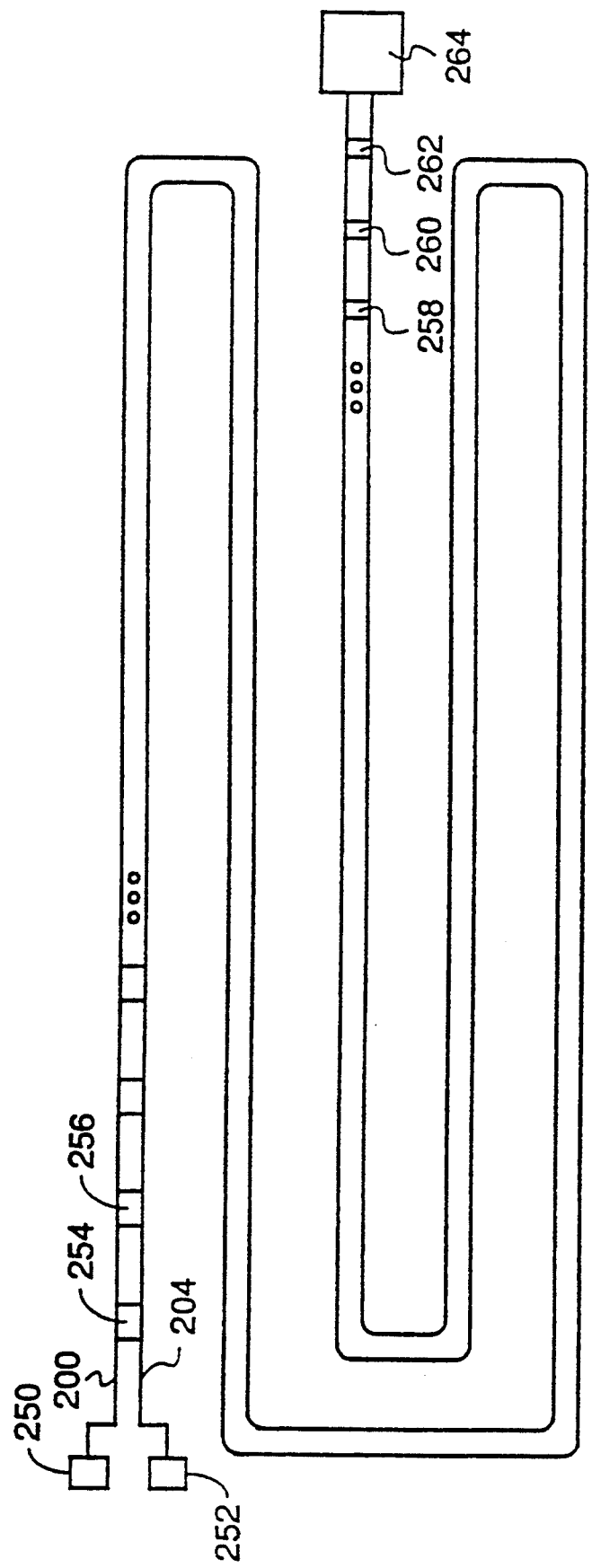
FIG. 28 is a plan view of the serpentine structure of a CPS nonlinear transmission line showing the use of both larger and smaller cells in the same line according to the teachings of the parent cases.

Referring to FIG. 28, there is shown a plan view of the coplanar strip nonlinear transmission line using two different size segments. The input consists of contact pads 250 and 252 each of which is coupled to one of the conductors 200 and 204. The first varactor diode segment 254 has the structure shown in FIGS. 25 through 27. The second diode segment 256 has the same structure as the diode segment 254. The center-to-center spacing of the diode segments 254 and 256 is 166 microns in the preferred embodiment. This structure is repeated for 60 to 90 diode cells, and probably somewhere between 60 and 70 diodes. The last 10 or so diode segments have the smaller junction area and segment length given above. Diode segments 258, 260 and 262 are typical of these smaller cells with higher cutoff frequency. Each of the smaller diode segments also has the structure shown in FIGS. 25 through 27 except with the smaller dimensions.

Box 264 represents the output of the coplanar strip nonlinear transmission line, and may be a sampler structure to be described next.

Figure 29:
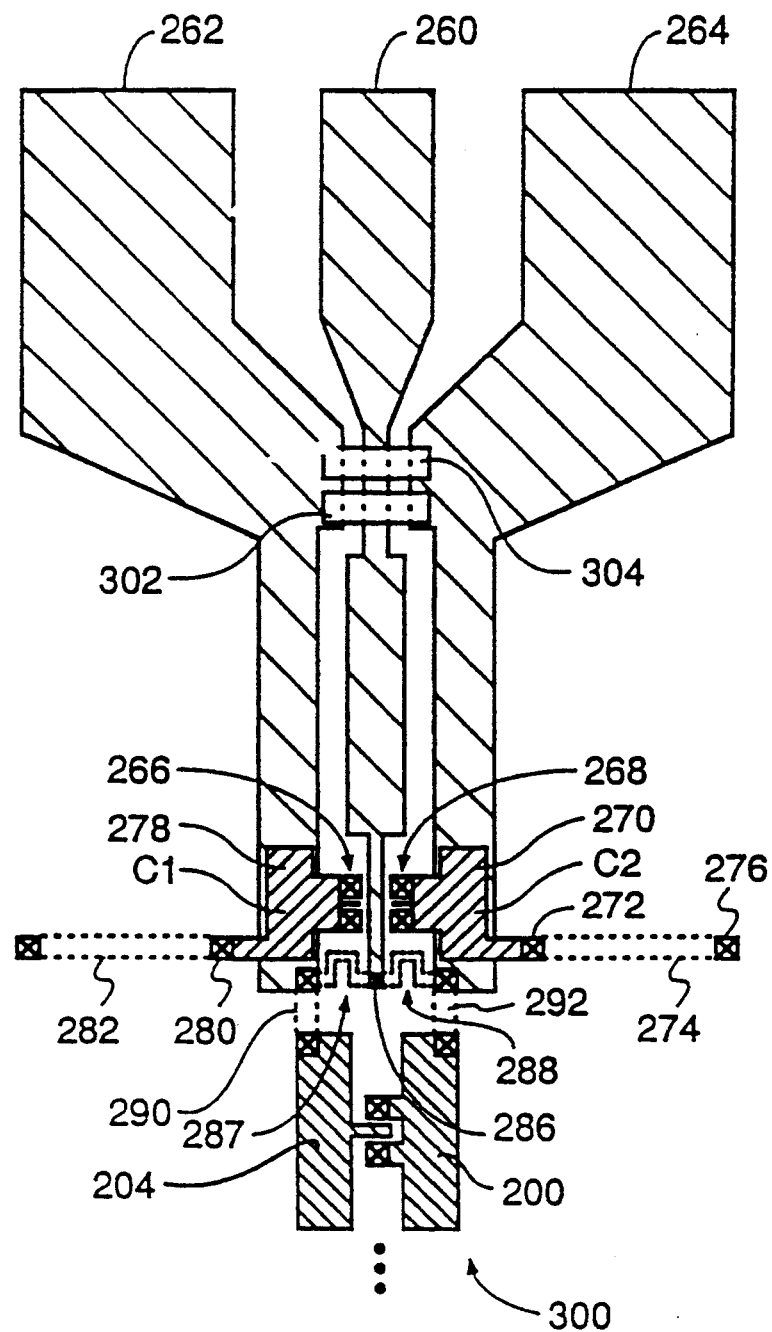
FIG. 29 is a plan view of an equivalent time sampler using CPS nonlinear transmission line for sample pulse generation according to the teachings of the parent cases.

Referring to FIG. 29, there is shown a plan view of a sampler structure for equivalent time sampling using a coplanar strip nonlinear transmission line to compress the local oscillator pulses. Radio frequency signals to be sampled are coupled into the center conductor 260 and ground plane conductors 262 and 264 of a coplanar waveguide transmission line. The center conductor 260 is coupled to the anode of a sampling diode 266 and to the cathode of a sampling diode 268 by two ohmic contacts shown in FIG. 29 as two boxes with x's therein. The two sampling diodes 266 and 268 have the same structure as the diode structure shown in FIGS. 25 through 27. That is, there is an isolated island in a buried layer under each of the anode contacts which are shown as single lines extending between the boxes representing the ohmic contacts. The anode of diode 266 extends left from the center conductor 260 and the anode of diode 268 extends left from the metal of the top plate 270 of a capacitor C2 comprised of top plate 270 and the ground plane conductor 264. The capacitor C2 in FIG. 29 has the same circuit connections and the same function as the capacitor C2 in FIG. 1. The top plate 270 of the capacitor C2 is also coupled via an air bridge and an ohmic contact 272 and a buried layer resistor 274 to an intermediate frequency output port 276 which is an ohmic contact to the buried layer resistor. The resistor 274 is a conductive path through the buried layer surrounded by a field of ion implant damage and is fabricated by masking off a portion of the buried layer (not shown) during the ion implantation for isolation of the diode islands.

The top plate 270 of the capacitor C2 is separated from the ground plane conductor 264 by a layer of insulating material such as nitride.

The cathode of the diode 266 is coupled by two ohmic contacts to the top plate 278 of a capacitor C1. The bottom plate of this capacitor is ground plane conductor 262 and is separated from the top plate 278 by a layer of nitride. The top plate 278 of capacitor C1 is also coupled by an air bridge and an ohmic contact 280 and a buried layer resistor 282 to another intermediate frequency output 284.

The resistors 282 and 274 are each 500 ohms in the preferred embodiment and serve to provide isolation between the RF and IF circuits.

The center conductor 260 of the coplanar waveguide transmission line is coupled by an ohmic contact 287 to one end of each of two 100 ohm buried layer resistors 286 and 288. Each of these buried layer resistors connects the center conductor 260 to one of the two ground plane conductors 262 or 264. The paths of these serpentine buried layer resistors 286 and 288 are shown by dashed lines as are the paths of the other buried layer resistors in the sampler structure. The two 100 ohm buried layer resistors 286 and 288 are seen by the RF signal coplanar waveguide transmission line as a single 50 ohm termination.

Each of the ground plane conductors 262 and 264 are coupled by 20 ohm buried layer resistors 290 and 292, respectively, to the two conductors 204 and 200, respectively, of a coplanar strip nonlinear transmission line 300 of which only the last diode segment is shown. The purpose of the coplanar strip nonlinear transmission line 300 is to receive local oscillator strobe pulses and compress the fall times thereof for use in sampling the RF. The sampling pulses arriving from the nonlinear transmission line 300 turn on the sampling diodes 266 and 268 momentarily as they propagate past these diodes. The sampling pulses continue to propagate up the ground plane conductors 262 and 264 until they encounter a short therebetween caused by air bridges 302 and 304. At this short, the sampling pulses are reflected and propagate back toward the sampling diodes 262 and 264. When the sampling pulses again arrive at the sampling diodes 266 and 268, these diodes are turned off and the sample is complete. The manner in which the sampling bridge derives the intermediate frequency output signal has been described earlier herein and this discussion generally applies to the embodiment of FIG. 29 and will not be repeated here. The details of the structure of the sampling diodes, capacitors, air bridges and buried layer resistors are also described above in connection with the discussion of FIGS. 5, 6 and 7 and will not be repeated here.

The best mode of fabricating the nonlinear transmission lines disclosed in FIGS. 1–29 herein may be through use of a hyperabrupt doping profile There is some debate among experts about this since hyperabrupt diodes have a lower RC cutoff frequency than can be achieved with other diodes because of higher series resistance. A description of hyperabrupt-doped coplanar waveguide nonlinear transmission lines is found in Madden et al., "Hyperabrupt-doped GaAs Nonlinear Transmission Line for Picosecond Shock Wave Generation", Apple. Phys. Left 54 (11) Mar. 13, 1989 and Madden et al., "Generation of 3.5 ps Fall-Time Shock Waves on a Monolithic GAs Nonlinear Transmission Line", A Electron Device Letters, Vol. 9, No. 6 (June 1988) both of which papers are hereby incorporated by reference. Hyperabrupt doping provides the same fall time compression in half the length thereby decreasing the insertion loss. For a periodic line cutoff frequency of 500 GHz and a diode cutoff frequency of 3.8 THz, surface doping of $3.3 \times 10^{17}/cm^3$ and exponential doping decay constant of 0.175 microns (See the Equation for doping profile above Equation 3 of the Madden et al. paper in Applied Physics Letters) and a junction capacitance of 20 femptofarads may be used.

The advantages of using coplanar strip for a nonlinear transmission line are several. First, for a given level of impedance per unit length, coplanar strip is more compact than coplanar waveguide. The reason for this is that to get a sufficiently high impedance of around 90 to 100 ohms for the transmission line absent the diodes, in coplanar waveguide (CPW) the ground plane conductors must be spread out very far from the center conductor. The reason for this is that to keep the series resistance of the center conductor of the coplanar waveguide down to tolerable levels, the center conductor must be made at least a few microns wide. Because the characteristic impedance of the transmission line depends upon the ratio of the width of the center conductor to the separation between the groundplanes, the separation between the groundplanes must be quite large to achieve a 90 to 100 ohm characteristic impedance for the CPW line absent the diodes. This high level of impedance is necessary so that when the diodes are added, the predominantly capacitive reactance added thereby creates an overall characteristic impedance for the periodically loaded CPW transmission line of approximately 50 ohms. Because of the structure of coplanar strip (CPS) transmission line, a high level of impedance of 100 ohms (absent the diodes) can easily be achieved with two conductors 20 microns wide and 26 microns apart. This is a much smaller structure than a CPW line of the same impedance.

Smaller integrated structures have two alternative advantages: 1) more circuitry can be put on the same size die, or 2) a smaller die can be used for the same amount of circuitry thereby increasing production yield.

A second advantage of a CPS nonlinear transmission line over a CPW nonlinear transmission line is lower insertion loss. In CPW, the center conductor width must be made fairly narrow to prevent the need to put the ground plane conductors extremely far away to achieve an acceptably high level of impedance. If 90–100 ohms characteristic impedance before the diodes are added is not achieved, the overall characteristic impedance of the CPW line after the diodes are added will be substantially below 50 ohms. This will cause very serious loss of efficiency in coupling such a line to a 50 ohm source since very little power will be coupled into the line and substantially all the power will be reflected back into the source.

This need to keep the center conductor width relatively small, inherently causes the series resistance of CPW transmission line to be higher than CPS transmission line of the same characteristic impedance. This higher series resistance for CPW versus CPS means that higher insertion loss will be suffered using 50 ohm CPW than for 50 ohm CPS.

NONLINEAR IMPEDANCE TRANSFORMER

Figure 30:
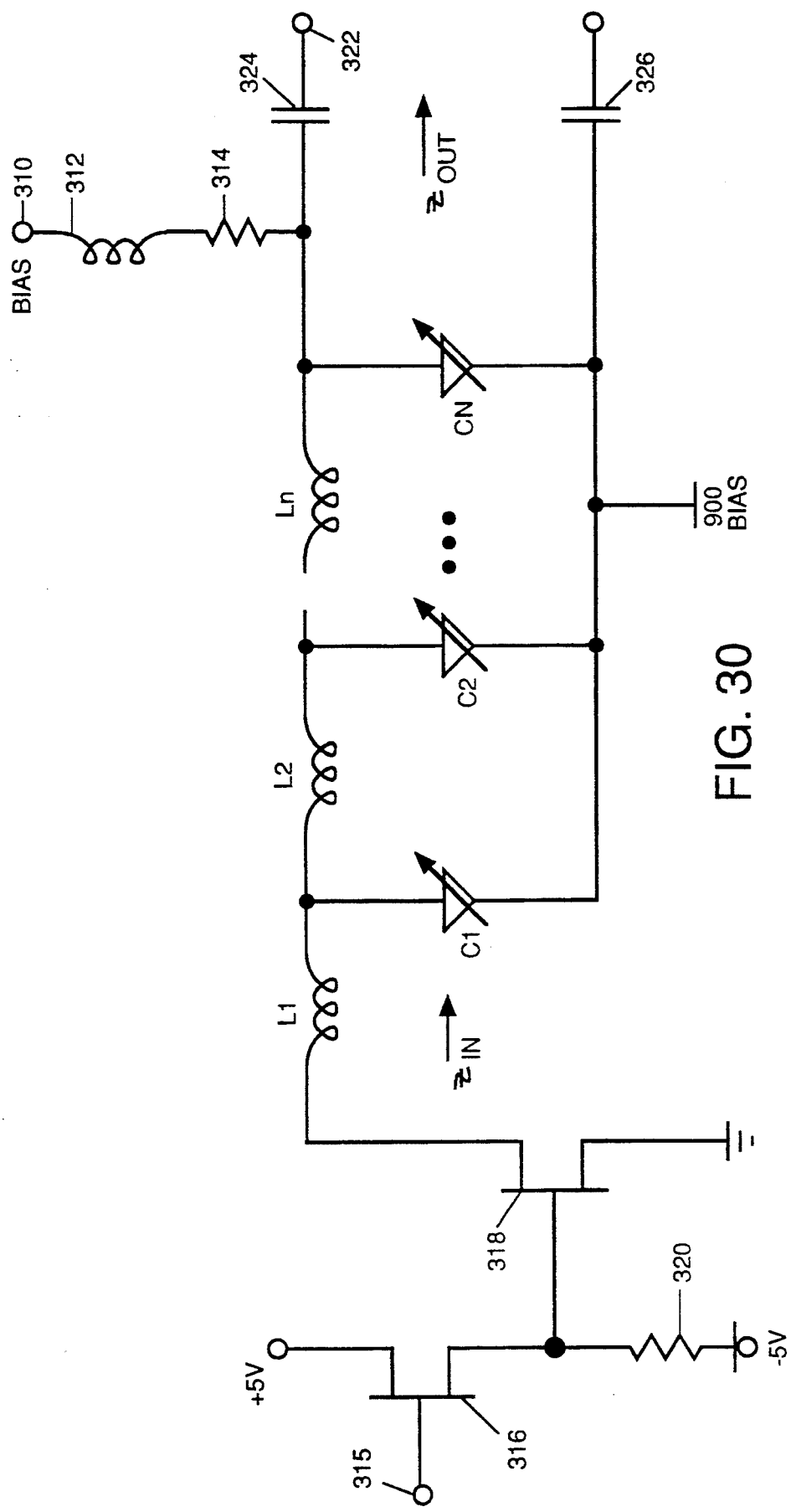
FIG. 30 is a schematic diagram of a nonlinear impedance transformer according to the teachings of the invention.

Referring to FIG. 30, there is shown a schematic diagram of an FET driven nonlinear impedance transformer. The device is comprised of n L-C sections each comprised of a series inductor and a shunt voltage dependent capacitor in the form of a reverse biased semiconductor diode or diode connected transistor. The input L-C section is comprised of series inductor L1 and shunt capacitor C1 and the second L-C section is comprised of inductor L2 and shunt capacitor C2. The output L-C section is comprised of inductor Ln and shunt capacitor Cn. Together these L-C sections coupled in series comprise a synthetic nonlinear transmission line. The voltage dependent nature of the capacitance of the diodes causes the group velocity of signals propagating down the line from the input section toward the output section to be voltage dependent. This causes compression of signal edge fall times by the formations of shock waves as explained earlier herein.

In FIG. 30, these voltage dependent capacitors are depicted as varactor diodes. In the preferred embodiment, the capacitors C1, C2, ... Cn are reverse biased, abrupt doped, planar integrated Schottky diodes in the form of diode connected FET's integrated on a gallium arsenide substrate. In the preferred embodiment, the inductors L1 ... Ln are spiral planar inductors integrated on the same substrate with the diodes for the sections close to the input and are coplanar strip sections for later sections. The dividing line occurs at the section where the new, compressed fall time is approximately 30–40 picoseconds. The reason for this is that for the travelling wave in the later sections, the fall time is steeper and the high frequency Fourier components are beginning to dominate. This means that this energy needs to be coupled into waveguide to prevent radiation losses. In other words as the wavelength of the high frequency component becomes 20 or less times the physical size of the inductor, the inductor essentially becomes an antenna causes radiation losses. Therefore, waveguide and guided modes are used for the later sections of the NIT.

The impedance and delay per section are logarithmically scaled. The scaling of the impedance is given by Equation (6) below. The scaling of the L-C section delay is given by Equation (20) below. Linear scaling could also be used but it is not as good for reasons explained below. In such embodiments, the difference between the output impedance and the input impedance would be divided by the number of sections to derive a delta section factor, and each section would be designed to have an impedance higher (or lower depending upon the desired transformation) than the previous section by the delta section scaling factor. Logarithmic scaling is preferred, because it makes the impedance for each section a constant ratio which provides better matching with the loss properties of the transmission line itself thereby improving power transfer. The loss is logarithmic along the line. By the keeping the ratio of impedance change per section to the ratio of loss per section a constant, the voltage along the line has a steady smooth growth. Therefore, the travelling wave does not see rapid, abrupt discontinuities in impedance or loss at section boundaries. This avoids reflections at section boundaries and prevents unpredictable loss mechanisms in the diodes from occurring which might otherwise occur if the voltage of the travelling waveform were varying substantially from section to section as might be the case for scaling factors in impedance other than logarithmic. An example of such unpredictable loss mechanism is diode leakage associated with voltages near the breakdown voltage.

In other embodiments other devices such as uniform doped or hyperabrupt doped Schottky diodes, regular PN diodes if silicon or SOS substrates are used, diode connected transistors or diode connected field effect transistors (FET) may be used so long as the junction capacitance is voltage dependent or the depletion zone width varies with voltage. The nonlinear impedance transformer could be done on silicon substrates with airbridge inductors and diode connected FET's, regular PN diodes or Schottky varactors of either the abrupt or hyperabrupt doped variety- Silicon on sapphire substrates can also be used.

In FIG. 30, FET 316 is a source follower when coupled with resistor 320. This input receives a pulse such as a digital square wave periodic waveform. The source follower buffers the input port 315. The FET 318 amplifies and drives the nonlinear impedance transformer (hereafter NIT). The FET 318 must be designed to drive the NIT with 5 volt peak-to-peak signal, 150 picosecond fall time signal, a fall time easily achievable by present day commercial GaAs FET's. The input signal fall time to the amplifier itself can be slow. How slow it can be is determined by the amplifier design. It will be understood by those skilled in the art that whenever reference is made herein to "fall time" that rise times may also be compressed by switching the polarity of the varactor diodes.

At the output end 322 of the NIT, the output impedance of the last section comprised of inductor Ln and varactor Cn is preferably equal to the input impedance of the load. The varactor diodes are biased by application of a D.C. bias voltage to port 310. Inductor 312 is an RF choke which prevents escape of the RF components of the output pulse through the bias port. A current limiting resistor 314 prevents excessive bias current from flowing through the diodes. Capacitors 324 and 326 are DC blocking capacitors. The embodiment of FIG. 30 is a single ended embodiment whereas double-ended, i.e., differential, embodiments are also possible as described below.

Hyperabrupt and abrupt doped diodes exhibit a capacitance variation with voltage V as given by Equation (5) below $$C_k(V) = \frac{C_k(0)}{\left(1 + \frac{V}{V_0}\right)^a} \quad (5)$$

for some constant a where $C_k(V)$ is the capacitance at voltage V, $C_k(0)$ is the junction capacitance of the diode at zero bias, and $V_0$ is the diode turn on voltage. In the preferred embodiment, a is generally high, but it must be chosen in concert with the RC cutoff frequency of the diode to achieve optimum NIT performance.

The diodes are held in slight forward D.C. bias through a bias voltage applied at a bias input port 310 such that the RF transition occurs from slight forward conduction to strong reverse bias. The high frequency components are blocked from escaping through the bias port by an RF choke inductor 312. Bias current is limited by a current limiting resistor 314.

When the diodes are switched to a reverse biased state, there is a junction capacitance which is dependent upon the width of the depletion area at the junction. This depletion width varies with the instantaneous voltage applied to the diode by the signal propagating down the transmission line.

Scaling of the characteristic impedance of each L-C section of the transmission line is done to implement the nonlinear impedance transformer functions according to the teachings of the invention. The scaling factor is logarithmic in the preferred embodiment, although in other embodiments, other scaling factors can be used. The scaling of the characteristic impedance of each said L-C section conforms approximately to the following relationship:

$$\sqrt{\frac{L_i}{C_{Di}}} = Z_{input} * \left[\sqrt[n]{\frac{Z_{output}}{Z_{input}}}\right]^{(i-1)} \quad (6)$$

where $L_i$=the inductance of the ith section, and, $C_{Di}$=the depletion zone voltage dependent capacitance of the voltage dependent capacitor in the ith section, and is equal to and later herein also referred to as the large signal diode capacitance $C_{ls}$ (also referred to as the transition capacitance in Equation A to J above and, $Z_{input}$=the input impedance of the first L-C section and, $Z_{output}$=the output impedance of the last section, and wherein the synthetic transmission line is comprised of n sections and the $i^{th}$ power is a power equal to the number of the section having inductance $L_i$.

Scaling of the delay factor of each L-C section is also done. The delay factor for each section is given by Equation (7) below.

$$\text{Delay Factor per section} = \tau_i = \sqrt{L_i C_{Di}} \quad (7)$$

where $L_i$ is the inductance per section and $C_i$ is the capacitance per section and $\tau_i$ is the delay per section.

Compression factor is the approximate change in fall time through the ith section. It represents the value of the fall time before the ith section divided by the fall time at the output of the ith section. Compression factor is related to a phenomenon called "catching the boat". When a NIT is designed properly so as to maximize the compression per section or over its overall length, it is said to have "caught the boat". If the compression factor is too aggressive, i.e., the attempted compression per section is too great for a given diode (the compression factor is closely linked to the nonlinear response of the diode), then subsequent compression will not be optimized and will no longer conform to the Equation (8) below.

$$\frac{\tau_{input}}{\tau_{out}} = \text{compression factor}^n = CF^n \quad (8)$$

or, more accurately:

$$\frac{\tau_{input}}{\tau_{out}} = CF_1 * CF_2 * CF_3 \ldots CF_n \quad (9)$$

where each section may have a slightly different compression factor. In many cases, however, CF may be treated as constant.

The compression factor CF in terms of the capacitances that characterize the line may be estimated using the following rules. Choose the input fall time according to Equation (10A) below:

$$\tau_{input} = 2\sqrt{LC_{ls}} \quad (10A)$$

where $C_{ls}$ is the large signal diode transition capacitance referred to in Equation A above. This is the point where the input rise time begins to match the L-C filter dispersion yielding the most possible compression for a given stage. In this case the compression factor is approximately given by Equation (10B) below:

$$CF = \frac{2 * \sqrt{C_{ls}}}{[2 * \sqrt{C_{ls}} - (\sqrt{C_{max}} - \sqrt{C_{min}})]} \quad (10B)$$

where $C_{max}$ is approximately equal to $(a+1) * C_k(0)$ and $C_{min}$ is dependent upon the doping profile and the peak to peak RF voltage on the NIT. A typical value for Cmin is 0.3 to 0.5 times the zero bias depletion capacitance, i.e., $C_k(0)$. Both $C_{min}$ and $C_{max}$ may be extracted from the C-V curves for the diodes used.

A rule of thumb for abrupt diodes is that $C_{ls}$ is approximately equal to the zero bias depletion capacitance, $C_k(0)$.

The design process to determine the inductance per section and diode area per section is as follows. The independent variables are the input impedance $Z_{in}$, the output impedance $Z_{out}$ and the fall time$_{in}$ and fall time$_{out}$. From those variables, the designer needs to determine the number of sections required for this amount of compression, and the values of the inductor $L_i$ and $C_i$ for i=1 to n, i.e., for each section on the line. The number of sections is chosen first by picking the type of diodes to be used. Each type of diode and doping profile has a slightly different compression factor. In the case of an abrupt junction diode, the compression factor is approximately 1.3 including dispersion effects of the L-C section, but not due to the RC cutoff of the diodes.

The minimum number of sections needed is given by Equation (11) below by solving for n.

$$n = \text{number of sections} = \frac{\ln\left(\frac{\tau_{input}}{\tau_{output}}\right)}{\ln(CF)} \quad (11)$$

Next, the impedance transform factor X which is the ratio of impedances between two successive sections, i.e.,
the impedance of section i+1 over the impedance of section i. The impedance transform factor is given by Equation (12) below.

$$X = \sqrt[n]{\frac{Z_{output}}{Z_{input}}} \quad (12)$$

Next, the inductance and capacitance for the first section is calculated using Equations (13) and (14) below.

$$L_1 = .5 Z_{source} \tau_{input} \quad (13)$$

and $$C_1 = .5 \left(\frac{\tau_{input}}{Z_{source}}\right) \quad (14)$$

Next, the values of L and C for the remaining sections are calculated using Equations (15) and (16) below.

$$L_i = \frac{L_1 * X^i}{CF^i} \quad (15)$$

and $$C_i = \frac{C_1}{X^i * CF^i} \quad (16)$$

Those skilled in the art will appreciate that the compression factor CF can vary from section to section because of dispersion caused by the RC cutoff of the diodes becoming significant in later sections with faster fall times. The compression factor can also vary in later sections because of waveguide dispersion. In the most optimum design case, CF will be varied in a logarithmic fashion from input to output.

The above given design process is a simple illustration of how to design a NIT for some system requiring a fast fall time but only having a slower input fall time signal available. Thus, the stringent fall time/slew rate requirements at the input of a constant impedance nonlinear transmission line to "catch the boat" are eliminated. "Catch the boat" refers to the concept of designing the nonlinear impedance transformer so as to maximize the compression without being so aggressive in the impedance or delay change per section as to cause reflections at the boundaries thereby possibly causing the formation of solitons or failing to further compress the fall time of the travelling wave.

Figure 34:
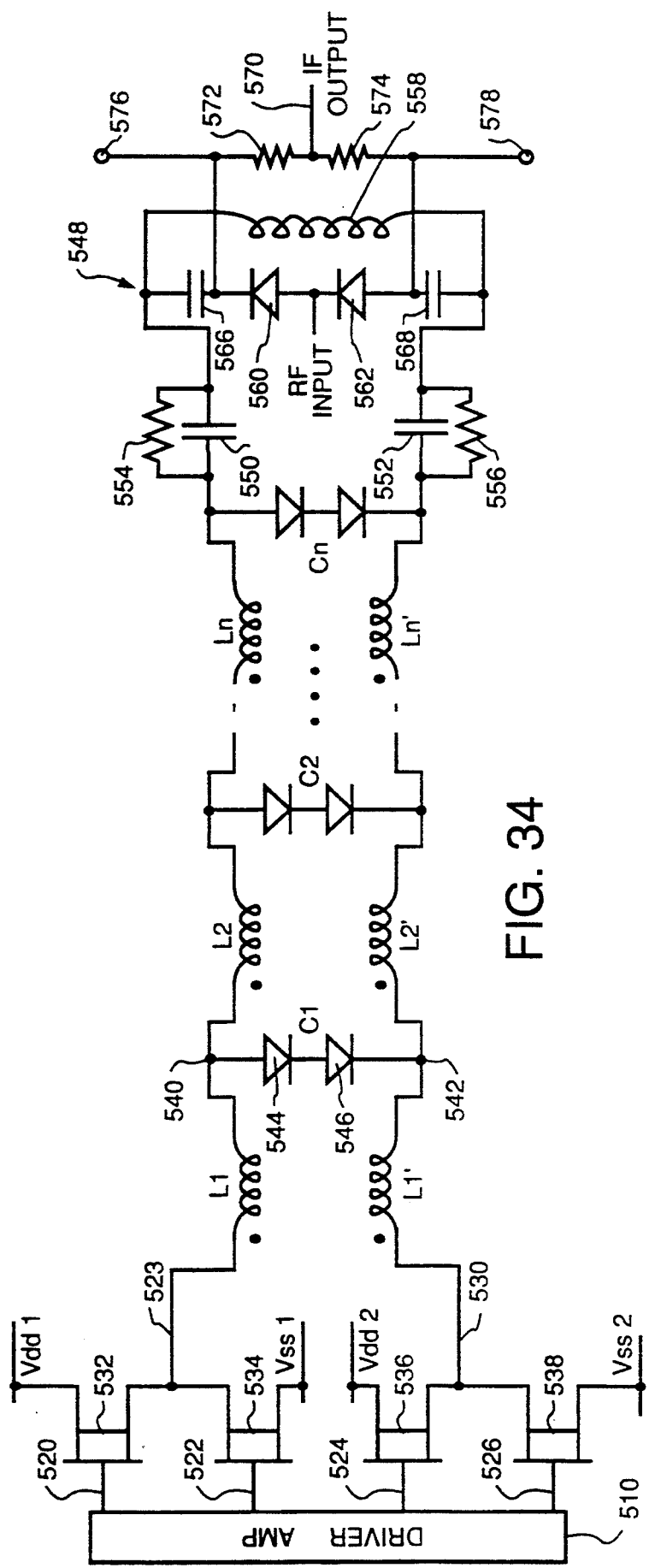
FIG. 34 is a schematic drawing of the preferred embodiment of the nonlinear impedance transformer.

Referring to FIG. 34, there is shown the preferred embodiment of a monolithic local oscillator driver driving a NIT which in turn drives a sampler/mixer circuit on a single planar MMIC. The driver amplifier 510 typically is an integrated, planar gallium arsenide FET amplifier which amplifies the square wave periodic signal received from a local oscillator source. The signals on line 520 and 522 are square wave periodic signals which are 180 degrees out of phase as are the signals on lines 524 and 526. The signals on lines 522 and 524 are in phase. The signals on lines 528 and 530 are out of phase periodic square wave digital signals typically, and are derived from totem pole driver circuits operating from separate DC supplies. These totem pole drivers are comprised of FET's 532 and 534 for line 528, and 536 and 538 for line 530.

Typically, the inductors for each section are wound together to give each more inductance because they couple to each other. This allows smaller inductors to be made. The first section inductors $L_1$ and $L^{1'}$ are equal and the total inductance per section is $$L_t = L_1 + L'_1 \quad (17)$$

for the uncoupled case where the inductors are not wound together. For the coupled case where the inductors are wound together, the total inductance per section is:

$$L_t = (K+1) * (L_1 + L'_1) \quad (18)$$

where k is the coupling constant between the two inductors.

The impedance per section for the embodiment of FIG. 34 is then $$Z_i = \sqrt{\frac{L_{ti}}{C_{ti}}} \qquad (19)$$

where
$C_{ti}$=the total capacitance per section which is ½ the diode capacitance.

The delay factor scaling per section is given by Equation (20) below.

$$\sqrt{L_i * C_i} = \frac{\sqrt{L_{i-1} * C_{i-1}}}{CF_i} \qquad (20)$$

where $CF_i$ is determined empirically to achieve maximum compression per section, and where
$L_i$=the inductance of the ith section inductor, and
$C_i$=the large signal capacitance of the ith section, and
$L_{i-1}$=the inductance of the section previous to the ith section, and
$C_{i-1}$=the large signal capacitance of the section previous to the ith section.

The voltages of the power supplies Vdd1, Vss1, Vdd2 and Vss2 are selected to properly bias the diodes on the line for the two possible states of the input signals on the line 528 and 530. That is, the two possible states of the signals on line 528 and 530 cause the voltage drop from the node 540 to the node 542 in a first state to be Vdd1-(Vss2). In a second state, the voltage drop from node 540 to node 542 is (Vss1)-Vdd2. In the first state, the diodes 544 and 546 (and all the other diodes on the line) will be forward biased if Vdd1-Vss2 is greater than two diode drops. Therefore the voltages of Vdd1 and Vss2 are selected so as to be about two diode drops apart in order to slightly forward bias the diodes. Vss1-Vdd2 represents the peak voltage in state two which must be less than the reverse bias breakdown voltage. (Vdd1-Vss2)-(Vss1-Vdd2) represents the peak to peak differential drive voltage applied to the NIT. Compression occurs in the transition from state one to state two because the diodes swing from slightly forward biased to reversed biased. In doing so, their depletion capacitances change which causes the synthetic transmission line to be nonlinear.

In FIG. 34, the output section is comprised of the inductors $L_n$ and $L'_n$ and the diodes collectively labelled $C_n$. These values are chosen such that the output impedance of the last section of the NIT is approximately equal to the input impedance of the sampler shown generally at 548. This input impedance is typically about 40 ohms.

The output section is coupled to the sampler by two series capacitors 550 and 552 which are chosen to have values large to not cause any significant loss of high frequency components entering the sampler. The shunt resistors 554 and 556 may be chosen to provide a termination for the fundamental fourier component, and/or as bias current control to limit the amount of bias current which flows from the NIT through the DC short circuit represented by the reflection/differentiating inductor 558.

The inductor 558 is needed in the NIT circuit as opposed to the short circuit differentiation/reflection termination in the sampler embodiments described earlier herein because of several reasons. First, the sampler 548 is intended to sample input RF signals having much lower frequencies than in the wideband samplers described above. Typically these RF signals are not higher in frequency than 40 GHz. Therefore, a much longer sample pulse or aperture is needed so that higher sampling efficiency can be realized. The idea is to integrate energy from the signal to be sampled for as long as possible using a window or sample pulse which is long enough to allow significant integration at the highest frequency of interest, i.e., around 40 GHz, while not being so long as to allow the voltage of the signal being sample to change appreciably during any particular sample period.

Figure 35:
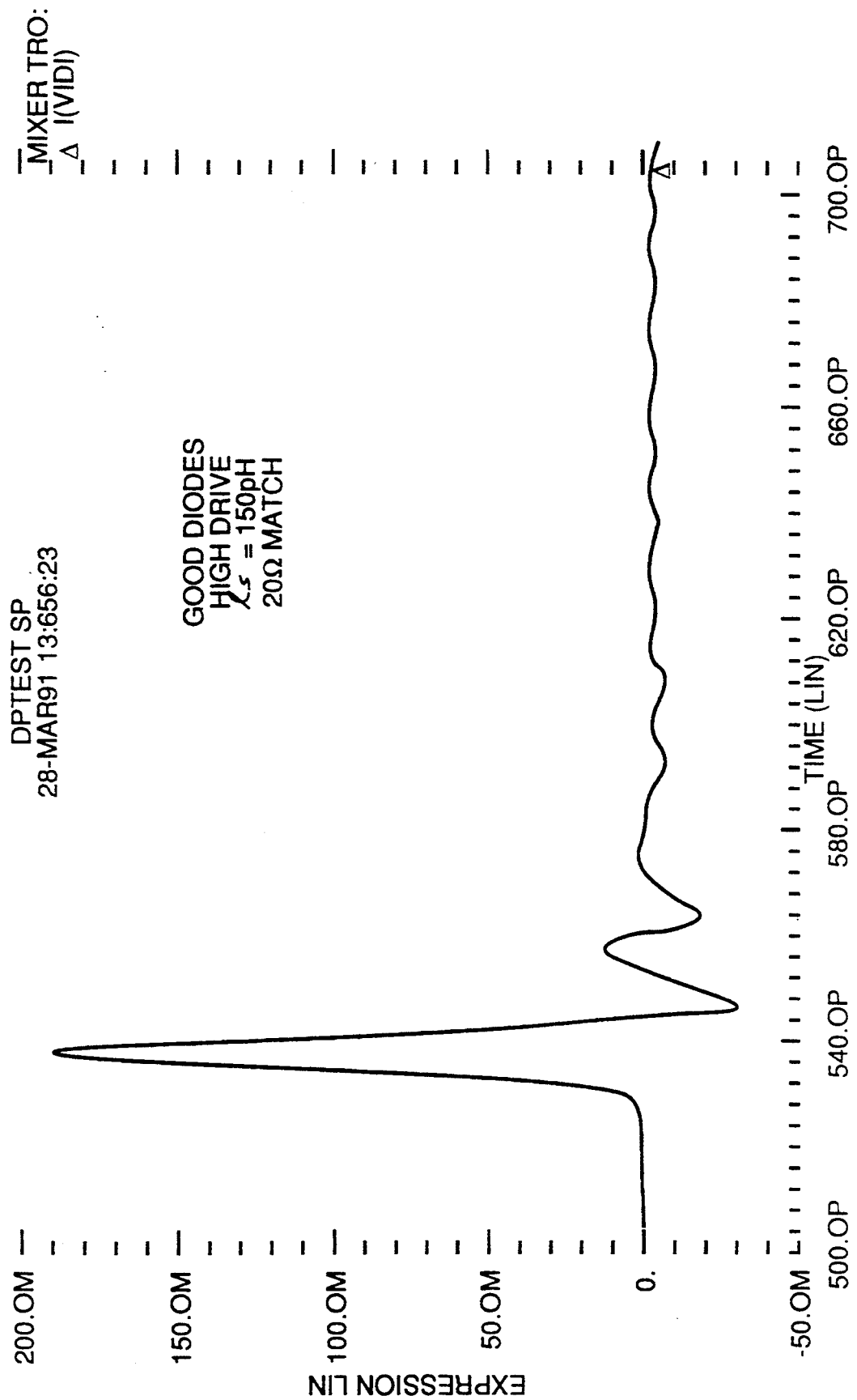
FIG. 35 is a diagram of the pulse which is created when the compressed edge emerging from the nonlinear impedance transformer of FIG. 34 is applied to the inductor 558 in FIG. 34.

To prevent the need for a long slot line to get this wider aperture, an inductor 558 is chosen over a short circuit termination to generate the sample pulse. The way this is done is to apply the compressed edge of the square wave output signal to the inductor 558. This causes the voltage on the inductor to rise quickly to a level sufficient to forward bias the sample diodes 560 and 562. As current increase in the inductor, it begins to load the NIT output. Once this current becomes large enough, the energy from the NIT is completely shunted through the inductor 558 thereby turning off the sampling diodes. The aperture or gate time is determined by the L/R time constant of the inductor L and the effective R of the sampling diodes in the on state. These diodes then gate current from the RF signal to be sampled applied to RF input node 564 into the sampling capacitors 566 and 568 where it is integrated. FIG. 35 is a SPICE simulation of the actual sampling current that is developed through the sampling diodes in response to the application of a compressed edge to the inductor 558.

The intermediate frequency output signal is developed at port 570 through the resistors 574 and 572. These resistors block any local oscillator components or RF components from exiting the intermediate frequency output. Further, these resistors allow the bias on the sampling diodes to be altered externally via bias nodes 576 and 578 to allow the aperture to be changed.

The structure of FIG. 34 is preferred because more drive power gets injected into the nonlinear impedance transformer, more inductance per inductor can be obtained by winding the inductors together and because better decoupling between the local oscillator signals from the NIT and the RF signals exists. The better decoupling exists because the local oscillator signals are in common mode while the RF signals are differential mode. The greater inductance from winding the spiral inductors of each section together results from the inductors coupling to each other which means less chip real estate is used in making an inductor of a given inductance value.

FIG. 36 represents the coupling of a NIT to a mixer/sampler as shown in more detail in FIG. 34. The NIT in FIG. 36 represents any of the various NIT configurations disclosed herein or equivalent NIT's fabricated by processes not yet developed with FET drivers integrated on the same substrate as the NIT and mixer/sampler.

FIG. 37 represents the coupling of an integrated NIT/driver on the same substrate to a trigger circuit also integrated on the same substrate as the NIT and its driver. Typically, the trigger circuit would be FET based for high speed and high input impedance such as might be used in any precise time measurement system. The compressed edge emitted from the NIT output is used to clock the trigger circuit. Because the NIT edge falltime is so fast, the uncertainty in timing of the event to be timed caused by slew rate uncertainty in the clock signal will be eliminated and more precise measurements can be obtained.

FIG. 38 represents a class of machines comprised of a NIT and driver integrated on the same substrate and coupled to a phase detector also integrated on the substrate. The phase detector in this application is typically a sampling phase detector. The operation of this combination is similar to the operation of the sampler/mixer combination of FIG. 36. The advantage of the combination of FIG. 38 is that it provides a lower noise phase detection apparatus by elimination of the amplification used in the prior art on the clock line and the RF input line. The NIT essentially creates high harmonic frequencies of the clock signal. These high harmonics give greater phase resolution in a sampling phase detector. In the prior art, the amplifier coupled to lines 580 is used to generate high frequency harmonics, but also injects noise. The NIT can generate these high frequency harmonics without injecting as much noise thereby creating a phase detector with greater signal to noise performance characteristics. FIG. 39 represents a two classes of machines. In the first class, the phase detector is a colliding pulse phase detector. The purpose of such a machine is to measure the single shot phase difference of two input pulses with great precision. In the machine of FIG. 39, one such pulse would be applied at input #1 and the other would be applied to input #2. The NITs in this machine then compress the fall time of each pulse and apply the compressed edges to the colliding pulse phase detector. This eliminates uncertainty caused by the slew rates of the colliding pulses as they existed at the inputs, and reduces the effects of amplitude noise in the phase detector.

The second class of machines represented by FIG. 39 is a sampling phase detector where the purpose is to detect the phase difference between an RF signal applied to input #2 and a local oscillator signal. In such a class of machines the NIT's replace amplifiers on lines 582 and 584 which were used in the prior art to generate high frequency components. The NIT's reduce the injected noise component while generating these high frequency components.

Another class of machines is represented by FIG. 40. In this group, a NIT is used to drive any of the nonlinear transmission lines of the type disclosed earlier herein. This combination eliminates the 50 picosecond slew rate input signal requirement for the nonlinear transmission line.

THE PROCESS FOR MAKING FET DRIVERS AND NONLINEAR IMPEDANCE TRANSFORMER

Normally, the process to make high quality MMIC FETs and varactors are incompatible. Therefore, a process to make both on the same substrate is desirable. The problem is that the deep N+ implant needed for the varactors is not available, i.e., natural, to commercial FET processes normally. Varactors without a deep N+ implant can be made, but they do not work very well. By selecting an FET channel length of 0.4 microns or less and not using a deep N+ implant, decent varactors can be made. However, great improvements can be made in the varactor cutoff frequency by using both 0.4 micron FET channel lengths and a deep N+ implant. The process described in the papers cited below is a process which can be used to manufacture high gallium arsenide FETs. It has been modified by the addition of a deep N+ implant in only the areas where diode connected FET's are to be formed to fabricate the NIT.

The preferred process for making the FET drivers and the nonlinear impedance transformer on the same gallium arsenide substrate is given in four published papers. They are: (1) Bahl et al., "GaAS IC'S FABRICATED WITH THE HIGH-PERFORMANCE, HIGH-YIELD MULTIFUNCTION SELF-ALIGNED GATE PROCESS FOR RADAR AND EW APPLICATIONS" IEEE Transactions on Microwave Theory and Techniques, Vol. 38, No. 9, September 1990, pp. 1232–1241; (2) Bahl et al., "MULTIFUNCTION SAG PROCESS FOR HIGH-YIELD, LOW-COST GaAS MICROWAVE INTEGRATED CIRCUITS", IEEE Transactions on Microwave Theory and Techniques, Vol. 38, No. 9, September 1990, pp. 1175–1182; (3) Geissberger et al., "A NEW REFRACTORY SELF-ALIGNED GATE TECHNOLOGY FOR GaAS MICROWAVE POWER FET'S AND MMIC'S", IEEE Transactions on Electron Devices, Vol. 35, No. 5, May 1988, pp. 615–622; (4) Sadler et al., "A BURIED P-LAYER SELF-ALIGNED PROCESS FOR HIGH-YIELD LSI CIRCUITS", which was published at an unknown scientific conference in the U.S. in 1989, probably the 1989 GaAs Symposium. All four of these papers describe the same basic process with some improvements over time. Using the process described in these papers, diode connected field effect transistors (hereafter FET's) can be fabricated on the same gallium arsenide substrate as the FET drivers needed to drive the nonlinear impedance transformer. A diode connected FET is an FET with the source and drain connected.

The process described in these papers allows FET's to be fabricated on gallium arsenide substrates with deep P implants to reduce threshold voltage variations. This is a classic problem for integrated FET circuits in gallium arsenide. The deep implant reduces the threshold variations by creating a reverse biased diode between the substrate and the channel. This isolates the substrate charge from the channel to prevent channel depletion from the wrong side. The deep P implant is not necessary for use of diode connected FET's to practice the invention, but it is preferred because threshold variations make integration more difficult. More uniformity means the nonlinear impedance transformer (hereafter NIT) can be successfully integrated on the same substrate with more circuitry of a different and perhaps more complex nature.

The diode connected FET's used for the NIT nonlinear capacitors are shown in cross-section in FIG. 31. Basically, an air bridge is used to connect the source and drain contacts of the FET. In addition to the deep implant taught in paper (4) above, an additional implant is used. This implant is a high-energy, deep N type implant. Approximately 400 KEV is preferred. The purpose of this implant is to reduce series resistance of the diodes. The diode connected FET's achieved with this implant have a cutoff frequency of 500 GHz.

Referring to FIG. 31, the gallium arsenide substrate 400 first has implanted therein a P-type implant 410 to stabilize the threshold voltage variations. Then an N− implant 420 is made under the region where the FET is to be formed. The doping level of this N− implant defines the types of FET's, i.e., depletion mode or enhancement mode that are to be formed. The energy is low for surface concentration. After the N− implant, the gate 420 is formed of refractory metal such as titanium/tungsten nitride or other standard FET gate materials which will not melt during the subsequent bake of the ohmic contacts. After the gate is formed, the gate is used as a mask to form a self-aligned N+ implant region 430. The perimeter of the N+ implant defines the "active area" of the diode. Regions outside the N+ implant which are not diode active area are essentially nonconducting (seminsulating) to provide isolation between FET's. The doping of the N+ implant is as heavy as possible to reduce series resistance.

After the N+ implant, ohmic contacts 440 and 460 for the source and drain contacts are formed by standard FET processing as described in papers (1)-(4). It is preferred that the spacing between the ohmic contacts and the gate be as close as the design rules permit consistent with breakdown voltage criteria to minimize series resistance of the diodes.

After the ohmic contacts are formed, the first layer of metal is deposited and patterned to form the source and drain contacts 470 and 480. These contacts are then connected together by an air bridge 490. The air bridge is formed by depositing a sacrificial layer such as photoresist or polyimide over the gate and contacts 470 and 480. Contact holes through the sacrificial layer (not shown) are then formed over the contacts 470 and 480. Then second metal is deposited, and the sacrificial layer is dissolved to leave the airbridge 490. Further details about the process and process sequence are given in papers (1)-(4).

The process described in papers (1)-(4) forms implant doped diodes. Since the diode doping is limited by implant technology, the resulting diodes, when optimized for NIT applications look more like an abrupt doped Schottky barrier diode rather than a hyperabrupt doped Schottky barrier diode.

Connection of the diodes to the transmission line conductors is as follows. The gate 420 is the anode (for falling edge compression) and is connected to a terminal of the section inductor. For coplanar waveguide applications, this will be the center conductor. For coplanar strip embodiments, the gate is connected to the positive conductor. For spiral inductor embodiments where there is no transmission line but alternating connected islands of spiral integrated inductors and FET diodes, the gate is connected to one terminal of the spiral inductor.

The cathodes of the FET diodes are connected in coplanar waveguide embodiments to both ground planes or the power supply return in single ended implementations. A single ended implementation is as shown in FIG. 30. A differential embodiment is as shown in FIG. 34. In coplanar strip embodiments, the FET diode cathodes are coupled to the negative conductor. In spiral inductor single ended embodiments, the cathodes are coupled to a ground line. In the differential embodiment shown in FIG. 34, the cathodes are coupled as shown schematically there.

Figure 33:
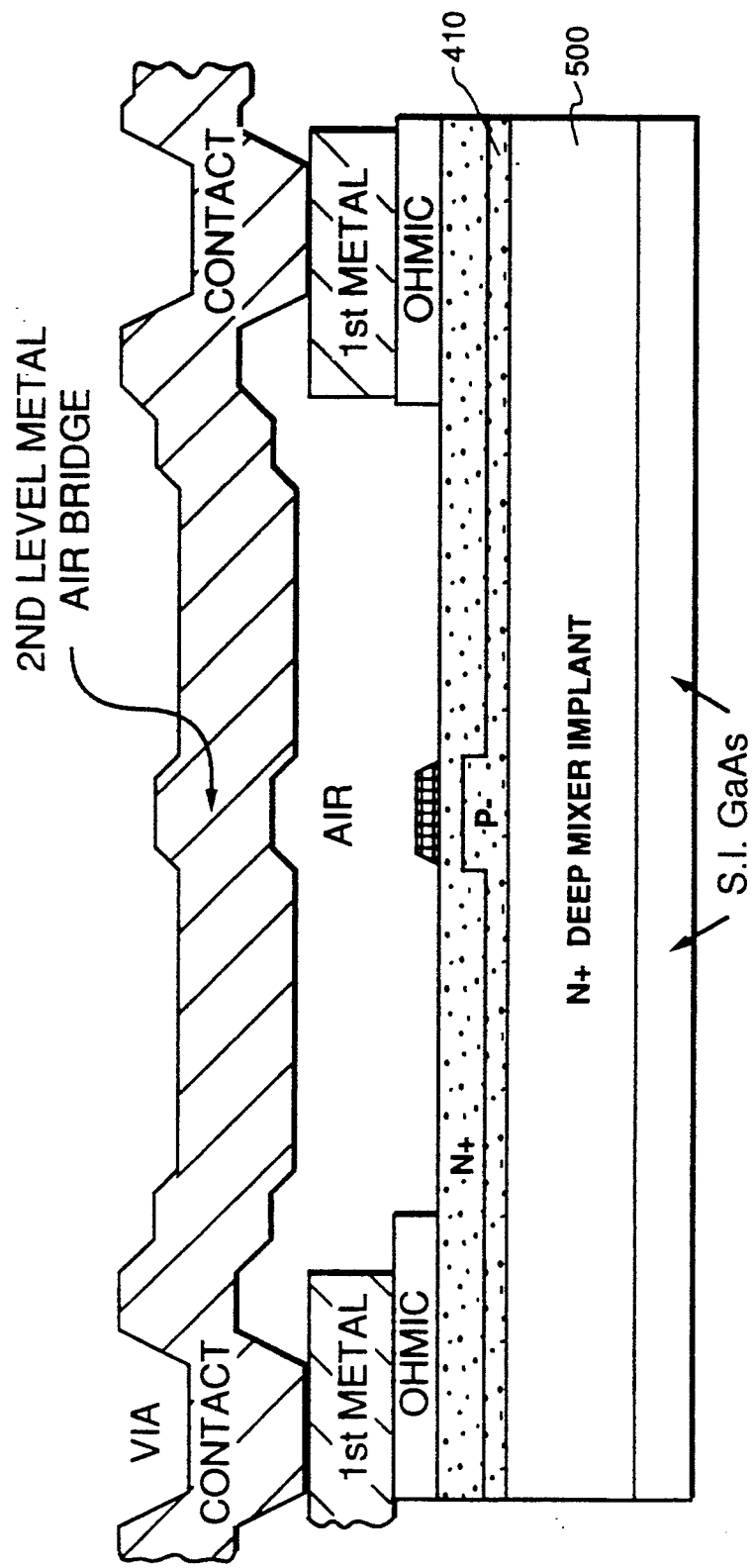
FIG. 33 is a cross-sectional view of the preferred structure of a diode connected FET with a deep N implant.

Referring to FIG. 33, there is shown the preferred FET diode structure using a deep N type mixer implant. The purpose of this implant is to reduce series resistance by forming a vertical Schottky diode under the gate between the gate metal and the N+ mixer implant 500. This reduces the series resistance by substantially shortening the current path through the N− region. The P− implant 410 effects only the vertical diode doping profile by making the junction more abrupt which improves the nonlinearity.

The process taught in papers (1)-(4) above is the preferred process, but it is not the only process which can be used to fabricate the NIT. It should be mentioned here that hyperabrupt doped Schottky varactor diodes would be preferred because of their high degree of junction capacitance nonlinearity with applied voltage if FET's driver circuitry for the NIT could be fabricated on the same substrate. If a process is developed in the future wherein hyperabrupt doped Schottky varactors can be fabricated on the same substrate with FET drivers, that process would be preferred. Because such a process is not currently available as far as is known by the inventors, the preferred process is that described in papers (1)-(4) above with the addition of the extra implant as described above.

The monolithic integration of the driver FET's and the NIT on the same substrate leads to low cost, good control of parasitics by tight control over the geometry of the fabricated elements and it renders the NIT easy to use.

For some applications, the use of diode coupled FETs is preferred, because such devices can be made with higher breakdown voltage than other varactors.

By scaling the physical delay per section logarithmically, the fewest number of sections can be used to realize a given total compression. The reason is that for log scaling, each section is compressing the maximum permissible amount without "missing the boat". This translates into shorter NIT structures, less chip real estate used, lower cost and higher yield.

At present, the best compression factors are found empirically, and is related to type of varactors being used. The compression factor for a particular diode depends upon the capacitance vs. voltage relationship for that diode and its RC cutoff value. The optimum diode with have as high and RC cutoff as possible and a maximum nonlinear, i.e., change in capacitance with applied reverse bias voltage. Generally, hyperabrupt diodes may not be the best solution because of their high RC time constants a given nonlinearity factor a in Equation (3) above.

The nonlinear transmission line described in the parent cases suffers from four basic problems. First, it is too big and lossy, and, second, it is difficult to use because input conditions for slew are too difficult to meet. Thirdly, the nonlinear transmission line of previous designs typically suffers from poor power transfer efficiency in transfer of energy from the source to the load. Finally, the previous nonlinear transmission lines were difficult to design into circuits since trial and error methods were necessary.

The nonlinear impedance transformer solves all of these problems. Specifically, the NIT solves the power transfer efficiency problem by scaling the impedances of each L-C section in a fashion such that the input impedance of the NIT matches the output impedance of the source and the output impedance matches the input impedance of the load. Further, the delay factors of the L-C sections may also be scaled so as to minimize the number of sections required to obtain a selected value of compression thereby minimizing size and loss. As a consequence of the improved efficiency and size, much slower input transition times may be used resulting in simple interfacing to integrated FET driver amplifiers which was previously not possible. As a final improvement, design equations have been produced for the NIT which allow easy design into many systems.

What is claimed is:

1. A nonlinear impedance transformer, comprising:
   an input port for coupling to a signal source having an output impedance, said input port for receiving from said signal source a step signal having a transition between first and second voltage states;
   an output port for coupling said impedance transformer to a load having an input impedance; and
   a plurality of L-C sections connected in series to form a nonlinear transmission line, including at least an input L-C section having a characteristic impedance substantially matching said output impedance of said signal source and an output L-C section having an output impedance which substantially matches the input impedance of said load but which is different from said characteristic impedance of said input L-C section, with the characteristic impedances of each said L-C section scaled between the characteristic impedance values of said input and output sections, each said L-C section including means for making the group velocity of a signal propagating down said transmission line voltage dependent.

2. The apparatus of claim 1 wherein each said L-C section has a delay factor and wherein the delay factors $\sqrt{LC_{ls}}$ of said L-C sections are scaled.

3. The apparatus of claim 1 further comprising a driver circuit comprised of one or more field effect transistors coupled to said input port.

4. The apparatus of claim 3 wherein said field effect transistors and said transmission line are both integrated in planar fashion on the same semiconductor substrate.

5. The apparatus of claim 1 wherein said plurality of L-C sections are formed on a semiconductor substrate and wherein said semiconductor substrate is gallium arsenide.

6. The apparatus of claim 1 wherein each L-C section is comprised of a series inductor and a shunt connected varactor diode.

7. The apparatus of claim 6 wherein said inductor and diode of each L-C section are integrated in planar fashion on the same substrate.

8. The apparatus of claim 1 wherein the scaling of the characteristic impedance of each said L-C section conforms approximately to the following relationship:

$$\sqrt{\frac{L_i}{C_{Di}}} = Z_{input} * \left[\sqrt[n]{\frac{Z_{output}}{Z_{input}}}\right]^{i-1}$$

where
$L_i$ = the inductance of the $i^{th}$ section, and,
$C_{Di}$ = the depletion zone voltage dependent capacitance of the voltage dependent capacitor in the $i^{th}$ section and,
$Z_{input}$ = the input impedance of the first L-C section and,
$Z_{output}$ = the output impedance of the last section, and wherein the synthetic transmission line is comprised of n sections and the $i^{th}$ power is a power equal to the number of the section having inductance $L_i$.

9. The apparatus as defined in claim 1 wherein each said L-C section has a delay factor $\sqrt{LC_{ls}}$ determined by the inductance and large signal capacitance, said delay factors being scaled for optimum compression for the number of said L-C sections.

10. The apparatus as defined in claim 9 wherein each said L-C section has a delay factor determined by the inductance and large signal capacitance, said delay factors being scaled logarithmically as follows $$\sqrt{L_i C_i} = \frac{\sqrt{L_{i-1} C_{i-1}}}{CF_i}$$

where $CF_i$ is determined empirically, and where
$L_i$ = the inductance of the $i^{th}$ section inductor, and
$C_i$ = the large signal capacitance of the $i^{th}$ section, and
$L_{i-1}$ = the inductance of the section previous to the $i^{th}$ section, and
$C_{i-1}$ = the large signal capacitance of the section previous to the $i^{th}$ section.

11. The apparatus as defined in claim 1 wherein each said L-C section has a delay factor determined by the inductance and large signal capacitance, said delay factors being scaled as follows $$\sqrt{L_i C_i} = \frac{\sqrt{L_{i-1} C_{i-1}}}{CF_i}$$

where $CF_i$ is determined empirically to achieve maximum compression per section, and where
$L_i$ = the inductance of the $i^{th}$ section inductor, and
$C_i$ = the large signal capacitance of the $i^{th}$ section, and
$L_{i-1}$ = the inductance of the section previous to the $i^{th}$ section, and
$C_{i-1}$ = the large signal capacitance of the section previous to the $i^{th}$ section.

12. A nonlinear impedance transformer, comprising:
   a substrate; and
   a nonlinear transmission line integrated on said substrate, comprising:
      a plurality of L-C sections, each section having an inductor and a device which exhibits a capacitance which varies with the voltage, said sections connected in series to form a synthetic transmission line;
      a plurality of electrically isolated regions in said substrate each of which contains at least one of said devices which exhibit capacitance which varies with voltage across said device, each said device coupled to at least one of said inductors so as to periodically lead said synthetic transmission line with capacitance with varies with applied voltage thereby rendering said synthetic transmission line nonlinear; and
      wherein the values of inductance and zero bias capacitance in each section are scaled to form an impedance transformer whereby the impedance of said first section matches the output impedance of a driver coupled to the input of said first section and which supplies at least one input signal transition edge, and the output impedance of the last section matches the input impedance of a lead which receives the output signal from said synthetic nonlinear transmission line and which is different than said output impedance of said driver.

13. A nonlinear impedance transformer, comprising:
   a substrate of material;

a nonlinear transmission line formed on said substrate having an input and an output and comprising a plurality of L-C sections connected in series to form a transmission line, each said L-C section having at least one inductor and one capacitor associated therewith, said nonlinear transmission line including at least two conductors integrated on said substrate, and further comprising a plurality of electrically isolated islands of semiconductor material formed on said substrate, each said island of semiconductor material having integrated therein, as the capacitor of an L-C section, a nonlinear capacitor having a capacitance which varies with applied voltage and which is coupled between said at least two conductors, the values of said inductance and capacitance in each said L-C section being selected so as to cause compression of the edge transition time of a signal propagating down said transmission line while establishing the input impedance of said nonlinear transmission line so as to match the output impedance of the driver which supplies the signal edge, said L and C values also being selected so that the output impedance of said nonlinear transmission line matches the input impedance of any load attached to said nonlinear transmission line which is different from said output impedance of said driver.

14. The apparatus of claim 13 wherein each said island of semiconductor material has a diode connected field effect transistor therein with a heavily doped N type layer underlying said field effect transistor.

15. The apparatus of claim 14 wherein each field effect transistor includes ohmic contacts from the source and drain terminals which are formed so as to make contact with said heavily doped underlying layer.

16. The apparatus of claim 15 wherein the source and drain contacts are electrically connected together, and wherein the spacing between the gate and each of the source and drain contacts is set as small as possible considering lithographic constraints and breakdown voltage issues so as to minimize the series resistance along the current paths from the gate to the source and drain contacts.

17. The apparatus of claim 13 wherein said nonlinear transmission line has an output which is coupled to the local oscillator input of a mixer/sampler circuit integrated on the same substrate.

18. The apparatus of claim 13 wherein said nonlinear transmission line has an input coupled to the output of an FET amplifier integrated on the same substrate, said FET amplifier supplying a digital square wave pulse to the input of said nonlinear transmission line for compression.

19. The apparatus of claim 13 wherein each said island has integrated therein an abrupt junction Schottky varactor diode.

20. The apparatus of claim 19 wherein the variation of capacitance with voltage is given by $$C_k(V) = \frac{C_k(0)}{\left(1 + \frac{V}{V_0}\right)^a}$$

where $C_k(V)$ is the capacitance at voltage V, $C_k(0)$ is the junction capacitance of the diode at zero bias, and $V_0$ is the diode turn on voltage; and where the factor "a"=0.5.

21. The apparatus of claim 13 wherein each said island has integrated therein a hyperabrupt doped Schottky varactor diode with a variation of capacitance with voltage given by $$C_k(V) = \frac{C_k(0)}{\left(1 + \frac{V}{V_0}\right)^a}$$

$C_k(V)$ is the capacitance at voltage V, $C_k(0)$ is the junction capacitance of the diode at zero bias, and $V_0$ is the diode turn on voltage; and where the factor "a" is greater than 0.5.

22. The apparatus of claim 13 wherein said inductors of at least some of said L-C sections are planar, spiral inductors.

23. The apparatus of claim 13 wherein said inductors of at least some of said L-C sections are sections of the conductors of waveguide integrated on said substrate.

24. The apparatus of claim 22 wherein said inductors of at least some of said L-C sections are the conductors of waveguide integrated on said substrate.

25. The apparatus of claim 22 wherein the inductors of said L-C sections of said nonlinear transmission line, where the fall time of a signal propagating therein is greater than approximately 30 picoseconds, are integrated, planar, spiral inductors, and wherein the inductors of said L-C sections of said nonlinear transmission line where the fall time of signals propagating therein is less than or equal to about 30 picoseconds are sections of said conductors integrated on said substrate.

26. The apparatus of claim 13 wherein said conductors of said nonlinear transmission line are bond wires connected to pads on said substrate.

27. The apparatus of claim 13 wherein said inductors of said L-C sections are comprised of a combination of integrated, planar, spiral inductors in L-C sections where the signals propagating along said nonlinear transmission line have relatively longer fall times and, in L-C sections wherein the signals propagating along said nonlinear transmission line have the shortest fall times, said inductors are comprised of the conductors of waveguide integrated on said substrate.

28. The apparatus of claim 13 further comprising a field effect transistor amplifier/driver integrated on the same substrate as said nonlinear impedance transformer.

29. The apparatus of claim 13 further comprising a sampler/mixer circuit integrated on the same substrate as said nonlinear impedance transformer and coupled to receive output signals with compressed fall times from said nonlinear impedance transformer to cause sampling diodes in said sampler mixer to conduct for a period closely related to the fall times of compressed edges emerging from said nonlinear impedance transformer.

30. The apparatus of claim 28 further comprising a sampler/mixer circuit integrated on the same substrate as said nonlinear impedance transformer and coupled to receive output signals with compressed fall times from said nonlinear impedance transformer to cause sampling diodes in said sampler mixer to conduct for a period closely related to the fall times of compressed edges emerging from said nonlinear impedance transformer.

31. The apparatus of claim 30 wherein the impedance of said L-C sections is scaled logarithmically according to the following relationship:

$$\sqrt{\frac{L_i}{C_{Di}}} = Z_{input} * \left[ \sqrt[n]{\frac{Z_{output}}{Z_{input}}} \right]^i$$

where $L_i$ = the inductance of the $i^{th}$ section, and, $C_{Di}$ = the depletion zone voltage dependent capacitance of the voltage dependent capacitor in the $i^{th}$ section and, $Z_{input}$ = the input impedance of the first L-C section and, $Z_{output}$ = the output impedance of the last section, and wherein the synthetic transmission line is comprised of n sections and the $i^{th}$ power is a power equal to the number of the section having inductance $L_i$.

32. The apparatus of claim 31 wherein each said L-C section has a delay factor determined by the inductance per section and large signal voltage dependent transition capacitance per section, said delay factors being scaled as follows:

$$\sqrt{L_i * C_i} = \frac{\sqrt{L_{i-1} * C_{i-1}}}{CF_i}$$

where $CF_i$ is determined empirically to achieve maximum compression per section, and where $L_1$ = the inductance of the $i^{th}$ section inductor, and $C_i$ = the large signal capacitance of the $i^{th}$ section, and $L_{i-1}$ = the inductance of the section previous to the $i^{th}$ section, and $C_{i-1}$ = the large signal capacitance of the section previous to the $i^{th}$ section.

* * * * *